US010388370B2

(12) United States Patent
Schmidt et al.

(10) Patent No.: US 10,388,370 B2
(45) Date of Patent: Aug. 20, 2019

(54) METHOD AND MEANS FOR OPERATING A COMPLEMENTARY ANALOGUE RECONFIGURABLE MEMRISTIVE RESISTIVE SWITCH AND USE THEREOF AS AN ARTIFICIAL SYNAPSE

(71) Applicant: Helmholtz-Zentrum Dresden—Rossendorf e.V., Dresden (DE)

(72) Inventors: Heidemarie Schmidt, Dresden (DE); Kefeng Li, Chemnitz (DE); Ilona Skorupa, Dresden (DE); Nan Du, Chemnitz (DE)

(73) Assignee: Helmholtz-Zentrum Dresden—Rossendorf e.V., Dresden (DE)

( * ) Notice: Subject to any disclaimer, the term of this patent is extended or adjusted under 35 U.S.C. 154(b) by 0 days.

(21) Appl. No.: 16/092,001

(22) PCT Filed: Apr. 3, 2017

(86) PCT No.: PCT/EP2017/057886
§ 371 (c)(1),
(2) Date: Oct. 8, 2018

(87) PCT Pub. No.: WO2017/174527
PCT Pub. Date: Oct. 12, 2017

(65) Prior Publication Data

US 2019/0122730 A1 Apr. 25, 2019

(30) Foreign Application Priority Data

Apr. 7, 2016 (DE) .......................... 10 2016 205860
May 25, 2016 (DE) .......................... 10 2016 209144

(51) Int. Cl.
*G11C 13/00* (2006.01)
*G06N 3/04* (2006.01)
(Continued)

(52) U.S. Cl.
CPC ....... *G11C 13/0007* (2013.01); *G06N 3/0436* (2013.01); *G06N 3/0635* (2013.01);
(Continued)

(58) Field of Classification Search
CPC ........... G11C 13/0007; G11C 13/0069; G11C 13/004; G11C 11/54; G11C 2013/0092;
(Continued)

(56) References Cited

U.S. PATENT DOCUMENTS 8,199,556 B2 * 6/2012 Srinivasan ......... G11C 13/0007 365/148
2013/0301337 A1 * 11/2013 Kamalanathan ... G11C 13/0002 365/148
2014/0164869 A1 * 6/2014 Ordentlich .............. G11C 7/04 714/763

OTHER PUBLICATIONS

Der: "Beyond 'More than Moore': Novel applications of BiFeO 3 (BFO)-based nonvolatile resistive switches / Neuartige Anwendungen des BiFeO 3 (BF)-basierten nichtflüchtigen Widerstandsschaaltern", Aug. 25, 2015 (Aug. 25, 2015), XP055382807, Retrieved from the Internet: URL:http://www.qucosa.de/fileadmin/data/qucosa/documents/20250/Dissertation_Nan_Du.pdf [retrieved on Jun. 19, 2017] pp. 113-135; figures 7.7, 7.8.

(Continued)

*Primary Examiner* — Mohammed A Bashar
(74) *Attorney, Agent, or Firm* — Michael Soderman

(57) ABSTRACT

An electronic memristive device that has a complementary analog reconfigurable memristive bidirectional resistive switch. The device has a memristive layer sequence having a BFTO/BFO/BFTO three-ply layer and two electrodes. Titanium traps are arranged in the BFTO interfaces. As a
(Continued)

result of mobile acid vacancies, the potential barriers at the interfaces of the electrodes with respect to the memristive layer sequence are in flexible form. By applying voltage pulses, the acid vacancies can be shifted from the interface with respect to the first electrode to the interface with respect to the second electrode, with raising of the potential barrier at one electrode bringing about complementary lowering of the potential barrier of the other electrode. The method for operating the device proposes adapted writing processes that use the overlaying of writing pulse sequences to achieve stipulation of a state pair of complementary resistor states. In conjunction with reading pulses of adapted polarity, the device can implement fuzzy logic and be operated as an artificial synapse with the realization of all four learning curves for complementary learning. A plurality of options for the use of the device are proposed.

12 Claims, 10 Drawing Sheets

(51) Int. Cl.

| | |
|---|---|
| ***G06N 3/063*** | (2006.01) |
| ***H03K 19/20*** | (2006.01) |
| ***G11C 11/54*** | (2006.01) |
| ***H01L 45/00*** | (2006.01) |

(52) U.S. Cl.

CPC ........... *G11C 11/54* (2013.01); *G11C 13/004* (2013.01); *G11C 13/0069* (2013.01); *H01L 45/08* (2013.01); *H01L 45/1233* (2013.01); *H01L 45/1253* (2013.01); *H01L 45/147* (2013.01); *H03K 19/20* (2013.01); *G11C 2013/0052* (2013.01); *G11C 2013/0073* (2013.01); *G11C 2013/0083* (2013.01); *G11C 2013/0092* (2013.01); *G11C 2213/15* (2013.01); *G11C 2213/31* (2013.01)

(58) Field of Classification Search

CPC ........ G11C 2013/0052; G11C 2213/15; G11C 2213/31; G11C 2013/0083; H01L 45/147; H01L 45/1253; H01L 45/1233; H01L 45/08

See application file for complete search history.

(56) References Cited

OTHER PUBLICATIONS

Tiangui You et al: "Exploiting Memristive BiFeO 3 Bilayer Structures for Compact Sequential Logics", Advanced Functional Materials, vol. 24, No. 22, Feb. 24, 2014 (Feb. 24, 2014), pp. 3357-3365, XP055184900, ISSN: 1616-301X, DOI: 10.1002/adfm.201303365, pp. 3362-3336; figures 1, 2c, 4.

Nan Du et al: "Single pairing spike-timing dependent plasticity in BiFe03 memristors with a time window of 25 ma to 125 ms", Frontiers in Neuroscience, vol. 9, Jun. 30, 2015 (Jun. 30, 2015), XP055382216, DOI: 103389/fnins.2015.00227, pp. 3-9; figures 1,3,4.

Carlos Zamarreno-Ramos et al: "On Spike-Timing-Dependent-Plasticity, Memristive Devices, and Building a Self-Learning Visual Cortex", Frontiers in Neurscience, vol. 5, Jan. 1, 2011 (Jan. 1, 2011), XP055012442, ISSN: 1662-4548, DOI: 10.3389/fnins.2011.00026, figurs 1,2,3.

C. C. Rumsey: "Equalization of Synaptic Efficacy by Activity- and Timing-Dependent Synaptic Plasticity", Journal of Neurophysiology, vol. 91, No. 5, May 1, 2004 (May 1, 2004), pp. 2273-2280, XP055383417, US ISSN: 0022-3077, DOI: 10.1152/jn.00900.2003, figure 1.

Schmidt, Heidemarie [et al.]; Big Data ohne Energiekollaps. Physik in unserer Zeit, 2015, 46. Jg. Nr. 2, S. 84-89.

* cited by examiner

METHOD AND MEANS FOR OPERATING A COMPLEMENTARY ANALOGUE RECONFIGURABLE MEMRISTIVE RESISTIVE SWITCH AND USE THEREOF AS AN ARTIFICIAL SYNAPSE

CROSS REFERENCE TO RELATED APPLICATIONS

This application is the U.S. national stage of International Application No. PCT/EP2017/057886, filed on 2017 Apr. 3. The international application claims the priority of DE 102016205860.6 filed on 2016 Apr. 7 and the priority of DE 102016209144.1 filed on 2016 May 25; all applications are incorporated by reference herein in their entirety.

BACKGROUND

The present invention relates to a method for operating an electronic memristive device. Furthermore, the operation of said memristive device for implementing fuzzy logic in the form of an artificial synapse, and the use for implementing all four learning curves of an artificial synapse and of the complementary learning are disclosed.

Memristors or memristive devices are passive electrical devices, the name of which is composed of "memory" and "resistor". Said devices are characterised in that the resistance state thereof is dependent on the previously applied voltage.

Since the first controlled production thereof in 2007, memristors have been central to device development. Once the first embodiments had been specified digitally, i.e. at binary digital resistance states, memristors were quickly developed that could be specified at a plurality of analoguely defined resistance states, by means of a suitable write voltage.

Apart from special types, such as chemical memristors, memristors used today are formed in the manner of conventional electronic devices. The memristive device may for example comprise a spin-based or magnetic memristor. Said device may also be based on a molecular ionic thin film.

The memristive device comprises two electrically conductive electrodes and a memristive layer sequence (also referred to in the following as a layer sequence). In the following, the term "conductive" will always be used to mean electrically conductive. The memristive layer sequence usually comprises at least one thin film layer (also referred to in the following as a layer), but is usually a succession of mutually cumulative thin film layers that are interconnected in a planar manner. The first and the second electrode contact the memristive layer sequence in an electrically conductive manner and are separated from one another by the memristive layer sequence.

The constituent parts of the memristive device, i.e. the two electrically conductive electrodes and the memristive layer sequence separating said electrodes, are applied by means of known methods of thin-film technology, e.g. by means of PVD processes.

The individual layers of the memristive layer sequence may differ from one another on account of different doping and/or spatial doping distributions. The doping may be base doping or additional doping, for example with metal atoms.

In an embodiment that is frequently used, the thin film layers of the memristive layer sequence are arranged above one another in a horizontal manner. However, any other spatial orientations are also possible, i.e. the layers of the memristive layer sequence may also be arranged for example vertically, side-by-side.

Various material groups are used for producing the memristive layer sequence.

For example, a polycrystalline crystal structure has been found to be a suitable thin film layer structure for memristors having a plurality of resistance states. The polycrystalline memristive layer sequence comprises piezoelectric or ferroelectric layers. According to various embodiments, the ferroelectric layers may comprise a stable base doping that renders the ferroelectric layers semiconductively in nature. The ferroelectric crystal structures may be oxidic. Even without doping agents being introduced, oxidic thin film layers are often intrinsically n-conductive or intrinsically p-conductive.

In a simplest embodiment, a memristive device of this kind comprises a memristive double layer, which has been found to be a particularly suitable thin film layer structure. Said double layer consists of perovskite-like $BiFeO_3$ layers (BFO for short) which are doped with fixed titanium ion donors (BFTO for short) close to one of the electrodes. In this case, the BFO and BFTO layers are thin film layers of the memristive layer sequence. The memristive double layer comprises: first electrode/BFTO/BFO/second electrode.

The electrodes are usually arranged on the outer, mutually opposing faces of the memristive layer sequence and are therefore not directly interconnected in an electrically conductive manner.

In the following, only processes (e.g. the application of voltages) at the first electrode will be considered. Similar processes take place at the second electrode.

Both electrodes are applied to the memristive layer sequence over a large surface area. In a particular embodiment, both electrodes are applied in a selective manner.

The two electrically conductive electrodes are also referred to as the first electrode, terminal 1 (T1), and the second electrode, terminal 2 (T2). In the embodiment used most, the electrodes and the thin film layers of the layer sequence therebetween are formed as horizontal layers, preferably on a substrate. The electrodes are also referred to as a front face electrode (top) or rear face electrode (bottom) electrode or terminal, depending on the position thereof in the horizontal layer sequence, terminal 2 (T2) usually being assigned to the bottom electrode and terminal 1 (T1) usually being assigned to the top electrode.

Layer sequences have proven particularly advantageous in which, when a voltage pulse is applied between T1 and T2 and an electrical field is formed, easily displaceable ions in the layer sequence can be shifted from a region close to the first electrode and into a region close to the second electrode, or vice versa. Since said displacements of ions depend in principle on the direction of the electrical field, the memristive device comprising two electrodes can be operated bidirectionally. Owing to the bidirectional operation, resistance states are written and read, and thus signals are exchanged, in both directions between the electrodes.

Easily displaceable ions move in a directed manner, under the influence of an electrical field, in the crystal lattice. In order for the ion concentrations at the relevant electrode to be maintained in a non-volatile manner, substitutional, invariable and non-displaceable impurity atoms can be implanted into the crystal lattice of the memristive layer sequence. The non-displaceable impurity atoms secure the displaceable ions present up to a critical voltage (write voltage), i.e. up to a critical electrical field strength.

Said non-displaceable impurity atoms are also referred to as "traps" and are caused by the doping of the outer thin film layers of the memristive layer sequence. Traps are place-bound (fixed) energy levels in the region of band gaps of semiconductors, which energy levels can be occupied by electrons.

These are referred to in the following as "fixed traps". In this case, the traps are distributed in an inhomogeneous manner in the memristive layer sequence.

The fixed titanium traps are already inserted into the interfaces of the memristive layer sequence of the memristive device during production. The fixed titanium traps are thus arranged in the interfaces between the memristive layer sequence and the electrodes. In this case, the interface is in each case to be understood as the outer thin film layer of the memristive layer sequence, which layer borders the adjoining electrode in each case. The fixed titanium traps are inserted during production and accumulation of the BFO layer. Electrically conductive contact can thus be formed at the electrode/BFO interface. In this case, a BFO matrix comprising embedded fixed titanium traps is preferably provided. The titanium doping of the BFO layer cannot be changed by means of an electrical voltage located in the region of the write voltage, and also cannot be changed within the layers.

The titanium traps are inserted for example by means of ion implantation, close to the two electrodes of the outer memristive thin film layers. Further preferred methods for inserting fixed titanium traps are for example laser treatment or thermal diffusion during the accumulation of the BFO layer(s).

The freely movable and displaceable ions are often oxygen vacancies ($Vo^{+}$, $Vo^{++}$) which act as hole doping. Said ions act as intrinsically mobile donors and are therefore referred to in the following as mobile oxygen vacancies.

As described in Schmidt et al., the mobile oxygen vacancies are homogenously distributed in the memristive layer sequence.

The position of the mobile oxygen vacancies in the memristive layer sequence can be changed by means of an electrical voltage. During application of a minimum writing voltage for a minimum writing period, the ion cloud of the oxygen ions is shifted from one electrode to the other. This results in the formation of courses of thin film layers having a reduced concentration of oxygen vacancies (depletion layer), or in an increased concentration of oxygen vacancies (concentration layer), on the relevant electrodes.

In the memristive layer sequence based on BFTO/BFO, the mobile oxygen vacancies are shifted into the titanium-doped BFTO layer close to the first electrode, or are shifted out of said layer.

The titanium traps catch the mobile oxygen vacancies in potential wells, which wells can be overcome by a corresponding electrical potential, the minimum writing voltage. The mobile oxygen vacancies are thus captured or released by the titanium traps. Exceeding a minimum writing voltage on one electrode frees the mobile oxygen vacancies from the potential wells of the fixed titanium traps on said one electrode, and allows said vacancies to move in the memristive layer sequence in a directed manner, inter alia towards the other electrode, in order to be recaptured there by fixed traps.

The minimum writing voltage is the voltage that has to be reached or exceeded, in terms of absolute value, in order to achieve a change of state in the memristive layer sequence. If the absolute value of the minimum writing voltage is exceeded, states are written persistently. In a particular embodiment, each minimum writing voltage corresponds to a minimum pulse width $t_p$ of a writing pulse used for changing the state. The minimum writing voltage is a threshold value for capturing or releasing the mobile oxygen vacancies in or from the fixed titanium traps.

The minimum writing voltage has to be applied for a minimum time period required by the ions for picking up the drift velocity and travelling the distance between the two electrodes. The minimum writing voltage and the minimum writing period, i.e. the exposure time of the minimum writing voltage are therefore mutually related. The higher the write voltage, the shorter the exposure time thereof can be. The corresponding relationship depends on the material and the doping of the memristive layer sequence, and on the electrode spacing.

Application of a pulse to an electrode is to be understood to mean that the voltage at said electrode is changed from zero. If a voltage pulse is applied to an electrode, said pulse always deviates positively or negatively from zero potential. In a preferred embodiment, a voltage pulse is applied at T1, T2 remaining at zero potential. In a further preferred embodiment, a voltage pulse is applied at T2, T1 remaining at zero potential. According to a third preferred embodiment, the voltage at the first and at the second electrode is changed in opposing directions, meaning that the sum of the absolute values of the voltage gives the absolute value of the resulting voltage. In the fourth preferred case, in which a voltage pulse of the same polarity is applied to the first and the second electrode, the absolute value of the resulting voltage is the absolute value of the difference between the two absolute values of the voltage change.

After the mobile oxygen vacancies have been shifted, i.e. in the non-energised state or below the minimum writing voltage, the ion distributions of the mobile oxygen vacancies are stable. The potential barriers allow for two state on each of the two electrodes at the interface between the memristive layer sequence and the relevant electrode:

ohmic contact (high conductivity) or rectifying Schottky contact (low conductivity). Flexible formation of ohmic contact and Schottky contact on one electrode of the memristive device in each case is described in Schmidt et al., "Big Data ohne Energiekollaps. Physik in unserer Zeit" ["*Big data without energy collapse. Physics in our time*"], vol. 46, no. 2, 2015, pages 84-89. In this case, the polarity of the voltage applied to the electrodes determines which of the two electrodes is rectifying. This occurs depending on the distribution of the mobile oxygen vacancies, which vacancies drift to one electrode when a voltage is applied, and the fixed titanium traps, which permanently capture mobile oxygen vacancies that drift past in the vicinity thereof.

The mobile oxygen vacancies which have been captured or released by the titanium traps flexibly form potential barriers at the interfaces between the outer thin film layer of the memristive layer sequence in each case, and the relevant electrode adjoining said layer. Applying corresponding electrical voltage pulses makes it possible for the mobile oxygen vacancies to be shifted out of the interface adjoining the first electrode and into the interface adjoining the second electrode.

If mobile oxygen vacancies accumulate at the interface between the memristive layer sequence and the first electrode owing to a first voltage having a first polarity, the potential barrier at the interface adjoining the first electrode is reduced and ohmic contact is established. The second electrode remains at zero potential. At the same time, this leads to depletion of mobile oxygen vacancies at the interface adjoining the second electrode, with the result that the potential barrier at the interface adjoining the second electrode is increased and Schottky contact is established at the second electrode.

If mobile oxygen vacancies accumulate at the interface between the memristive layer sequence and the second electrode owing to a first voltage having a first polarity, the potential barrier at the interface adjoining the second electrode is reduced and ohmic contact is established. The first electrode remains at zero potential. At the same time, this leads to a depletion of mobile oxygen vacancies at the interface adjoining the first electrode, with the result that the potential barrier at the interface adjoining the first electrode is increased and Schottky contact is established at the first electrode.

If mobile oxygen vacancies are depleted at the interface between the memristive layer sequence and the first electrode owing to a first voltage having a first polarity, the potential barrier at the interface adjoining the first electrode is increased and Schottky contact is established.

The second electrode remains at zero potential. At the same time, this leads to a concentration of mobile oxygen vacancies at the interface adjoining the second electrode, with the result that the potential barrier at the interface adjoining the second electrode is reduced and ohmic contact is established at the second electrode.

If mobile oxygen vacancies are depleted at the interface between the memristive layer sequence and the second electrode owing to a first voltage having a first polarity, the potential barrier at the interface adjoining the second electrode is increased and Schottky contact is established. The first electrode remains at zero potential. At the same time, this leads to a concentration of mobile oxygen vacancies at the interface adjoining the first electrode, with the result that the potential barrier at the interface adjoining the first electrode is reduced and ohmic contact is established at the first electrode.

The memristive device may have a surplus or a deficiency of oxygen vacancies at the first electrode/memristive layer sequence interface or at the second electrode/memristive layer sequence interface.

Regarding the potential barrier, the potential barrier is in each case raised just once, at one electrode, while the potential barrier at the other electrode is lowered. The potential barriers can thus be changed in a mutually independent manner. The two potential barriers thus behave in a complementary manner. If no voltage pulse is applied to the electrode T1 (T2 remains at zero potential) or to the electrode T2 (T1 remains at zero potential), or if a non-zero voltage pulse of the same polarity and the same absolute value is applied to both electrodes simultaneously, the potential barriers, and thus also the states, do not change. Raising or lowering the potential barriers simultaneously (which results in the same states being formed at both interfaces) at both electrodes is not possible, owing to the design, since, when a voltage pulse is applied either to T1 (T2 remains at zero potential) or to T2 (T1 remains at zero potential), depending on the polarity of the voltage pulses, the redistribution of the oxygen vacancies establishes either a surplus of oxygen vacancies or a deficiency of oxygen vacancies at T1 and simultaneously a deficiency of oxygen vacancies or a surplus of oxygen vacancies at T2, or a surplus of oxygen vacancies or a deficiency of oxygen vacancies at T2 and simultaneously a deficiency of oxygen vacancies or a surplus of oxygen vacancies at T1.

The potential barrier at one electrode is adjusted so as to be either high or low by means of a correspondingly selected initialisation pulse or writing pulse. Owing to the complementary behaviour, the potential barrier at the other electrode occupys exactly the opposite value, i.e. low or high. For the purpose of digital processing, it is possible to assign the HRS state (high resistance state —low potential barrier) the Boolean value 1, and the LRS state (low resistance state—high potential barrier) the Boolean value 0, or vice versa to assign the LRS state (high potential barrier) the Boolean value 0 and the HRS state (low potential barrier) the Boolean value 1. A resistive switch comprising two reconfigurable potential barriers that can be adjusted in a digitally complementary manner has already been described in You et al.

You et al., Exploiting Memristive $BiFeO_3$ Bilayer Structures for Compact Sequential Logics, Adv. Funct. Mater., 24, 2014, 3357-3365 discloses a resistive switch, the two input variables p and q being represented by an initialisation pulse and a writing process, and it being possible for four resistance states to be adjusted. In this case, the initialisation pulse and the writing process change the resistance state, and the resistance state is read by means of a reading pulse. In this case, the resistive switch nominally consists of a memristive BFTO/BFO double layer comprising two reconfigurable, digitally complementary potential barriers, and two electrodes T1 and T2. The pulse sequences for T1 and T2 consist of an initialisation pulse that is independent of the logical input variables, and an initialisation pulse that is dependent on the logical input variables p and q. This structure consisting of two logical input variables p and q and a reading current output signal, referred to in the following as the current output signal s, makes it possible for all two-valued 16 Boolean functions to be characterised in accordance with a valid truth table, and thus for binary (Boolean) logic to be implemented. In this case, high conductivity of the resistive switch corresponds to the discrete binary output variable 1 of the correspondingly programmed binary logics, and low conductivity of the resistive switch corresponds in this case to the discrete binary output variable 0 of the correspondingly programmed binary logics.

Resistance states correspond to the states that are written to, programmed into, specified in or changed in the memristive device by means of initialisation pulses and/or writing processes. In the following, the term "writing" is used for specifying the resistance states, i.e. resistance states are "written".

Boolean logic functions (Boolean functions, for short) comprising two logical input variables belong to two-valued Boolean logic and are used in Boolean algebra for example. Said functions are based on binary logical operations and have two clearly defined binary states which occupy either the value 0 or 1. There are 16 two-valued Boolean functions. You et al. discloses the implementation of all 16 two-valued Boolean functions, with reference to a nominal memristive BFTO/BFO double layer.

Fuzzy logic is a form of many-valued logic and a generalisation of (two-valued, binary) Boolean logic, in which the output variables occupy analogue values between 0 and 1. All 16 two-valued Boolean functions have hitherto been characterised by a complementary resistive switch (see You et al.). In contrast to Boolean logic, the output variables in fuzzy logic can occupy any values between 0 and 1. These continuous transitions make it possible to use fuzzy logic for example in artificial intelligence and in control logic for decision-making.

Biological neurons are electrically excitable devices of nerve cells in living organisms. A distinction is made between presynaptic and postsynaptic neurons. In this case, one presynaptic and one postsynaptic neuron, respectively, are interconnected via a synaptic gap. Neurons are used for processing, transmitting and storing information.

In the case of synapses, a distinction is made between chemical and electrical synapses, the chemical synapses being the most common type: In the case of electrical synapses (gap junctions), the presynaptic and postsynaptic neurons are close together at specific points, with the result that signal transmission across a plasma bridge can occur via special ion channels. Action potentials thus propagate relatively quickly and synchronously.

In the case of chemical synapses, there is no direct contact between the neurons. The excitation transmission takes place through a 20 to 30 nm wide synaptic gap which is bridged by means of emission and attachment of messenger substances and neurotransmitters. In this case, signal transmission always occurs in one direction (unidirectional conductivity) from the presynaptic to the postsynaptic neuron.

The plastic change in the conductivity of the chemical synapses is referred to as STDP (spike time depending plasticity). Non-volatile conductivity changes between presynaptic and postsynaptic neurons form in the brain in order, for example, to store information. The STDP also defines inter alia the signal transmission of chemical synapses, which transmission is dependent on a temporal offset $\Delta t$ (spike timing) between the pre- and postsynaptic signal.

The synaptic weight (synapse strength) refers to the strength for a synaptic connection and characterises the transmission behaviour of synapses. The synaptic weight is shown as a function of the temporal offset $\Delta t$ between the pre- and postsynaptic signal, in a Cartesian coordinate system.

The long-term boosting of the signal transmission is referred to as long-term potentiation (LTP), whereas the long-term weakening of the signal transmission is referred to as long-term depression (LTD).

The learning curve of a chemical synapse is described by the long-term potentiation, as a function of the temporal offset $\Delta t$ between the presynaptic and postsynaptic activity. Each chemical synapse has two learning curves: LTP and LTD, the LTP curve also being referred to as a forgetting curve.

Artificial neurons are electronic devices which physically replicate the functionality of biological neurons. Said neurons are for example implemented by memristors or memristive devices comprising two electrodes.

Similar to the biological synapses, each artificial synapse has LTP and LTD learning curves. Said curves are implemented by applying STDP pulses, consisting of temporally offset pre- and postsynaptic writing pulses, to the two electrodes of the memristive device. In order to approximate the mode of operation of biological synapses, the pulse sequence is applied repeatedly approximately 60 to 80 times (multiple pairing). Du et al. shows that it is sufficient to apply the pulse sequence once to the artificial neurons (single spike pairing) and to thus increase energy efficiency.

Du et al., Single pairing spike-timing dependent plasticity in $BiFeO_3$ memristors with a time window of 25 ms to 125 μs, Front. Neurosc., 9, 2015, 227 discloses a resistive switch comprising a flexible analogue non-complementary potential barrier that acts as an artificial synapse, the two electrodes each forming artificial neurons. A flexible analogue non-complementary potential barrier is formed at the Ti/Pt bottom electrode by means of titanium traps thermally diffusing into the lower part of the BFO layer during BFO accumulation on the Ti/Pt bottom electrode, and thus being incorporated in a substitutional and invariable manner. The synaptic weight of the resistive switch is determined depending on the temporal offset $\Delta t$ between the presynaptic pulse and the postsynaptic pulse. The resistive switch makes it possible for analogue switching to be achieved by means of a single writing pulse sequence. Furthermore, two learning curves, LTP and LTD, can be plotted. The pulse sequence applied at the electrodes or neurons consists of an initialisation pulse followed by two temporally mutually offset writing pulses of different polarities, and a following reading pulse. Said pulse sequence is applied just once to the electrodes or neurons, and not, as in previous publications, 60 to 80 times, resulting in a significant time advantage and also reducing energy consumption.

The use of memristors or memristive devices in the fields of semiconductor electronics is developing steadily. The particular arm in this case is to implement Boolean functions using just one resistive device. This could not only establish a connection to current digital technology, but also contribute to miniaturisation of the devices. Furthermore, there are indications of uses in analogue electronics, fuzzy logic, and the replication of biological stimulus transmission and stimulus processing.

A disadvantage is that, owing to the design thereof and/or the operating and actuation methods used to date, the memristive devices of the prior art (in You et al. and Du et al.) can implement fuzzy logic only for selected Boolean functions, but not for all 16 two-valued Boolean functions.

Furthermore, it is currently possible to read out only one resistance state in each case of a state pair containing mutually complementary resistance states. This excludes the possibility of implementing all four learning curves. To date, only two learning curves (LTP and LTD) have been implemented, which curves characterise STDP behaviour. The anti-LTP and anti-LTD learning curves, complementary thereto, for the anti-STDP behaviour cannot be depicted. It is thus also not possible to easily read out mutually complementary states.

A further disadvantage is that the use of the memristive device is restricted by the prior art. The memristive device cannot be used universally, which would be desirable when processing complementary information from image analysis or speech recognition for example. The known methods for operating memristive devices are not sufficient for use in neuronal networks or control systems either.

SUMMARY

The invention relates to an electronic memristive device that has a complementary analogue reconfigurable memristive bidirectional resistive switch. The device has a memristive layer sequence having a BFTO/BFO/BFTO three-ply layer and two electrodes. Titanium traps are arranged in the BFTO interfaces. As a result of mobile acid vacancies, the potential barriers at the interfaces of the electrodes with respect to the memristive layer sequence are in flexible form. By applying voltage pulses, the acid vacancies can be shifted from the interface with respect to the first electrode to the interface with respect to the second electrode, with raising of the potential barrier at one electrode bringing about complementary lowering of the potential barrier of the other electrode. The method according to the invention for operating the device proposes adapted writing processes that use the overlaying of writing pulse sequences to achieve stipulation of a state pair of complementary resistor states. In conjunction with reading pulses of adapted polarity, the device can implement fuzzy logic and be operated as an artificial synapse with the realisation of all four learning curves for complementary learning. A plurality of options for the use of the device operated according to the invention are proposed

DETAILED DESCRIPTION

The object of the present invention is therefore that of proposing an advantageous method for operating an electronic memristive device consisting of a complementary analogue reconfigurable memristive resistive switch having bidirectional conductivity, referred to in the following as a memristive device.

A further object of the present invention is that of proposing an electronic memristive device having two flexibly analoguely complementarily adjustable potential barriers, the height of which can be continuously adjusted, during operation, to intermediate values between two complementary end states, by means of applying electrical voltage pulses.

It should thus be possible, using a memristive device, to implement fuzzy logic for all 16 two-valued Boolean functions.

The method according to the invention should make it possible to programme into the memristive device and to read out from the memristive device mutually complementary resistance states of a state pair in each case.

Furthermore, it is also intended for it to be possible for the memristive device to be used as an artificial synapse having four learning curves, and to thus also allow for complementary learning.

According to the invention, the object is achieved using an electronic memristive device consisting of a complementary analogue reconfigurable memristive bidirectional resistive switch, referred to in the following as a memristive device, and by an operating method according to claim 1. Preferred approaches are disclosed in the dependent claims that refer back to claim 1. The electronic memristive device preferably comprises a flexibly analoguely complementarily adjustable memristive bidirectional resistive switch.

Furthermore, in order to implement each of the 16 many-valued (two-valued) Boolean functions, a pulse sequence is specified, which sequence is applied to the electrodes taking account of the corresponding truth tables that are valid and to be implemented. The 16 two-valued Boolean functions are implemented in configurable fuzzy logic having analogue transitions between digital states in that the current output signal s can occupy all non-discrete values between 0 and 1. Claims 12 to 15 disclose an improved use possibility for the memristive device as an artificial synapse. Preferred device embodiments are disclosed in claims 10, 11 and 16 to 18.

Furthermore, the memristive device is used as an artificial synapse for use in data analysis, for processing complementary information from image analysis or speech recognition, in neuronal networks, and in control systems (for example in smoke detectors).

Furthermore, the usability of the memristive device as an artificial synapse for implementing the learning rules Associative Learning (fuzzy logic AND), Supervised Learning (fuzzy logic p), Unsupervised Learning (fuzzy logic q) and Deep Learning (fuzzy logic OR).

The invention also relates to the design proposed here of the memristive device, in particular the inventive layer sequence as a memristive BFTO/BFO/BFTO three-ply layer, preferably associated with two flexibly analoguely complementarily adjustable potential barriers.

The memristive device comprises a memristive layer sequence. The memristive layer sequence is constructed of at least one thin film layer, preferably a plurality of thin film layers. The first and the second electrode contact the memristive layer sequence in an electrically conductive manner and are separated from one another by the memristive layer sequence.

The electrodes consist of electrically conductive metals or other electrically conductive materials. Preferably, both electrodes consist of the same material. The electrodes may also consist of different materials, resulting in different potential shapes at the electrode/memristive layer sequence interfaces. Graphene or indium tin oxide (ITO), for example, are possible as conductive materials. In an alternative embodiment, at least one electrode consists of metal or a metal alloy. The following are particularly suitable as metals: platinum, aluminium, titanium, copper, silver and/or gold, or other metals. Platinum has been found to be particularly expedient as the electrode material. In a preferred embodiment, the first electrode consists of platinum and the second electrode consists of gold, or vice versa. However, other suitable metals or other suitable materials that can create ohmic or Schottky contact at the interface between the BFTO and the electrode material, depending on the distribution of the oxygen vacancies in the memristive layer sequence, are also possible.

The layer thicknesses of the electrodes are between an atomic layer (graphene) and several millimeters (application of the metal onto the carrier substrate over a large surface area). The layer thicknesses of the electrodes are preferably between 20 and 1000 nm. The layer thickness of the electrodes is particularly preferably between 100 and 500 nm. The layer thickness of the electrodes is very particularly preferably between 100 and 300 nm. Very particularly preferably, the layer thicknesses of the first and second electrodes are the same. In a preferred embodiment, the layer thickness of the gold top electrode and the layer thickness of the platinum bottom electrode is approximately 200 nm.

The first electrode and the second electrode are preferably identical in terms of the material thereof and the layer thicknesses.

In a preferred embodiment, the two electrodes and the memristive layer sequence are arranged on a carrier substrate. In this case, the first or second electrode, which is referred to as the bottom electrode, is located between the carrier substrate and the memristive layer sequence. The second or first electrode, which is referred to as the top electrode, follows above the memristive layer sequence.

In a particularly preferred embodiment, the carrier substrate is a foreign substrate which is preferably electrically insulating.

Sapphire or $SiO_2$ is particularly preferably used as the foreign substrate material. Furthermore, silicon can also be used as the foreign substrate.

In an alternative embodiment, the carrier substrate has a $Si/SiO_2$ structure. In this case, the layer thickness of the $SiO_2$ layer is preferably approximately 500 nm. In a further alternative embodiment, the carrier substrate has a $Si/SiO_2/Ti/Pt$ structure.

In an alternative particularly preferred embodiment, the carrier substrate is electrically conductive. Platinum or another metal is particularly preferably used as the foreign substrate material, which material is very particularly preferably identical to the electrode material.

The carrier material thus functions as the bottom, or top, electrode, respectively.

In an embodiment, the memristive layer sequence is formed as a double layer. In this case, the memristive layer sequence comprises two layers. According to various embodiments, the first thin film layer may be thicker or thinner than the second thin film layer. In another embodiment, two ferroelectric layers may be two different regions of a single ferroelectric layer. In a particular embodiment, the memristive layer sequence is based on a ferroelectric material containing iron. In a particular embodiment, the memristive double layer consists of perovskite-like $BiFeO_3$ layers (BFO for short).

In the memristive BFTO/BFO/BFTO three-ply layer preferably used here, titanium ions are used as traps, known as fixed titanium traps. The concentration of the fixed titanium ion donors (fixed titanium traps) preferably has a gradient in the BFTO layers.

In a preferred embodiment, the BFO layer is doped, close to the electrodes, with fixed titanium ion donors (BFTO for short), which donors act as traps. In a particular embodiment, the BFO layer is in physical contact with the BFTO layer ($BiFeO_3$:Ti), BFTO/BFO for short). The BFO layer is preferably thicker than the BFTO layer. In a preferred embodiment, the BFTO layer is thicker than the BFO layer. Preferred embodiments of the material according to the invention have already been described in You et al. and Du et al. The bottom electrode is arranged at the BFO layer. Particularly preferably, the bottom electrode is arranged on the BFTO layer. The top electrode is arranged on the opposing face of the memristive layer sequence. The top electrode is preferably arranged at the BFO layer. In a particular embodiment, the top electrode is arranged at the BFTO layer.

The memristive layer sequence of the memristive device, used in the present invention, is preferably formed as a memristive three-ply layer. In this case, the memristive layer sequence comprises three layers that are arranged between two electrodes and comprise the layers BFTO/BFO/BFTO. The memristive layer sequence is therefore a memristive three-ply layer.

According to various embodiments, the first and third thin film layer may be thicker or thinner than the second, middle thin film layer. In a particular embodiment, the memristive three-ply layer consists of BFO layers. In this case, the structure of a BFO layer that is provided with fixed titanium traps close to the two electrodes is: BFTO/BFO/BFTO.

Symmetrical behaviour is associated with the symmetry of the structure of the memristive device and the identical materials used in the memristive BFTO/BFO/BFTO three-ply layer. The functions of the first and the second electrode are thus interchangeable. This is therefore a bidirectional memristive device.

The layer thickness of the BFO layer applied is in the range of 10 nm to 10,000 nm, particularly preferably approximately 50 to 5000 nm, very particularly preferably approximately 200 to 1000 nm, very particularly preferably approximately 500 to 700 nm.

The layer thickness of the BFTO layer is particularly preferably approximately 10 nm to 10,000 nm, very particularly preferably approximately 50 to 5000 nm, very particularly preferably approximately 200 to 1000 nm, very particularly preferably approximately 50 to 150 nm.

The freely movable and displaceable ions may also result in intrinsic n-type conduction (surplus of electrons). For example, ZnO, $TiO_2$ and $BiFeO_3$ are n-type.

In a preferred embodiment, the freely movable and displaceable ions are oxygen ions which, in the case of $TiO_2$, are already present in the memristive layer sequence or are inserted into the memristive layer sequence during production. In a preferred approach, the oxygen ions in the BFO are set, in the sputtering chamber, during production, for example by regulating the oxygen partial pressure. In the following, the oxygen ions are referred to as mobile oxygen vacancies. The mobile oxygen vacancies are neutral (Vo), singly ionised ($Vo^+$) or doubly ionised ($Vo^{++}$).

As described above, singly ionised mobile oxygen vacancies ($Vo^+$) are preferably located in the memristive BFO and BFTO layers, particularly preferably in the memristive BFTO/BFO/BFTO three-ply layer.

The concentration of the mobile oxygen vacancies is preferably approximately $2\times10^{17}$ $cm^{-3}$. In an alternative embodiment of the invention, the concentration of the mobile oxygen vacancies is higher, preferably approximately $5\times10^{18}$ $cm^{-3}$. The electron mobility in the oxidic thin film layers is generally much lower than in conventional semiconductors and is between 0.1 and a few 100 $cm^2$Ns. (cf. the electron mobility in silicon is approximately 1300 $cm^2$Ns at room temperature).

Depending on the electrical field, the drift velocity of the mobile oxygen vacancies between the two electrodes is linear in the case of low applied voltages, and accelerates exponentially in the case of high applied voltages. In the linear range, the drift process between T1 and T2 lasts longer and is approximately in the ms range. If the memristive layer sequence has a layer thickness of a few hundred nanometers, above a voltage threshold (which, depending on the layer thickness of the memristive layer thickness, is preferably approximately 5 V), the drift velocity of the mobile oxygen vacancies increases exponentially with the electrical field applied.

The traps are incorporated in a BFO thin film layer. In a particular embodiment, the BFO layer is doped with divalent or tetravalent metal atoms. In a particularly preferred embodiment, the BFO layer is doped with fixed titanium ion donors (BFTO for short). In this case, titanium acts as substitutional, invariable doping for the $Fe^{3+}$ ions. In this case, titanium is incorporated into the crystal structure of the BFO layer, at the lattice sites of the iron atoms (ions). The resulting thin film layers are referred to as $BiFeO_3$:Ti (BFTO for short).

Fixed titanium traps are inserted at the future interfaces forming the boundary with the subsequently applied electrodes. The fixed titanium traps are particularly preferably inserted close to the two electrodes of the memristive layer sequence and thus are distributed inhomogeneously over the memristive layer sequence owing to an accumulation at the electrode/thin film layer interfaces.

In the BFTO thin film layers, the concentration of the inserted titanium is preferably less than 1 at. %, and in a preferred variant is less than 0.05 at. %.

It is also possible to insert fixed titanium traps in the bottom electrode before the BFO layer has accumulated, for example by implanting titanium into the bottom electrode over a large surface area. It is furthermore possible to implant the fixed titanium traps locally in the bottom electrode, with the result that the bottom electrode does not have to be structured further and there is an increased concentration of titanium traps locally. Furthermore, the titanium may be deposited on the foreign substrate prior to the bottom electrode being applied, and subsequently reach the BFO layer by means of thermal diffusion through the bottom electrode.

In an alternative embodiment, the titanium traps may also be implanted locally into the BFO layer retrospectively (after the BFO layer has accumulated), with the result that the concentration of the fixed titanium traps is increased locally. The titanium traps can thus be arranged so as to be present locally, in a region that is only the size of the interface forming the boundary with the top electrode. This advantageously makes it possible to switch the memristive device locally. An advantage of an unstructured titanium implanted BFTO thin film layer of this kind is that structuring (for example the etching step) of the memristive layer sequence in the region of the bottom electrode is omitted.

In the case of the memristive device used in the present invention, a memristive BFTO/BFO/BFTO layer sequence (three-ply layer) is arranged between two electrodes. The titanium traps are located in the two outer thin film layers of the memristive layer sequence.

As described in the introduction, two mutually different state pairs can be implemented in the memristive device. In this case, one state pair contains two mutually complementary resistance states which can be written only in pairs. In each case, just one state pair is written for each initialisation pulse and/or writing process. In this case, complementary denotes the fact that said states have mutually complementary properties. In this case, each state pair implements a high resistance state (HRS) in one current direction and a low resistance state (LRS) complementary to said state in the opposite current direction, between the electrodes. State pairs are (PHRS, NLRS) or (PLRS, NHRS), since the complementary resistance states PHRS and NLRS or PLRS and NHRS are mutually complementary in each case.

The resistance state PHRS means that an HRS state is present which is read out at a positive ("P") reading pulse. The resistance state PLRS means that an LRS state is present which is read out at a positive reading pulse ("P"). The resistance state NHRS means that an HRS state is present which is read out at a negative reading pulse ("N"). The resistance state NLRS means that an LRS state is present which is read out at a negative reading pulse ("N").

The memristive device is electrically conductively connected, via the electrodes T1 and T2, to the two outputs of a device for generating voltage pulses and for measuring currents. The memristive device is preferably connected, via T1 and T2, to a voltage source and an ammeter. The memristive device is particularly preferably connected, via T1 and T2, to a voltage pulse generator and an amperemeter.

The voltage pulses applied to the electrodes have different functions with regard to the adjustability of the potential barriers and of the associated state pair of the memristive device. The voltage pulses applied to the electrodes preferably have different pulse shapes. The voltage pulses carry out different functions depending on the amplitude, time period and temporal offset $\Delta t$ relative to one another. A distinction is made between initialisation pulses, writing pulses, reading pulses and normalisation pulses. In this case, at least one pulse shape, preferably the writing pulse, decays over time.

As already explained, potential barriers form at the interfaces between the electrodes and the memristive layer sequence. The initialisation pulses and writing pulses, which are applied at least for the minimum writing period $t_p$, allow for flexible, analogue and complementary adjustment of the height of the potential barriers of the memristive device at the electrode/thin film layer interface. In this case, depending on the selected polarity and temporal superimposition of the applied voltage pulses, the two flexibly analoguely complementarily adjustable potential barriers preferably each comprise successive depletion layers and/or concentration layers of mobile oxygen vacancies.

When reference is made, in the present invention, to flexibly analoguely complementarily adjustable potential barriers, this means that the potential barriers can occupy every intermediate value between two complementary end states. Advantageously, the heights of the potential barriers are preferably flexibly and successively (analoguely) variable and adjustable to intermediate values between two complementary end states, by means of correspondingly adjusted initialisation pulses or writing pulses. In this case, raising the potential barriers at one electrode causes complementary lowering of the potential barriers at the other electrode. In this case, it is possible to flexibly and successively (analoguely) vary the height of the potential barriers by means of correspondingly adjusted initialisation pulses or writing pulses.

The complementary analogue reconfigurable memristive bidirectional resistive switch used in the method according to the invention comprises two flexibly analoguely complementarily adjustable potential barriers at the electrodes.

An initialisation pulse sets the memristive device in a defined state.

The initialisation reconfigures the memristive device and comprises at least one initialisation pulse. The initialisation pulse precisely adjusts the height of the potential barrier at the interface.

In the present invention, the property "reconfigurable" means that it is possible to change the states stored in the memristive device. This is carried out by specifying the potential barrier height by means of the applied pulses at the electrodes of the memristive device.

The initialisation pulse functions as a writing pulse which implements the state pair (PLRS, NHRS) or the state pair (PHRS, NLRS) in the memristive device.

The initialisation pulse is preferably a rectangular pulse having a minimum writing period which corresponds to the pulse width $t_p$. In a further preferred embodiment, the initialisation pulse consists of a triangular pulse. In principle, other pulse shapes (for example spike pulses in which the pulse edges rise or fall exponentially) are also possible.

The duration of the initialisation pulse is at least equal to the minimum writing period $t_p$ and may also exceed said duration. The absolute value of the initialisation pulse reaches or exceeds the absolute value of the minimum writing voltage, in terms of the absolute value of the voltage and duration, for the minimum writing period $t_p$.

In a first preferred embodiment, the initialisation pulse comprises a negative pulse at T1 (T2 remains at zero potential), which pulse implements the state pair (PHRS, NLRS) in the memristive device. In a second preferred embodiment, the initialisation pulse comprises a positive pulse at T1 (T2 remains at zero potential), and the state pair (PLRS, NHRS) is implemented in the memristive device.

Preferably, at least one initialisation pulse can be applied to the memristive device before the writing process is carried out. The initialisation pulse is preferably applied before each writing process and thus temporally precedes the writing pulse sequence pairs.

Initialisation pulses are in each case applied to one electrode prior to the writing process. The initialisation pulses are preferably always applied to the first electrode of the memristive device (the second electrode remains at zero potential). In an alternative embodiment, the initialisation pulses are always applied to the second electrode. Applying a negative initialisation pulse to the first electrode moves the mobile oxygen vacancies to the first electrode of the memristive device. Applying a positive initialisation pulse to the first electrode moves the mobile oxygen vacancies to the second electrode of the memristive device.

In a further embodiment, the initialisation pulses are always applied to the second electrode of the memristive device. Applying a negative initialisation pulse to the second electrode moves the mobile oxygen vacancies to the second electrode of the memristive device. Applying a positive initialisation pulse to the second electrode moves the mobile oxygen vacancies to the first electrode of the memristive device.

Applying an initialisation pulse allows for the height of the potential barrier of the memristive device at the first electrode/thin film layer interface to occupy two different states in each case: HRS and LRS. The memristive device can also occupy two different states in each case at the second electrode/thin film layer interface.

An initialisation pulse having a positive voltage brings the memristive device into an LRS state in a first current direction, and specifies the state pair (PLRS, NHRS). An initialisation pulse having a negative voltage brings the memristive device into an HRS state in a first current direction, and specifies the state pair (PHRS, NLRS). In this case, the written state pairs (PLRS, NHRS) and (PHRS, NLRS) each correspond to analogue complementary end states.

The minimum height of the potential barrier at T1 is reached by means of a negative initialisation pulse being applied to T1 (T2 remains at zero potential). This results in the potential barrier at T1 being lowered, and therefore the mobile oxygen vacancies collect at the barrier to T1 and the contact at T1 is non-rectifying (ohmic contact). At the same time, the potential barrier at T2 is raised owing to the depletion of mobile oxygen vacancies, with the result that T2 is rectifying (Schottky contact).

The minimum height of the potential barrier at T2 is reached by means of a negative initialisation pulse being applied to T2 (T1 remains at zero potential). This results in the potential barrier at T2 being lowered, and therefore the mobile oxygen vacancies collect at the barrier to T2 and the contact at T2 is non-rectifying (ohmic contact).

At the same time, the potential barrier at T1 is raised owing to the depletion of mobile oxygen vacancies, with the result that T1 is rectifying (Schottky contact). The maximum height of the potential barrier at T1 is reached by means of a positive initialisation pulse being applied to T1 (T1 remains at zero potential). This results in the potential barrier at T1 being raised, and therefore a deficiency of mobile oxygen vacancies results at the barrier to T1 and the contact at T1 is rectifying (Schottky contact). At the same time, the potential barrier at T2 is lowered owing to the concentration of mobile oxygen vacancies, with the result that T2 is non-rectifying (ohmic contact).

The maximum height of the potential barrier at T2 is reached by means of a positive initialisation pulse being applied to T2 (T1 remains at zero potential). This results in the potential barrier at T2 being raised, and therefore a deficiency of mobile oxygen vacancies results at the barrier to T2 and the contact at T2 is rectifying (Schottky contact). At the same time, the potential barrier at T1 is lowered owing to the concentration of mobile oxygen vacancies, with the result that T1 is non-rectifying (ohmic contact).

In order to ensure non-volatile behaviour of the memristive device, the potential barrier is in each case raised just once, at one electrode, while the potential barrier at the other electrode is lowered. Simultaneous raising or lowering of the potential barrier on both electrodes is not relevant for the object according to the invention. If no initialisation pulse is applied to the electrodes or a non-zero voltage pulse of the same polarity is applied to both electrodes simultaneously, the states do not change.

The initialisation of the memristive device can be repeated as often as desired.

In an alternative embodiment, the application of at least one initialisation pulse prior to the writing process is optional.

The absolute value of the minimum writing voltage, and the minimum writing period $t_p$, which the initialisation pulse has to exceed, depend on the materials used and on the doping. Said voltage and duration dan be determined using methods known from the prior art, or can be calculated.

The writing process reconfigures the memristive device and comprises at least one writing pulse sequence pair. The writing pulse sequence pair precisely adjusts the height of the potential barrier at the interface (between the memristive layer sequence and the electrodes).

The writing pulse sequence pair comprises two writing pulse sequences, one writing pulse sequence being applied to the first electrode and the other writing pulse sequence being applied to the second electrode, and the writing pulse sequences being temporally superimposed with one another. In a preferred embodiment, the first writing pulse sequence is applied to the first electrode and the second writing pulse sequence is applied to the second electrode. In a further preferred embodiment, the first writing pulse sequence is applied to the second electrode and the second writing pulse sequence is applied to the first electrode.

The absolute value of the voltage of each writing pulse of a writing pulse sequence is smaller than the minimum writing voltage of the memristive device.

During the writing process, the two writing pulse sequences of one writing pulse sequence pair are superimposed with one another. In addition, the absolute value of the voltage of each writing pulse of a writing pulse sequence is at least sufficiently great for it to be possible for the minimum writing voltage to be exceeded for the minimum writing period in the event of superimposition of writing pulse sequences of one writing pulse sequence pair.

In a particular embodiment, the two writing pulse sequences of a plurality of writing pulse sequence pairs, for example 60 to 80, can be temporally superimposed with one another.

In each case one writing pulse sequence consists of a series of temporally mutually successive writing pulses which preferably have different pulse shapes.

In a particular embodiment, the two writing pulse sequences of one writing pulse sequence pair can occupy any desired degree of complexity with regard to the number and shape of the pulses forming said sequence pair, and are not restricted to two pulse shapes. The superimposition of the two writing pulse sequences of one writing pulse sequence pair thus also has any desired degree of complexity.

In a preferred embodiment, the writing pulse sequence consists of two temporally mutually offset writing pulses of opposite polarities.

In this case, one writing pulse sequence preferably comprises at least one guide pulse, preferably in the form of a rectangular pulse, and a following writing pulse having a falling edge, preferably in the form of a spike, having an exponential drop of decay time T and being of an opposite polarity to the guide pulse. The guide pulses of the writing pulse sequences of one writing pulse sequence pair are preferably of the same polarity, and the following writing pulses having falling edges are also of mutually the same polarity, the following writing pulses having falling edges being of a polarity which is opposite to that of the guide pulses.

In a particular embodiment, the falling edge of the writing pulse that follows the guide pulse has a linear course. In a preferred embodiment, the absolute value of the amplitude of the guide pulse is greater than the absolute value of the amplitude of the following writing pulse. In a second preferred embodiment, the absolute value of the amplitude of the following writing pulse is greater than the absolute value of the amplitude of the preceding guide pulse. In a further preferred embodiment, the absolute value of the amplitudes of the guide pulse is greater and of the following writing pulse are the same.

The decisive factor for writing states is the temporal superimposition of the writing pulse sequences, in particular of the writing pulse, having the falling edge, of the first writing pulse sequence and the guide pulse of the second writing pulse sequence. During the superimposition, the absolute value of the voltage of the superimposed pulses reaches or exceeds the absolute value of a minimum writing voltage for a minimum writing period $t_p$ that is dependent on the minimum writing voltage. Preferably, a first and a second writing pulse sequence are temporally superimposed with one another.

In this case, the two writing pulse sequences are applied to T1 and T2 so as to be of opposite polarities. The guide pulses of the respective writing pulse sequences are of mutually the same polarity. The following writing pulses and the falling edges thereof are also of mutually the same polarity, but are of an opposite polarity to the guide pulses.

When the writing pulse sequences are superimposed, a voltage difference results between the electrodes T1 and T2, which difference corresponds to the difference between the two applied voltages.

In the case of a limited temporal offset Δt, if Δt is small ($|\Delta t| \geq t_p$), the superimposition of the following writing pulse, having the falling edge, of the first writing pulse sequence, and the guide pulse of the second writing pulse sequence results in the minimum writing voltage being exceeded for the minimum writing period $t_p$ that is dependent on the minimum writing voltage.

In this case, complementary resistance states are written into the memristive device, which states form mutually different state pairs. The written resistance states comprise the states PHRS, PLRS, NHRS, NLRS. In this case, either the state pair (PLRS, NHRS) or the state pair (PHRS, NLRS) is written.

It has been found to be advantageous to use two identical writing pulse sequences (i.e. both comprise one guide pulse and one following writing pulse having a falling edge in each case), which pulse sequences are superimposed to form the writing pulse sequence pair. The guide pulse of the first writing pulse sequence and the following writing pulse, having the falling edge, of the second writing pulse sequence do not play any role for writing states, but are nonetheless optionally also applied in the writing pulse sequences for the sake of simplicity of operation.

The temporal offset is the temporal spacing between the start of the guide pulse of the first writing pulse sequence and the start of the guide pulse of the second writing pulse of one writing pulse sequence pair. The absolute value and the size of the temporal offset |Δt| determines the manner in which writing takes place. The temporal offset Δt defines the order and the markedness of the superimposition of the writing pulse sequence pairs. In this case, the size of the temporal offset Δt determines the extent to which states are written.

A distinction is made between a negative temporal offset (Δt<0) and a positive temporal offset (Δt>0). Furthermore, a distinction is made between a large absolute value of the temporal offset ($|\Delta t| \rightarrow \infty$) and a small absolute value of the temporal offset (Δt corresponds to the pulse width $t_p$, $|\Delta t| \geq t_p$).

If the absolute value of the temporal offset between the two writing pulses of the writing pulse sequence pair is selected so as to be very large ($|\Delta t| \rightarrow \infty$), the minimum writing voltage is not exceeded when the guide pulse of the second writing pulse sequence is superimposed with the writing pulse, having the falling edge, of the first writing pulse sequence. The state of the state pair is not changed. If the absolute value of the temporal offset |Δt| between the two writing pulses of the writing pulse sequence pair is selected so as to be very small, |Δt| corresponding to at least one pulse width $t_p$ ($|\Delta t| \geq t_p$), the superimposition of the two writing pulse sequences, in particular the superimposition of the following guide pulse of the second writing pulse sequence on the writing pulse, having the falling edge, of the first writing pulse sequence, the absolute value of the voltage of the superimposed pulses reaches or exceeds the absolute value of a minimum writing voltage for a minimum writing period $t_p$ that is dependent on the minimum writing voltage, and the state of the state pair changes.

The order of the writing pulse sequences of the writing pulse sequence pair applied to the electrodes determines the sign of the temporal offset Δt.

In the case of a negative offset (Δt<0), the first writing pulse sequence is applied to the second electrode and the second writing pulse sequence is applied to the first electrode.

In this case, the positive writing pulse, having the falling edge, of the first writing pulse sequence temporally precedes the negative guide pulse of the second writing pulse sequence. The writing pulse sequence pair is defined as a negative writing pulse sequence pair. In this case, the superimposed negative writing pulse sequence pair writes the complementary states PHRS and NLRS as a state pair (PHRS, NLRS).

In a further preferred embodiment, in a reversal of the substantive matter set out above, the first writing pulse sequence is preferably applied to the first electrode and the second writing pulse sequence is preferably applied to the second electrode.

In a preferred embodiment, the negative writing pulse sequence pair is defined as follows: the first writing pulse sequence is applied to the second electrode and the second writing pulse sequence is applied to the first electrode. The guide pulse of the first writing pulse sequence is of a negative polarity. The following writing pulse, having a falling edge, of the first writing pulse sequence, is of a positive polarity. The guide pulse of the second writing pulse sequence is of a negative polarity. The following writing pulse, having a falling edge, is of a positive polarity. The resulting superimposed writing pulse sequence pair thus writes the state pair (PHRS, NLRS).

In the case of a positive offset (Δt>0), the first writing pulse sequence is applied to the first electrode and the second writing pulse sequence is applied to the second electrode.

In this case, the positive writing pulse, having the falling edge, of the first writing pulse sequence temporally precedes the negative guide pulse of the second writing pulse sequence. The writing pulse sequence pair is defined as a positive writing pulse sequence pair. In this case, the superimposed positive writing pulse sequence pair writes the complementary states PLRS and NHRS as a state pair (PLRS, NHRS).

In a particular embodiment, in a reversal of the substantive matter set out above, the first writing pulse sequence is preferably applied to the second electrode and the second writing pulse sequence is preferably applied to the first electrode.

In a preferred embodiment, the positive writing pulse sequence pair is defined as follows: the first writing pulse sequence is applied to the first electrode and the second writing pulse sequence is applied to the second electrode. The guide pulse of the first writing pulse sequence is of a negative polarity. The following writing pulse, having a falling edge, is of a positive polarity. The guide pulse of the second writing pulse sequence is of a negative polarity. The following writing pulse, having a falling edge, is of a positive polarity. The resulting superimposed writing pulse sequence pair thus writes the state pair (PLRS, NHRS).

In a preferred approach, the writing process follows the initialisation, after a waiting time $t_w$. The waiting time $t_w$ can in principle be of any desired duration, but usually does not exceed 10 ms. In a particularly simple embodiment, the writing process takes place without a preceding initialisation being applied.

However, an initialisation pulse is preferably applied before the writing pulse sequence pair is applied. In this case, the absolute value of the temporal offset $|\Delta t|$ between the superimposition of the writing pulse, having the falling edge, of the first writing pulse sequence, which writing pulse follows the guide pulse, and the guide pulse of the second writing pulse sequence is selected depending on the preceding initialisation pulse.

If an initialisation pulse having a positive voltage is applied to T1 or T2 and the state pair (PLRS, NHRS) is implemented for the memristive device, this is preferably followed by a negative writing pulse sequence pair for a negative temporal offset ($\Delta t<0$), which implements the state pair (PHRS, NLRS) for the memristive device.

In this case, the first writing pulse sequence is applied to T2 and the second writing pulse sequence is applied to T1. In this case, the negative guide pulse of the second writing pulse sequence at T1 is superimposed with the positive writing pulse, having the falling edge, of the first writing pulse sequence at T2. The flexible analogue complementary potential barrier at T1 is successively lowered by means of the accumulation of mobile oxygen vacancies at a decreasing temporal offset $|\Delta t|\geq t_p$. At the same time, the processes complementary to T1 occur at T2 during the writing process: The flexible analogue complementary potential barrier at T2 is successively raised by means of the depletion of mobile oxygen vacancies, and the state pair at T2 displaces successively from (PHRS, NLRS) at initialisation to (PLRS, NHRS) during the writing process.

If an initialisation pulse having a negative voltage is applied to T1 or T2 and the state pair (PHRS, NLRS) is implemented for the memristive device, this is preferably followed by a positive writing pulse sequence pair for a positive temporal offset ($\Delta t>0$), which implements the state pair (PLRS, NHRS) for the memristive device.

In this case, the first writing pulse sequence is applied to T1 and the second writing pulse sequence is applied to T2. In this case, the negative guide pulse of the second writing pulse sequence at T2 is superimposed with the positive writing pulse, having the falling edge, of the first writing pulse sequence at T1. The flexible analogue complementary potential barrier at T1 is successively raised by means of the depletion of mobile oxygen vacancies at a decreasing temporal offset $|\Delta t|\geq t_p$. At the same time, the processes complementary to T1 occur at T2 during the writing process: The flexible analogue complementary potential barrier at T2 is successively lowered by means of the accumulation of mobile oxygen vacancies, and the state pair at T2 displaces successively from (PLRS, NHRS) at initialisation to (PHRS, NLRS) during the writing process.

The method step of the writing process can be repeated as often as desired.

The absolute value of the initialisation pulse and the absolute value of the maximum voltage of the superimposed writing pulses do not need to be identical. In a preferred embodiment, the absolute value of the initialisation pulse may be greater than the absolute value of the maximum voltage of the superimposed writing pulses, or vice versa. All that matters is that both the absolute value of the initialisation pulse and the absolute value of the maximum voltage f the superimposed writing pulses are greater than the minimum writing voltage.

In a particular embodiment, the reading process follows completed initialisation and/or the completed writing process.

In this case, the direction of the current for reading out a state of the state pair corresponds to a reading current direction and determines which state of the state pair is read out. Each state pair implements a high resistance state (HRS) in one reading current direction and a low resistance state (LRS) complementary thereto in the opposite reading current direction.

The reading process preferably follows the completed writing process, after a waiting time $t_w$. The waiting time $t_w$ may be of any desired duration.

The reading process is carried out using a reading voltage pulse, or reading pulse for short. The reading process comprises at least one reading pulse, the reading voltage of which is of an absolute value that is less than the absolute value of the minimum writing voltage. While the reading pulse is applied, a reading current having a reading current direction flows. A reading current output signal, referred to in the following as a current output signal s, is detected, which signal can occupy both the binary values 0 and 1, and all non-discrete values between 0 and 1.

The reading pulse is applied to the first electrode or to the second electrode of the memristive device. The reading pulse is preferably applied to the first electrode of the memristive device. In an alternative embodiment, the reading pulse is applied to the second electrode of the memristive device. The reading pulse is particularly preferably applied to the same electrode as the preceding initialisation pulse. In a preferred embodiment, the reading pulse is a rectangular pulse having a pulse duration $t_r$ which may be of any desired absolute value, if the associated minimum writing voltage is not exceeded. The duration of the reading pulse is preferably limited to the minimum that is achievable using the available technical equipment.

During the reading process, a complementary resistance state is read out from one of the state pairs, in each case, specified by the previously applied initialisation pulses and writing processes. Which complementary resistance state of a state pair is read out results from the polarity of the reading pulse of the electrode to which it is applied. The reading process comprises simply requesting, and reading out the specified states, without changing said states in the process.

In the case of a preceding negative writing pulse sequence pair that has written the state pair (PHRS, NLRS), the PHRS state is read out when a positive reading pulse is applied and the NLRS state is read out when a negative reading pulse is applied. In the case of a preceding positive writing pulse sequence pair that has written the state pair (PLRS, NHRS), the PLRS state is read out when a positive reading pulse is applied and the NHRS state is read out when a negative reading pulse is applied. In this case, write and reading pulses are applied to the same electrode.

After two reading pulses that are temporally mutually offset and are of opposing polarities have been applied, in the case of a preceding negative writing pulse sequence pair that has written the state pair (PHRS, NLRS), the two complementary resistance states PHRS and NLRS are read out. After two reading pulses that are temporally mutually offset and are of opposing polarities have been applied, in the case of a preceding positive writing pulse sequence pair that has written the state pair (PLRS, NHRS), the two complementary resistance states PLRS and NHRS are read out. In this case, write and reading pulses are applied to the same electrode. In this case, the reading process is independent of the order of the reading pulse polarities applied.

If at least two temporally mutually offset reading pulses of the same polarity are applied to the same electrode (T1 or T2), the same complementary resistance state is read out twice.

In a preferred embodiment, two reading pulses are applied to the first electrode. The reading pulses applied are temporally mutually offset and are of opposing polarities. In this case, the complementary resistance states read out are independent of the order of the reading pulses applied. The same applies for the second electrode.

The method step of the reading process can be repeated as often as desired.

The method steps of the writing process and of the reading process can be repeated as often as desired and in a mutually independent manner. The memristive device can thus be written to and/or read out as often as desired.

In a preferred embodiment, the normalisation pulse is a rectangular pulse having a minimum writing period corresponding to the pulse width $t_p$, and is applied to the first electrode.

The normalisation pulse, which corresponds in terms of form to an initialisation pulse, makes it possible to set the memristive device into a defined state.

A normalisation pulse is preferably applied after the writing process has been completed, and can be repeated as often as desired. In practice, the normalisation pulse is an initialisation pulse.

In order to establish a connection to the binary mathematics most used in computer technology, it has been found to be advantageous to assign Boolean states to the state pairs (PLRS, NHRS) or (PHRS, NLRS). The binary Boolean states can occupy discrete values 1 or 0.

In this case, state pairs in which the markedness of the corresponding complementary resistance state is maximum or minimum, in terms of absolute value, have been found to be particularly suitable. Said complementary resistance states of the state pairs thus correspond to complementary end states. In this case, the complementary end states are the boundaries, in terms of absolute value, up to which the complementary resistance states can be changed during the writing process.

In this case, the state pairs are either:

complementary end states following a writing process in which the state pair of complementary resistance states is specified depending on the temporal offset Δt of the writing pulse sequences. As a result, the HRS states and LRS states become more distinctive as the absolute value of the temporal offset decreases $|\Delta t| \geq t_p$;

or complementary end states following initialisation or following a writing process having a temporal offset Δt, in which the superimposition of the guide pulse of the second writing pulse sequence and the writing pulse, having the falling edge, of the first writing pulse sequence, no longer exceeds the minimum writing voltage for the minimum writing period $t_p$ that is dependent on the minimum writing voltage. In the latter case, the resistance states of the memristive device are not changed (a writing process occurs which does not bring about writing of states). In the process, the HRS states and LRS states become less distinctive as the absolute value of the temporal offset increases $|\Delta t| \rightarrow$.

The maximum markedness is achieved when the writing pulse, having the falling edge, of the second writing pulse sequence, and the guide pulse of the first writing pulse sequence begin almost simultaneously ($|\Delta t| \geq t_p$). This preferably occurs at a temporal offset Δt that corresponds to the pulse width $t_p$ of the guide pulse. In this case, the writing pulse, having the falling edge, of the second writing pulse sequence, and the guide pulse of the first writing pulse sequence are exactly on top of one another. The complementary end states written in this case are (PLRS, NHRS) for a positive temporal offset ($\Delta t > 0$, $\Delta t \geq +tp$), or (PHRS, NLRS) for a negative temporal offset ($\Delta t < 0$, $\Delta t \leq -tp$) and corresponding binary Boolean states.

The specified state pairs experience minimum markedness when the temporal offset goes towards infinity ($|\Delta t| \rightarrow \infty$), in terms of absolute value. In this case, complementary end states (PHRS, NLRS) are specified for a positive temporal offset ($\Delta t \rightarrow +\infty$), or (PHRS, NLRS) for a negative temporal offset ($\Delta t \rightarrow -\infty$), which states correspond to negations of the binary Boolean states.

The Boolean states are assigned to the state pairs by means of the current output signals s of the HRS states being assigned the binary value 0, and the current output signals s of the LRS states being assigned the binary value 1, or if, vice versa, the current output signals s of the HRS states are assigned the binary value 1, and the current output signals s of the LRS states are assigned the binary value 0. The individual complementary resistance states can thus each occupy the discrete values 0 or 1, in accordance with Boolean logic.

In this case, the binary values of the current output signals s correspond to the complementary end states following the initialisation process of the logical negation of the current output signals s of the binary values of the complementary end states following a writing process.

It has been found that it is possible, using suitable writing processes, to continuously specify, in a writing process, the complementary resistance states of the state pairs so as to be at values between two complementary end states.

The complementary resistance states that are achieved at the minimum markedness and at the maximum markedness of the resistance values are in each case referred to as complementary end states and constitute the boundaries for the continuously specifiable complementary resistance states.

A first end state of the possible complementary resistance states is achieved when an initialisation pulse is applied to the memristive device or a writing process having a temporal offset Δt takes place, during the writing process the temporal superimposition of the guide pulse of the second writing pulse sequence on the writing pulse, having the falling edge, of the first writing pulse sequence not exceeding the absolute value of the voltage of the superimposed pulses the absolute value of a minimum writing voltage for a minimum writing period $t_p$ that is dependent on the minimum writing voltage. This is achieved in particular by means of a large temporal offset in terms of absolute value ($|\Delta t| \rightarrow \infty$).

The second end state of the possible complementary resistance states is preferably implemented when the writing pulse, having the falling edge, of the first writing pulse sequence, and the guide pulse of the second writing pulse sequence begin simultaneously and the absolute value of the temporal offset Δt thus corresponds to the pulse width $t_p$ of the guide pulse ($|\Delta t| \geq t_p$).

Continuously specifying the complementary resistance states of the state pairs between the complementary end states defines characteristic curves in a Cartesian coordinate system.

A state change of the state pairs takes place depending on the sign and the size of the temporal offset Δt ($t_p \leq |\Delta t| < \infty$).

In this case, in the event of a positive temporal offset ($\Delta t \rightarrow +\infty$), the state pair (PHRS, NLRS), corresponding to the minimum markedness of the complementary resistance states, transitions continuously and increasingly into the state pair (PLRS, NHRS), corresponding to the maximum markedness of the complementary resistance states at $\Delta t \geq +t_p$, as the absolute value of the temporal offset Δt decreases.

In the event of a negative temporal offset ($\Delta t \rightarrow -\infty$), the state pair (PLRS, NHRS), corresponding to the minimum markedness of the complementary resistance states, transitions continuously and increasingly into the state pair (PHRS, NLRS), corresponding to the maximum markedness of the complementary resistance states at $\Delta t \leq -t_p$, as the absolute value of the temporal offset Δt decreases.

The temporal offset Δt thus determines the implemented state on a characteristic curve that results from continuously specifying the complementary resistance states in the range $t_p \leq |\Delta t| < \infty$.

In the defined Cartesian coordinate system, the x-axis represents the temporal offset Δt of the writing pulse sequences of the writing pulse sequence pairs, and the y-axis represents the values of the normalised current output signal s (the corresponding formulae for normalisation are set out further below). A state change having a continuous transition from the end state PHRS in the event of a large positive temporal offset ($\Delta t \rightarrow +\infty$), to the end state PLRS in the event of a small positive temporal offset ($\Delta t \rightarrow +t_p$), is shown as a characteristic curve in the first quadrant and is read out in the event of a positive reading pulse.

A state change having a continuous transition from the end state NHRS in the event of a large negative temporal offset ($\Delta t \rightarrow -\infty$), to the end state NLRS in the event of a small negative temporal offset ($\Delta t \rightarrow -t_p$), is shown as a characteristic curve in the second quadrant and is read out in the event of a negative reading pulse.

A state change having a continuous transition from the end state PLRS in the event of a large negative temporal offset ($\Delta t \rightarrow -\infty$), to the end state PHRS in the event of a small negative temporal offset ($\Delta t \rightarrow \rightarrow -t_p$), is shown as a characteristic curve in the third quadrant and is read out in the event of a negative reading pulse.

A state change having a continuous transition from the end state NLRS in the event of a large positive temporal offset ($\Delta t \rightarrow +\infty$), to the end state NHRS in the event of a small positive temporal offset ($\Delta t \rightarrow +t_p$), is shown as a characteristic curve in the fourth quadrant and is read out in the event of a positive reading pulse.

For each value of the temporal offset Δt, there are thus two complementary resistance states of a state pair, which states contain mutually complementary information and are read out by means of two reading pulses of opposing polarities. In this case, the characteristic curves in the first and fourth quadrants, and the characteristic curves in the second and third quadrants, are mutually complementary characteristic curves.

However, two state pairs can never be written simultaneously. Therefore, it is never possible for all four characteristic curves to be shown simultaneously in the Cartesian coordinate system, but instead always just two complementary curves of the four characteristic curves. The two states of a state pair may, however, be read out sequentially. For the purpose of improved representation, all four characteristic curves, i.e. two characteristic curves per state pair, are often shown together in a Cartesian coordinate system.

Implementation of all four characteristic curves is possible by means of the flexibly analoguely complementarily adjustable potential barriers at the two interfaces (between the memristive layer sequence and the electrodes) of the memristive device, in each case one complementary characteristic curve pair in fact being implemented, as mentioned above. The particular characteristic curve pair that is implemented is specified by the writing process.

The possibility of implementing resistance values between the complementary end states, in the memristive device, makes it possible to represent all 16 two-valued Boolean functions having two logical input variables p and q, in accordance with the rules of fuzzy logic.

The pulse sequence for implementing configurable fuzzy logic comprises initialisation pulses, writing pulses and reading pulses that are applied to the first or the second electrode.

In a first step (initialisation I), a first initialisation pulse that is independent of the input variables p and q is specified for implementing the selected valid truth table.

A truth table is a tabular compilation of the truth value progression of a logical statement. The truth table shows all possible assignments of two logical input variables p and q, from which the output signal results according to the selected operation. The truth table is used to represent and define Boolean functions and to carry out simple Boolean proofs.

An individual specific valid truth table is assigned to each of the 16 two-valued Boolean functions: In the present invention, said one specific valid truth table is further divided into truth table 1 and truth table 2. Table 1 shows the 32 valid truth tables having the definitions of the pulses and the logical operators for implementing fuzzy logic using the 16 two-valued Boolean functions.

TABLE 1

Truth table 1 (XNOR)

| | | | Initialisation I | | Initialisation II | | Writing process | Reading process | | |
|---|---|---|---|---|---|---|---|---|---|---|
| $\overline{p \oplus q}$ | | | T1 | T2 | T1 | T2 | Δt | r ($\overline{p}$) | | |
| p | q | s | 1 | 0 | q | 1 | q | $\|\Delta t\| \geq t_p$ | $t_p \leq \|\Delta t\| < \infty$ | $\|\Delta t\| \rightarrow \infty$ |
| 0 | 0 | 1 | (PLRS, NHRS) | | (PHRS, NLRS) | | >0 | PLRS = 1 | LTP | PHRS = 0 |
| 1 | 0 | 0 | (PLRS, NHRS) | | (PHRS, NLRS) | | >0 | NHRS = 0 | anti-LTD | NLRS = 1 |

TABLE 1-continued

| | | | | | | | | |
|---|---|---|---|---|---|---|---|---|
| 0 | 1 | 0 | (PLRS, NHRS) | (PLRS, NHRS) | <0 | PHRS = 0 | LTD | PLRS = 1 |
| 1 | 1 | 1 | (PLRS, NHRS) | (PLRS, NHRS) | <0 | NLRS = 1 | anti-LTP | NHRS = 0 |

Truth table 2 (XNOR)

| | | | Initialisation I | Initialisation II | Writing process | Reading process | | |
|---|---|---|---|---|---|---|---|---|
| $\overline{p \oplus q}$ | | | T1 T2 | T1 T2 | Δt | r (p) | | |
| p | q | s | 0 1 | 1 q | $\bar{q}$ | $\lvert\Delta t\rvert \geq t_p$ | $t_p \leq \lvert\Delta t\rvert < \infty$ | $\lvert\Delta t\rvert \to \infty$ |
| 0 | 0 | 1 | (PHRS, NLRS) | (PLRS, NHRS) | <0 | NLRS = 1 | anti-LTP | NHRS = 0 |
| 1 | 0 | 0 | (PHRS, NLRS) | (PLRS, NHRS) | <0 | PHRS = 0 | LTD | PLRS = 1 |
| 0 | 1 | 0 | (PHRS, NLRS) | (PLRS, NHRS) | >0 | NHRS = 0 | anti-LTD | NLRS = 1 |
| 1 | 1 | 1 | (PHRS, NLRS) | (PHRS, NLRS) | <0 | PLRS = 1 | LTP | PHRS = 0 |

Truth table 1 (tautology)

| | | | Initialisation I | Initialisation II | Writing process | Reading process | | |
|---|---|---|---|---|---|---|---|---|
| 1 | | | T1 T2 | T1 T2 | Δt | r ($\bar{p}$) | | |
| p | q | s | 1 0 | p 1 | p | $\lvert\Delta t\rvert \geq t_p$ | $t_p \leq \lvert\Delta t\rvert < \infty$ | $\lvert\Delta t\rvert \to \infty$ |
| 0 | 0 | 1 | (PLRS, NHRS) | (PHRS, NLRS) | >0 | PLRS = 1 | LTP | PHRS = 0 |
| 1 | 0 | 0 | (PLRS, NHRS) | (PLRS, NHRS) | <0 | NLRS = 1 | anti-LTP | NHRS = 0 |
| 0 | 1 | 0 | (PLRS, NHRS) | (PHRS, NLRS) | >0 | PLRS = 1 | LTP | PHRS = 0 |
| 1 | 1 | 1 | (PLRS, NHRS) | (PLRS, NHRS) | <0 | NLRS = 1 | anti-LTP | NHRS = 0 |

Truth table 2 (tautology)

| | | | Initialisation I | Initialisation II | Writing process | Reading process | | |
|---|---|---|---|---|---|---|---|---|
| 1 | | | T1 T2 | T1 T2 | Δt | r (p) | | |
| p | q | s | 0 1 | 1 p | $\bar{p}$ | $\lvert\Delta t\rvert \geq t_p$ | $t_p \leq \lvert\Delta t\rvert < \infty$ | $\lvert\Delta t\rvert \to \infty$ |
| 0 | 0 | 1 | (PHRS, NLRS) | (PLRS, NHRS) | <0 | NLRS = 1 | anti-LTP | NHRS = 0 |
| 1 | 0 | 0 | (PHRS, NLRS) | (PHRS, NLRS) | >0 | PLRS = 1 | LTP | PHRS = 0 |
| 0 | 1 | 0 | (PHRS, NLRS) | (PLRS, NHRS) | <0 | NLRS = 1 | anti-LTP | NHRS = 0 |
| 1 | 1 | 1 | (PHRS, NLRS) | (PHRS, NLRS) | >0 | PLRS = 1 | LTP | PHRS = 0 |

Truth table 1 (contradiction)

| | | | Initialisation I | Initialisation II | Writing process | Reading process | | |
|---|---|---|---|---|---|---|---|---|
| 0 | | | T1 T2 | T1 T2 | Δt | r (p) | | |
| p | q | s | 0 1 | 1 p | p | $\lvert\Delta t\rvert \geq t_p$ | $t_p \leq \lvert\Delta t\rvert < \infty$ | $\lvert\Delta t\rvert \to \infty$ |
| 0 | 0 | 0 | (PLRS, NHRS) | (PHRS, NLRS) | >0 | NHRS = 0 | anti-LTD | NLRS = 1 |
| 1 | 0 | 0 | (PLRS, NHRS) | (PLRS, NHRS) | <0 | PHRS = 0 | LTD | PLRS = 1 |
| 0 | 1 | 0 | (PLRS, NHRS) | (PHRS, NLRS) | >0 | NHRS = 0 | anti-LTD | NLRS = 1 |
| 1 | 1 | 0 | (PLRS, NHRS) | (PLRS, NHRS) | <0 | PHRS = 0 | LTD | PLRS = 1 |

Truth table 2 (contradiction)

| | | | Initialisation I | Initialisation II | Writing process | Reading process | | |
|---|---|---|---|---|---|---|---|---|
| 0 | | | T1 T2 | T1 T2 | Δt | r ($\bar{p}$) | | |
| p | q | s | 0 1 | 1 p | $\bar{p}$ | $\lvert\Delta t\rvert \geq t_p$ | $t_p \leq \lvert\Delta t\rvert < \infty$ | $\lvert\Delta t\rvert \to \infty$ |
| 0 | 0 | 0 | (PHRS, NLRS) | (PLRS, NHRS) | <0 | PHRS = 0 | LTD | PLRS = 1 |
| 1 | 0 | 0 | (PHRS, NLRS) | (PHRS, NLRS) | >0 | NHRS = 0 | anti-LTD | NLRS = 1 |
| 0 | 1 | 0 | (PHRS, NLRS) | (PLRS, NHRS) | <0 | PHRS = 0 | LTD | PLRS = 1 |
| 1 | 1 | 0 | (PHRS, NLRS) | (PHRS, NLRS) | >0 | NHRS = 0 | anti-LTD | NLRS = 1 |

TABLE 1-continued

Truth table 1 (replication)

| | | | Initialisation I | | Initialisation II | | Writing process | Reading process | | |
|---|---|---|---|---|---|---|---|---|---|---|
| $p + \bar{q}$ | | | T1 | T2 | T1 | T2 | Δt | r (0) | | |
| p | q | s | 1 | 0 | q | P | $p + \bar{q}$ | $\lvert\Delta t\rvert \geq t_p$ | $t_p \leq \lvert\Delta t\rvert < \infty$ | $\lvert\Delta t\rvert \to \infty$ |
| 0 | 0 | 1 | (PLRS, NHRS) | | (PLRS, NHRS) | | <0 | NLRS = 1 | anti-LTP | NHRS = 0 |
| 1 | 0 | 0 | (PLRS, NHRS) | | (PHRS, NLRS) | | >0 | NHRS = 0 | anti-LTD | NLRS = 1 |
| 0 | 1 | 0 | (PLRS, NHRS) | | (PLRS, NHRS) | | <0 | NLRS = 1 | anti-LTP | NHRS = 0 |
| 1 | 1 | 1 | (PLRS, NHRS) | | (PLRS, NHRS) | | <0 | NLRS = 1 | anti-LTP | NHRS = 0 |

Truth table 2 (replication)

| | | | Initialisation I | | Initialisation II | | Writing process | Reading process | | |
|---|---|---|---|---|---|---|---|---|---|---|
| $p + \bar{q}$ | | | T1 | T2 | T1 | T2 | Δt | r (1) | | |
| p | q | s | 0 | 1 | p | q | $\bar{p} \cdot q$ | $\lvert\Delta t\rvert \geq t_p$ | $t_p \leq \lvert\Delta t\rvert < \infty$ | $\lvert\Delta t\rvert \to \infty$ |
| 0 | 0 | 1 | (PHRS, NLRS) | | (PHRS, NLRS) | | >0 | PLRS = 1 | LTP | PHRS = 0 |
| 1 | 0 | 0 | (PHRS, NLRS) | | (PLRS, NHRS) | | <0 | PHRS = 0 | LTD | PLRS = 1 |
| 0 | 1 | 1 | (PHRS, NLRS) | | (PHRS, NLRS) | | >0 | PLRS = 1 | LTP | PHRS = 0 |
| 1 | 1 | 1 | (PHRS, NLRS) | | (PHRS, NLRS) | | >0 | PLRS = 1 | LTP | PHRS = 0 |

Truth table 1 (inhibition of q)

| | | | Initialisation I | | Initialisation II | | Writing process | Reading process | | |
|---|---|---|---|---|---|---|---|---|---|---|
| $\bar{p} \cdot q$ | | | T1 | T2 | T1 | T2 | Δt | r (1) | | |
| p | q | s | 1 | 0 | q | p | $p + \bar{q}$ | $\lvert\Delta t\rvert \geq t_p$ | $t_p \leq \lvert\Delta t\rvert < \infty$ | $\lvert\Delta t\rvert \to \infty$ |
| 0 | 0 | 0 | (PLRS, NHRS) | | (PLRS, NHRS) | | <0 | PHRS = 0 | LTD | PLRS = 1 |
| 1 | 0 | 1 | (PLRS, NHRS) | | (PHRS, NLRS) | | >0 | PLRS = 1 | LTP | PHRS = 0 |
| 0 | 1 | 0 | (PLRS, NHRS) | | (PLRS, NHRS) | | <0 | PHRS = 0 | LTD | PLRS = 1 |
| 1 | 1 | 0 | (PLRS, NHRS) | | (PLRS, NHRS) | | <0 | PHRS = 0 | LTD | PLRS = 1 |

Truth table 2 (inhibition of q)

| | | | Initialisation I | | Initialisation II | | Writing process | Reading process | | |
|---|---|---|---|---|---|---|---|---|---|---|
| $\bar{p} \cdot q$ | | | T1 | T2 | T1 | T2 | Δt | r (0) | | |
| p | q | s | 0 | 1 | p | q | $\bar{p} \cdot q$ | $\lvert\Delta t\rvert \geq t_p$ | $t_p \leq \lvert\Delta t\rvert < \infty$ | $\lvert\Delta t\rvert \to \infty$ |
| 0 | 0 | 0 | (PHRS, NLRS) | | (PHRS, NLRS) | | >0 | NHRS = 0 | anti-LTD | NLRS = 1 |
| 1 | 0 | 1 | (PHRS, NLRS) | | (PLRS, NHRS) | | <0 | NLRS = 1 | anti-LTP | NHRS = 0 |
| 0 | 1 | 0 | (PHRS, NLRS) | | (PHRS, NLRS) | | >0 | NHRS = 0 | anti-LTD | NLRS = 1 |
| 1 | 1 | 0 | (PHRS, NLRS) | | (PHRS, NLRS) | | <0 | NHRS = 0 | anti-LTD | NLRS = 1 |

Truth table 1 (AND)

| | | | Initialisation I | | Initialisation II | | Writing process | Reading process | | |
|---|---|---|---|---|---|---|---|---|---|---|
| $p \cdot q$ | | | T1 | T2 | T1 | T2 | Δt | r ($\bar{p}$) | | |
| p | q | s | 1 | 0 | q | p | $p + \bar{q}$ | $\lvert\Delta t\rvert \geq t_p$ | $t_p \leq \lvert\Delta t\rvert < \infty$ | $\lvert\Delta t\rvert \to \infty$ |
| 0 | 0 | 0 | (PLRS, NHRS) | | (PLRS, NHRS) | | <0 | PHRS = 0 | LTD | PLRS = 1 |
| 1 | 0 | 0 | (PLRS, NHRS) | | (PHRS, NLRS) | | >0 | NHRS = 0 | anti-LTD | NLRS = 1 |
| 0 | 1 | 0 | (PLRS, NHRS) | | (PLRS, NHRS) | | <0 | PHRS = 0 | LTD | PLRS = 1 |
| 1 | 1 | 1 | (PLRS, NHRS) | | (PLRS, NHRS) | | <0 | NLRS = 1 | anti-LTP | NHRS = 0 |

TABLE 1-continued

Truth table 2 (AND)

| | | | Initialisation I | | Initialisation II | | Writing process | Reading process | | |
|---|---|---|---|---|---|---|---|---|---|---|
| $p \cdot q$ | | | T1 | T2 | T1 | T2 | Δt | | r (p) | |
| p | q | s | 0 | 1 | p | q | $\overline{p} \cdot q$ | $\lvert\Delta t\rvert \geq t_p$ | $t_p \leq \lvert\Delta t\rvert < \infty$ | $\lvert\Delta t\rvert \rightarrow \infty$ |
| 0 | 0 | 0 | (PHRS, NLRS) | | (PHRS, NLRS) | | >0 | NHRS = 0 | anti-LTD | NLRS = 1 |
| 1 | 0 | 0 | (PHRS, NLRS) | | (PLRS, NHRS) | | <0 | PHRS = 0 | LTD | PLRS = 1 |
| 0 | 1 | 0 | (PHRS, NLRS) | | (PHRS, NLRS) | | >0 | NHRS = 0 | anti-LTD | NLRS = 1 |
| 1 | 1 | 1 | (PHRS, NLRS) | | (PHRS, NLRS) | | >0 | PLRS = 1 | LTP | PHRS = 0 |

Truth table 1 (NAND)

| | | | Initialisation I | | Initialisation II | | Writing process | Reading process | | |
|---|---|---|---|---|---|---|---|---|---|---|
| $\overline{p \cdot q}$ | | | T1 | T2 | T1 | T2 | Δt | | r (p) | |
| p | q | s | 1 | 0 | q | p | $p + \overline{q}$ | $\lvert\Delta t\rvert \geq t_p$ | $t_p \leq \lvert\Delta t\rvert < \infty$ | $\lvert\Delta t\rvert \rightarrow \infty$ |
| 0 | 0 | 1 | (PLRS, NHRS) | | (PLRS, NHRS) | | <0 | NLRS = 1 | anti-LTP | NHRS = 0 |
| 1 | 0 | 1 | (PLRS, NHRS) | | (PHRS, NLRS) | | >0 | PLRS = 1 | LTP | PHRS = 0 |
| 0 | 1 | 1 | (PLRS, NHRS) | | (PLRS, NHRS) | | <0 | NLRS = 1 | anti-LTP | NHRS = 0 |
| 1 | 1 | 0 | (PLRS, NHRS) | | (PLRS, NHRS) | | <0 | PHRS = 0 | LTD | PLRS = 1 |

Truth table 2 (NAND)

| | | | Initialisation I | | Initialisation II | | Writing process | Reading process | | |
|---|---|---|---|---|---|---|---|---|---|---|
| $\overline{p \cdot q}$ | | | T1 | T2 | T1 | T2 | Δt | | r($\overline{p}$) | |
| p | q | s | 0 | 1 | p | q | $\overline{p} \cdot q$ | $\lvert\Delta t\rvert \geq t_p$ | $t_p \leq \lvert\Delta t\rvert < \infty$ | $\lvert\Delta t\rvert \rightarrow \infty$ |
| 0 | 0 | 1 | (PHRS, NLRS) | | (PHRS, NLRS) | | >0 | PLRS = 1 | LTP | PHRS = 0 |
| 0 | 1 | 1 | (PHRS, NLRS) | | (PLRS, NHRS) | | <0 | NLRS = 1 | anti-LTP | NHRS = 0 |
| 0 | 1 | 1 | (PHRS, NLRS) | | (PHRS, NLRS) | | >0 | PLRS = 1 | LTP | PHRS = 0 |
| 1 | 1 | 0 | (PHRS, NLRS) | | (PHRS, NLRS) | | >0 | NHRS = 0 | anti-LTD | NLRS = 1 |

Truth table 1 (OR)

| | | | Initialisation I | | Initialisation II | | Writing process | Reading process | | |
|---|---|---|---|---|---|---|---|---|---|---|
| $p + q$ | | | T1 | T2 | T1 | T2 | Δt | | r ($\overline{p}$) | |
| p | q | s | 1 | 0 | p | q | $\overline{p} + q$ | $\lvert\Delta t\rvert \geq t_p$ | $t_p \leq \lvert\Delta t\rvert < \infty$ | $\lvert\Delta t\rvert \rightarrow \infty$ |
| 0 | 0 | 1 | (PLRS, NHRS) | | (PLRS, NHRS) | | <0 | PHRS = 0 | LTD | PLRS = 1 |
| 1 | 0 | 1 | (PLRS, NHRS) | | (PLRS, NHRS) | | <0 | NLRS = 1 | anti-LTP | NHRS = 0 |
| 0 | 1 | 1 | (PLRS, NHRS) | | (PHRS, NLRS) | | >0 | PLRS = 1 | LTP | PHRS = 0 |
| 1 | 1 | 1 | (PLRS, NHRS) | | (PLRS, NHRS) | | <0 | NLRS = 1 | anti-LTP | NHRS = 0 |

Truth table 2 (OR)

| | | | Initialisation I | | Initialisation II | | Writing process | Reading process | | |
|---|---|---|---|---|---|---|---|---|---|---|
| $p + q$ | | | T1 | T2 | T1 | T2 | Δt | | r (p) | |
| p | q | s | 0 | 1 | q | p | $p \cdot \overline{q}$ | $\lvert\Delta t\rvert \geq t_p$ | $t_p \leq \lvert\Delta t\rvert < \infty$ | $\lvert\Delta t\rvert \rightarrow \infty$ |
| 0 | 0 | 0 | (PHRS, NLRS) | | (PHRS, NLRS) | | >0 | NHRS = 0 | anti-LTD | NLRS = 1 |
| 1 | 0 | 1 | (PHRS, NLRS) | | (PHRS, NLRS) | | >0 | PLRS = 1 | LTP | PHRS = 0 |
| 0 | 1 | 1 | (PHRS, NLRS) | | (PLRS, NHRS) | | <0 | NLRS = 1 | anti-LTP | NHRS = 0 |
| 1 | 1 | 1 | (PHRS, NLRS) | | (PHRS, NLRS) | | >0 | PLRS = 1 | LTP | PHRS = 0 |

TABLE 1-continued

Truth table 1 (NOR)

| | | | Initialisation I | | Initialisation II | | Writing process | Reading process | | |
|---|---|---|---|---|---|---|---|---|---|---|
| $\overline{p+q}$ | | | T1 | T2 | T1 | T2 | Δt | r (p) | | |
| p | q | s | 1 | 0 | p | q | $\overline{p} + q$ | $\lvert\Delta t\rvert \geq t_p$ | $t_p \leq \lvert\Delta t\rvert < \infty$ | $\lvert\Delta t\rvert \to \infty$ |
| 0 | 0 | 1 | (PLRS, NHRS) | | (PLRS, NHRS) | | <0 | NLRS = 1 | anti-LTP | NHRS = 0 |
| 1 | 0 | 0 | (PLRS, NHRS) | | (PLRS, NHRS) | | <0 | PHRS = 0 | LTD | PLRS = 1 |
| 0 | 1 | 0 | (PLRS, NHRS) | | (PHRS, NLRS) | | >0 | NHRS = 0 | anti-LTD | NLRS = 1 |
| 1 | 1 | 0 | (PLRS, NHRS) | | (PLRS, NHRS) | | <0 | PHRS = 0 | LTD | PLRS = 1 |

Truth table 2 (NOR)

| | | | Initialisation I | | Initialisation II | | Writing process | Reading process | | |
|---|---|---|---|---|---|---|---|---|---|---|
| p + q | | | T1 | T2 | T1 | T2 | Δt | r ($\overline{p}$) | | |
| p | q | s | 0 | 1 | q | p | $p \cdot \overline{q}$ | $\lvert\Delta t\rvert \geq t_p$ | $t_p \leq \lvert\Delta t\rvert < \infty$ | $\lvert\Delta t\rvert \to \infty$ |
| 0 | 0 | 1 | (PHRS, NLRS) | | (PHRS, NLRS) | | >0 | PLRS = 1 | LTP | PHRS = 0 |
| 1 | 0 | 0 | (PHRS, NLRS) | | (PHRS, NLRS) | | >0 | NHRS = 0 | anti-LTD | NLRS = 1 |
| 0 | 1 | 0 | (PHRS, NLRS) | | (PLRS, NHRS) | | <0 | PHRS = 0 | LTD | PLRS = 1 |
| 1 | 1 | 0 | (PHRS, NLRS) | | (PHRS, NLRS) | | >0 | NHRS = 0 | anti-LTD | NLRS = 1 |

Truth table 1 (identity of p)

| | | | Initialisation I | | Initialisation II | | Writing process | Reading process | | |
|---|---|---|---|---|---|---|---|---|---|---|
| p | | | T1 | T2 | T1 | T2 | Δt | r (0) | | |
| p | q | s | 1 | 0 | p | 1 | p | $\lvert\Delta t\rvert \geq t_p$ | $t_p \leq \lvert\Delta t\rvert < \infty$ | $\lvert\Delta t\rvert \to \infty$ |
| 0 | 0 | 0 | (PLRS, NHRS) | | (PHRS, NLRS) | | >0 | NHRS = 0 | anti-LTD | NLRS = 1 |
| 1 | 0 | 1 | (PLRS, NHRS) | | (PLRS, NHRS) | | <0 | NLRS = 1 | anti-LTP | NHRS = 0 |
| 0 | 1 | 0 | (PLRS, NHRS) | | (PHRS, NLRS) | | >0 | NHRS = 0 | anti-LTD | NLRS = 1 |
| 1 | 1 | 1 | (PLRS, NHRS) | | (PLRS, NHRS) | | <0 | NLRS = 1 | anti-LTP | NHRS = 0 |

Truth table 2 (identity of p)

| | | | Initialisation I | | Initialisation II | | Writing process | Reading process | | |
|---|---|---|---|---|---|---|---|---|---|---|
| p | | | T1 | T2 | T1 | T2 | Δt | r (1) | | |
| p | q | s | 0 | 1 | 1 | p | $\overline{p}$ | $\lvert\Delta t\rvert \geq t_p$ | $t_p \leq \lvert\Delta t\rvert < \infty$ | $\lvert\Delta t\rvert \to \infty$ |
| 0 | 0 | 0 | (PHRS, NLRS) | | (PLRS, NHRS) | | <0 | PHRS = 0 | LTD | PLRS = 1 |
| 1 | 0 | 1 | (PHRS, NLRS) | | (PHRS, NLRS) | | >0 | PLRS = 1 | LTP | PHRS = 0 |
| 0 | 1 | 0 | (PHRS, NLRS) | | (PLRS, NHRS) | | <0 | PHRS = 0 | LTD | PLRS = 1 |
| 1 | 1 | 1 | (PHRS, NLRS) | | (PHRS, NLRS) | | >0 | PLRS = 1 | LTP | PHRS = 0 |

Truth table 1 (identity of $\overline{p}$)

| | | | Initialisation I | | Initialisation II | | Writing process | Reading process | | |
|---|---|---|---|---|---|---|---|---|---|---|
| $\overline{p}$ | | | T1 | T2 | T1 | T2 | Δt | r (1) | | |
| p | q | s | 1 | 0 | p | 1 | p | $\lvert\Delta t\rvert \geq t_p$ | $t_p \leq \lvert\Delta t\rvert < \infty$ | $\lvert\Delta t\rvert \to \infty$ |
| 0 | 0 | 1 | (PLRS, NHRS) | | (PHRS, NLRS) | | >0 | PLRS = 1 | LTP | PHRS = 0 |
| 1 | 0 | 0 | (PLRS, NHRS) | | (PLRS, NHRS) | | <0 | PHRS = 0 | LTD | PLRS = 1 |
| 0 | 1 | 1 | (PLRS, NHRS) | | (PHRS, NLRS) | | >0 | PLRS = 1 | LTP | PHRS = 0 |
| 1 | 1 | 0 | (PLRS, NHRS) | | (PLRS, NHRS) | | <0 | PHRS = 0 | LTD | PLRS = 1 |

TABLE 1-continued

Truth table 2 (identity of $\bar{p}$)

| | | | Initialisation I | | Initialisation II | | Writing process | Reading process | | |
|---|---|---|---|---|---|---|---|---|---|---|
| $\bar{p}$ | | | T1 | T2 | T1 | T2 | $\Delta t$ | r (0) | | |
| p | q | s | 0 | 1 | 1 | p | $\bar{p}$ | $\lvert\Delta t\rvert \geq t_p$ | $t_p \leq \lvert\Delta t\rvert < \infty$ | $\lvert\Delta t\rvert \to \infty$ |
| 0 | 0 | 1 | (PHRS, NLRS) | | (PLRS, NHRS) | | <0 | NLRS = 1 | anti-LTP | NHRS = 0 |
| 1 | 0 | 0 | (PHRS, NLRS) | | (PHRS, NLRS) | | >0 | NHRS = 0 | anti-LTD | NLRS= 1 |
| 0 | 1 | 1 | (PHRS, NLRS) | | (PLRS, NHRS) | | <0 | NLRS = 1 | anti-LTP | NHRS = 0 |
| 1 | 1 | 0 | (PHRS, NLRS) | | (PHRS, NLRS) | | >0 | NHRS = 0 | anti-LTD | NLRS = 1 |

Truth table 1 (identity of q)

| | | | Initialisation I | | Initialisation II | | Writing process | Reading process | | |
|---|---|---|---|---|---|---|---|---|---|---|
| q | | | T1 | T2 | T1 | T2 | $\Delta t$ | r (0) | | |
| p | q | s | 1 | 0 | p | 1 | q | $\lvert\Delta t\rvert \geq t_p$ | $t_p \leq \lvert\Delta t\rvert < \infty$ | $\lvert\Delta t\rvert \to \infty$ |
| 0 | 0 | 0 | (PLRS, NHRS) | | (PHRS, NLRS) | | >0 | NHRS = 0 | anti-LTD | NLRS = 1 |
| 1 | 0 | 0 | (PLRS, NHRS) | | (PHRS, NLRS) | | >0 | NHRS = 0 | anti-LTD | NLRS = 1 |
| 0 | 1 | 1 | (PLRS, NHRS) | | (PLRS, NHRS) | | <0 | NLRS = 1 | anti-LTP | NHRS = 0 |
| 1 | 1 | 1 | (PLRS, NHRS) | | (PLRS, NHRS) | | <0 | NLRS = 1 | anti-LTP | NHRS = 0 |

Truth table 2 (identity of q)

| | | | Initialisation I | | Initialisation II | | Writing process | Reading process | | |
|---|---|---|---|---|---|---|---|---|---|---|
| q | | | T1 | T2 | T1 | T2 | $\Delta t$ | r (1) | | |
| p | q | s | 0 | 1 | 1 | p | $\bar{q}$ | $\lvert\Delta t\rvert \geq t_p$ | $t_p \leq \lvert\Delta t\rvert < \infty$ | $\lvert\Delta t\rvert \to \infty$ |
| 0 | 0 | 0 | (PHRS, NLRS) | | (PLRS, NHRS) | | <0 | PHRS = 0 | LTD | PLRS = 1 |
| 1 | 0 | 0 | (PHRS, NLRS) | | (PLRS, NHRS) | | <0 | PHRS = 0 | LTD | PLRS = 1 |
| 0 | 1 | 1 | (PHRS, NLRS) | | (PHRS, NLRS) | | >0 | PLRS = 1 | LTP | PHRS = 0 |
| 1 | 1 | 1 | (PHRS, NLRS) | | (PHRS, NLRS) | | >0 | PLRS = 1 | LTP | PHRS = 0 |

Truth table 1 (identity $\bar{q}$ of)

| | | | Initialisation I | | Initialisation II | | Writing process | Reading process | | |
|---|---|---|---|---|---|---|---|---|---|---|
| $\bar{q}$ | | | T1 | T2 | T1 | T2 | $\Delta t$ | r (1) | | |
| p | q | s | 1 | 0 | q | 1 | q | $\lvert\Delta t\rvert \geq t_p$ | $t_p \leq \lvert\Delta t\rvert < \infty$ | $\lvert\Delta t\rvert \to \infty$ |
| 0 | 0 | 1 | (PLRS, NHRS) | | (PHRS, NLRS) | | >0 | PLRS = 1 | LTP | PHRS = 0 |
| 1 | 0 | 1 | (PLRS, NHRS) | | (PHRS, NLRS) | | >0 | PLRS = 1 | LTP | PHRS = 0 |
| 0 | 1 | 0 | (PLRS, NHRS) | | (PLRS, NHRS) | | <0 | PHRS = 0 | LTD | PLRS = 1 |
| 1 | 1 | 0 | (PLRS, NHRS) | | (PLRS, NHRS) | | <0 | PHRS = 0 | LTD | PLRS = 1 |

Truth table 2 (identity $\bar{q}$ of)

| | | | Initialisation I | | Initialisation II | | Writing process | Reading process | | |
|---|---|---|---|---|---|---|---|---|---|---|
| $\bar{q}$ | | | T1 | T2 | T1 | T2 | $\Delta t$ | r (0) | | |
| p | q | s | 0 | 1 | 1 | q | $\bar{q}$ | $\lvert\Delta t\rvert \geq t_p$ | $t_p \leq \lvert\Delta t\rvert < \infty$ | $\lvert\Delta t\rvert \to \infty$ |
| 0 | 0 | 1 | (PHRS, NLRS) | | (PLRS, NHRS) | | <0 | NLRS = 1 | anti-LTP | NHRS = 0 |
| 1 | 0 | 1 | (PHRS, NLRS) | | (PLRS, NHRS) | | <0 | NLRS = 1 | anti-LTP | NHRS = 0 |
| 0 | 1 | 0 | (PHRS, NLRS) | | (PHRS, NLRS) | | >0 | NHRS = 0 | anti-LTD | NLRS = 1 |
| 1 | 1 | 0 | (PHRS, NLRS) | | (PHRS, NLRS) | | >0 | NHRS = 0 | anti-LTD | NLRS = 1 |

Truth table 1 (implication)

| | | | Initialisation I | | Initialisation II | | Writing process | Reading process | | |
|---|---|---|---|---|---|---|---|---|---|---|
| $\bar{p} + q$ | | | T1 | T2 | T1 | T2 | $\Delta t$ | r (0) | | |
| p | q | s | 1 | 0 | p | q | $\bar{p} + q$ | $\lvert\Delta t\rvert \geq t_p$ | $t_p \leq \lvert\Delta t\rvert < \infty$ | $\lvert\Delta t\rvert \to \infty$ |
| 0 | 0 | 1 | (PLRS, NHRS) | | (PLRS, NHRS) | | <0 | NLRS = 1 | anti-LTP | NHRS = 0 |

TABLE 1-continued

| | | | | | | | | | | |
|---|---|---|---|---|---|---|---|---|---|---|
| 1 | 0 | 1 | (PLRS, NHRS) | | (PLRS, NHRS) | | <0 | NLRS = 1 | anti-LTP | NHRS = 0 |
| 0 | 1 | 0 | (PLRS, NHRS) | | (PHRS, NLRS) | | >0 | NHRS = 0 | anti-LTD | NLRS = 1 |
| 1 | 1 | 1 | (PLRS, NHRS) | | (PLRS, NHRS) | | <0 | NLRS = 1 | anti-LTP | NHRS = 0 |

Truth table 2 (implication)

| | | | Initialisation I | | Initialisation II | | Writing process | Reading process | | |
|---|---|---|---|---|---|---|---|---|---|---|
| $\overline{p} + q$ | | | T1 | T2 | T1 | T2 | Δt | r (1) | | |
| p | q | s | 0 | 1 | q | p | $p \cdot \overline{q}$ | $\lvert\Delta t\rvert \ge t_p$ | $t_p \le \lvert\Delta t\rvert < \infty$ | $\lvert\Delta t\rvert \to \infty$ |
| 0 | 0 | 1 | (PHRS, NLRS) | | (PHRS, NLRS) | | >0 | PLRS = 1 | LTP | PHRS = 0 |
| 1 | 0 | 1 | (PHRS, NLRS) | | (PHRS, NLRS) | | >0 | PLRS = 1 | LTP | PHRS = 0 |
| 0 | 1 | 0 | (PHRS, NLRS) | | (PLRS, NHRS) | | <0 | PHRS = 0 | LTD | PLRS = 1 |
| 1 | 1 | 1 | (PHRS, NLRS) | | (PHRS, NLRS) | | >0 | PLRS = 1 | LTP | PHRS = 0 |

Truth table 1 (inhibition of p)

| | | | Initialisation I | | Initialisation II | | Writing process | Reading process | | |
|---|---|---|---|---|---|---|---|---|---|---|
| $p \cdot \overline{q}$ | | | T1 | T2 | T1 | T2 | Δt | r (1) | | |
| p | q | s | 1 | 0 | p | q | $\overline{p} + q$ | $\lvert\Delta t\rvert \ge t_p$ | $t_p \le \lvert\Delta t\rvert < \infty$ | $\lvert\Delta t\rvert \to \infty$ |
| 0 | 0 | 0 | (PLRS, NHRS) | | (PLRS, NHRS) | | <0 | PHRS = 0 | LTD | PLRS = 1 |
| 1 | 0 | 0 | (PLRS, NHRS) | | (PLRS, NHRS) | | <0 | PHRS = 0 | LTD | PLRS = 1 |
| 0 | 1 | 1 | (PLRS, NHRS) | | (PHRS, NLRS) | | >0 | PLRS = 1 | LTP | PHRS = 0 |
| 1 | 1 | 0 | (PLRS, NHRS) | | (PLRS, NHRS) | | <0 | PHRS = 0 | LTD | PLRS = 1 |

Truth table 2 (inhibition of p)

| | | | Initialisation I | | Initialisation II | | Writing process | Reading process | | |
|---|---|---|---|---|---|---|---|---|---|---|
| $p \cdot \overline{q}$ | | | T1 | T2 | T1 | T2 | Δt | r (0) | | |
| p | q | s | 0 | 1 | q | p | $p \cdot \overline{q}$ | $\lvert\Delta t\rvert \ge t_p$ | $t_p \le \lvert\Delta t\rvert < \infty$ | $\lvert\Delta t\rvert \to \infty$ |
| 0 | 0 | 0 | (PHRS, NLRS) | | (PHRS, NLRS) | | >0 | NHRS = 0 | anti-LTD | NLRS = 1 |
| 1 | 0 | 0 | (PHRS, NLRS) | | (PHRS, NLRS) | | >0 | NHRS = 0 | anti-LTD | NLRS = 1 |
| 0 | 1 | 1 | (PHRS, NLRS) | | (PLRS, NHRS) | | <0 | NLRS = 1 | anti-LTP | NHRS = 0 |
| 1 | 1 | 0 | (PHRS, NLRS) | | (PHRS, NLRS) | | >0 | NHRS = 0 | anti-LTD | NLRS = 1 |

Truth table 1 (XOR)

| | | | Initialisation I | | Initialisation II | | Writing process | Reading process | | |
|---|---|---|---|---|---|---|---|---|---|---|
| $p \oplus q$ | | | T1 | T2 | T1 | T2 | Δt | r (p) | | |
| p | q | s | 1 | 0 | q | 1 | q | $\lvert\Delta t\rvert \ge t_p$ | $t_p \le \lvert\Delta t\rvert < \infty$ | $\lvert\Delta t\rvert \to \infty$ |
| 0 | 0 | 0 | (PLRS, NHRS) | | (PLRS, NHRS) | | >0 | NHRS = 0 | anti-LTD | NLRS = 1 |
| 1 | 0 | 1 | (PLRS, NHRS) | | (PHRS, NLRS) | | >0 | PLRS = 1 | LTP | PHRS = 0 |
| 0 | 1 | 1 | (PLRS, NHRS) | | (PHRS, NLRS) | | <0 | NLRS = 1 | anti-LTP | NHRS = 0 |
| 1 | 1 | 0 | (PLRS, NHRS) | | (PLRS, NHRS) | | <0 | PHRS = 0 | LTD | PLRS = 1 |

Truth table 2 (XOR)

| | | | Initialisation I | | Initialisation II | | Writing process | Reading process | | |
|---|---|---|---|---|---|---|---|---|---|---|
| $p \oplus q$ | | | T1 | T2 | T1 | T2 | Δt | r ($\overline{p}$) | | |
| p | q | s | 0 | 1 | 1 | q | $\overline{q}$ | $\lvert\Delta t\rvert \ge t_p$ | $t_p \le \lvert\Delta t\rvert < \infty$ | $\lvert\Delta t\rvert \to \infty$ |
| 0 | 0 | 0 | (PHRS, NLRS) | | (PLRS, NHRS) | | <0 | PHRS = 0 | LTD | PLRS = 1 |
| 1 | 0 | 1 | (PHRS, NLRS) | | (PLRS, NHRS) | | <0 | NLRS = 1 | anti-LTP | NHRS = 0 |
| 0 | 1 | 1 | (PHRS, NLRS) | | (PHRS, NLRS) | | >0 | PLRS = 1 | LTP | PHRS = 0 |
| 1 | 1 | 0 | (PHRS, NLRS) | | (PHRS, NLRS) | | >0 | NHRS = 0 | anti-LTD | NLRS =1 |

The voltage pulses for switching the memristive device for logical learning are defined for all 16 two-valued Boolean functions on the basis of the input variables p and q. Each of the 16 two-valued Boolean functions in each case comprises two valid truth tables that compile the truth value progression of a logical statement in a tabular manner. Furthermore, the possible written state pairs following initialisation I are shown.

During the initialisation I, the positive independent first initialisation pulse is applied to the first electrode according to the valid truth table 1, or the negative independent first initialisation pulse is applied to the first electrode according to the valid truth table 2. In the process, the second electrode remains at zero potential in each case.

In a second, following step (initialisation II), a second initialisation pulse that is dependent on an input variable p or q is specified for implementing the selected valid truth table. In this case, for each valid truth table 1 or 2 of the corresponding two-valued Boolean function, the second initialisation pulse is applied to the same electrode as the first initialisation pulse. Particularly preferably, the second initialisation pulse is applied to the first electrode, to which the first initialisation pulse is also applied. The second electrode remains at zero potential. Depending on the valid truth table, the second initialisation pulse may be dependent on both input variables p and q, or on just one input variable p or q, or may not be dependent on any input variables. Depending on the logic input, the state pairs can thus either be changed or remain constant.

The input variables p and q can be logically interconnected by the 16 two-valued Boolean functions in the initialisation II. It is thus possible, for example, for p and q to be converted into a single logical result by means of implementing logical operators, and to be reproduced by the output signal s. The logical operators comprise inter alia the following two-valued Boolean functions: AND, OR, NAND, NOR, XOR, XNOR (see table 1).

A writing process that is carried out according to the valid truth table 1 or 2 follows initialisation I and initialisation II. In this case, either a positive writing pulse sequence pair having a positive temporal offset $\Delta t>0$, or a negative writing pulse sequence pair having a negative temporal offset $\Delta t<0$ is applied to the memristive layer sequence, according to the valid truth table. In this case, the temporal offset $\Delta t$ determines to which electrode the first writing pulse sequence and to which electrode the second writing pulse sequence of the writing pulse sequence pair is applied. For a positive temporal offset $\Delta t<0$, the first writing pulse sequence is applied to the first electrode and the second writing pulse sequence is applied to the second electrode. For a negative temporal offset $\Delta t>0$, the first writing pulse sequence is applied to the second electrode and the second writing pulse sequence is applied to the first electrode.

Subsequently, the complementary states of the written state pair are read out in a reading process, according to the valid truth table 1 or 2. The logical output signal s, which corresponds to the current output signal s, is obtained as the result. In this case, there are in each case two current output signals s, according to the valid truth table (see table 1), for each temporal offset $\Delta t$.

In a preferred embodiment, the subsequent reading process consists of exactly one reading pulse which is applied to the first electrode, while the second electrode remains at zero potential. The reading pulse is particularly preferably applied to the same electrode as the first and second initialisation pulse. In this case, for a preceding positive writing pulse sequence pair, a positive reading pulse reads out a state value between the complementary end states PHRS ($\Delta t\rightarrow+\infty$) and PLRS ($\Delta t\geq+t_p$). For a preceding positive writing pulse sequence pair, a negative reading pulse reads out a state value between the complementary end states NLRS ($\Delta t\rightarrow+\infty$) and NHRS ($\Delta t\geq+t_p$). For a preceding negative writing pulse sequence pair, a positive reading pulse reads out a state value between the complementary end states PLRS ($\Delta t\rightarrow-\infty$) and PHRS ($\Delta t\leq-t_p$). For a preceding negative writing pulse sequence pair, a negative reading pulse reads out a state value between the complementary end states NHRS ($\Delta t\rightarrow-\infty$) and NLRS ($\Delta t\leq-t_p$).

As shown in the reading process in table 1, in this case the complementary resistance state is read out for a temporal offset $|\Delta t|\geq+t_p$ that is small in terms of absolute value, and for a temporal offset $|\Delta t|\rightarrow\infty$ that is large in terms of absolute value. The complementary resistance states read out for the temporal offset $|\Delta t|\geq+t_p$ that is small in terms of absolute value correspond to the current output signals s of the complementary end states following the writing process, and the complementary resistance states read out for the temporal offset $|\Delta t|\rightarrow\infty$ that is large in terms of absolute value correspond to the current output signals s of the complementary end states following the initialisation process and are logical negations of the current output signals s of the complementary end states following the writing process. The state change between the two complementary resistance states ($t_p\leq|\Delta t|<\infty$ is shown as a resultant characteristic curve in each case in the Cartesian coordinate system (later referred to as a learning curve).

Both the second initialisation pulse (initialisation II) and the reading process are dependent on the logical input variables p and/or q.

The pulse sequence for implementing complementary learning comprises initialisation pulses, writing pulses and reading pulses.

The complementary resistance states of a state pair at and between the complementary end states are written.

In this case, an initialisation pulse is firstly applied to the first electrode. The second electrode remains at zero potential.

Subsequently, a positive or negative writing pulse sequence pair, consisting of the first and second writing pulse sequence, is applied, the first writing pulse sequence being applied to the first electrode and the second writing pulse sequence being applied to the second electrode in the case of the positive writing pulse sequence pair, and the first writing pulse sequence being applied to the second electrode and the second writing pulse sequence being applied to the first electrode in the case of the negative writing pulse sequence pair. In this case, the temporal offset $\Delta t$ determines the position of the written state pair between the relevant complementary end states on the two characteristic curves of the state pair.

The complementary resistance states of a state pair that are located between the complementary end states are read by means of two temporally mutually offset reading pulses of opposing polarities being applied to the first or second electrode. The second or first electrode remains at zero potential. Preferably, the two temporally mutually offset reading pulses are applied to the first electrode, and the second electrode remains at zero potential. Particularly preferably, the temporally mutually offset reading pulses of opposing polarities are applied to the same electrode as the preceding initialisation pulse.

For a preceding positive writing pulse sequence pair, the state pair is read out between the complementary end states of the state pair (PHRS, NLRS) at $\Delta t\rightarrow+\infty$ or (PLRS, NHRS) at $\Delta t \geq +t_p$. For a preceding negative writing pulse sequence pair, the state pair is read out between the complementary end states of the state pair (PLRS, NHRS) at $\Delta t \rightarrow -\infty$ or (PHRS, NLRS) at $\Delta t \geq -t_p$.

For each value of the temporal offset Δt, there are exactly two complementary resistance states of a state pair, which states contain mutually complementary information and are read out by means of the two reading pulses of opposing polarities. Implementation of this capability by the memristive device is interpreted in the following as complementary learning.

For a value of the positive temporal offset (Δt >0), two current output signals s are read out, which signals are located on the characteristic curve in the first and on the characteristic curve in the fourth quadrant, respectively. For a value of the negative temporal offset (Δt<0), two current output signals s are read out, which signals are located on the characteristic curve in the second and on the characteristic curve in the third quadrant, respectively.

Reading out the state pairs occurs independently of the order of the reading pulses applied. In this case, it does not matter whether first a positive and then a negative, or first a negative and then a positive reading pulse is applied to the electrode.

The existence of two mutually complementary characteristic curves which contain two items of mutually complementary information means that a value of the temporal offset Δt of two mutually complementary current output signals s is read out. This advantageously makes it possible to precisely determine the current output signal s.

When the reading pulses are applied, current output signals s are measured. The measured current output signals s are referred to in the following as reading currents. The reading currents $I_{PHRs}$, $I_{PLRs}$, $I_{NHRs}$ and $I_{NLRB}$ are distinguished according to the polarity of the applied reading pulses.

If the state pair (PHRS, NLRS) was written to the memristive device, subsequently the reading current $I_{PHRs}$ is thus measured for a positive reading pulse and the reading current $I_{NLRs}$ is measured for a negative reading pulse. If the state pair (PLRS, NHRS) was written to the memristive device, subsequently the reading current $I_{PLRs}$ is thus measured for a positive reading pulse and the reading current $I_{NHRs}$ is measured for a negative reading pulse.

As shown in the reading process ("r" for "read") in table 2, in this case the complementary resistance state PHRS is read out for a temporal offset $|\Delta t| \geq t_p$ that is small in terms of absolute value, and the complementary resistance state PLRS is read out for a temporal offset $|\Delta t| \rightarrow \infty$ that is large in terms of absolute value. The state change between said two complementary resistance states follows the characteristic curve in the third quadrant of the Cartesian coordinate system (later referred to as the LTD learning curve). In a complementary reading process, the resistance states that are complementary to the reading process in each case are read out. In this case, the complementary resistance state NLRS is read out for a temporal offset $|\Delta t| \geq t_p$ that is small in terms of absolute value, and the complementary resistance state NHRS is read out for a temporal offset $|\Delta t| \rightarrow \infty$ that is large in terms of absolute value. The state change between said two complementary resistance states ($t_p \leq |\Delta t| < \infty$) follows the characteristic curve in the second quadrant of the Cartesian coordinate system (later referred to as the anti-LTP learning curve).

Furthermore, a negative initialisation pulse (initialisation) is applied to the electrode T1, while the electrode T2 remains at zero potential. In this case, the state pair (PHRS, NLRS) is written. This is followed by the writing process, during which a positive writing pulse sequence pair, for the positive temporal offset Δt >0, is applied to the memristive device. In this case, the first writing pulse sequence is applied to T1 and the second writing pulse sequence is applied to T2.

Subsequently, the complementary resistance states of the written state pair are read out by means of a reading pulse being applied to T1 while T2 remains at zero potential.

As shown in the reading process in table 2, in this case the complementary resistance state PLRS is read out for a temporal offset $|\Delta t| \geq t_p$ that is small in terms of absolute value, and the complementary resistance state PHRS is read out for a temporal offset $|\Delta t| \rightarrow \infty$ that is large in terms of absolute value. The state change between said two complementary resistance states follows the characteristic curve in the first quadrant of the Cartesian coordinate system (later referred to as the LTP learning curve). In a complementary reading process, the resistance states that are complementary to the reading process in each case are read out. In this case, the complementary resistance state NHRS is read out for a temporal offset $|\Delta t| \geq t_p$ that is small in terms of absolute value, and the complementary resistance state NLRS is read out for a temporal offset $|\Delta t| \rightarrow \infty$ that is large in terms of absolute value. The state change between said two complementary resistance states follows the characteristic curve in the fourth quadrant of the Cartesian coordinate system (later referred to as the anti-LTD learning curve).

TABLE 2

| Initialisation | | Writing process | Reading process r(1) | | | Complementary reading process r(0) | | |
|---|---|---|---|---|---|---|---|---|
| T1 | T2 | Δt | $\|\Delta t\| \geq t_p$ | $t_p \leq \|\Delta t\| < \infty$ | $\|\Delta t\| \rightarrow \infty$ | $\|\Delta t\| \geq t_p$ | $t_p \leq \|\Delta t\| < \infty$ | $\|\Delta t\| \rightarrow \infty$ |
| (PLRS, NHRS) | | <0 | PHRS = 0 | LTD | PLRS = 1 | NLRS = 1 | anti-LTP | NHRS = 0 |
| (PHRS, NLRS) | | >0 | PLRS = 1 | LTP | PHRS = 0 | NHRS = 0 | anti-LTD | NLRS = 1 |

Table 2 shows the definition of the pulses and the logical operations for complementary learning.

In this case, a positive initialisation pulse (initialisation) is applied to the electrode T1, while the electrode T2 remains at zero potential. The state pair (PLRS, NHRS) is written. This is followed by the writing process, during which a negative writing pulse sequence pair, for the negative temporal offset Δt<0, is applied to the memristive device. In this case, the first writing pulse sequence is applied to T2 and the second writing pulse sequence is applied to T1.

Subsequently, the complementary resistance states of the written state pair are read out by means of a reading pulse being applied to T1 while T2 remains at zero potential.

The memristive device can be interpreted and operated as an artificial synapse. In this case, terms associated with biological neurons and chemical synapses and the signal transmission thereof are transferred to the memristive device. Terms such as synaptic weight or learning curve have been set out at the outset and will not be explicitly explained again.

When the memristive device is used as an artificial synapse, the first and the second electrode each correspond to artificial neurons. The first electrode corresponds to an artificial presynaptic neuron, and the second electrode corresponds to an artificial postsynaptic neuron.

The writing pulse sequence applied to the presynaptic neuron corresponds to a presynaptic impulse, and the writing pulse sequence applied to the postsynaptic neuron corresponds to a postsynaptic impulse.

The writing pulse sequence pair that is applied between the presynaptic and postsynaptic neuron corresponds to a spike-timing dependent plasticity pair (STDP pair). A STDP pair comprises two writing pulse sequences, the two writing pulse sequences temporally overlapping one another at least in part. The temporal superimposition relates to the superimposition of the writing pulse, having the falling edge, of the first writing pulse sequence, which writing pulse follows the guide pulse, and the guide pulse of the second writing pulse sequence. The writing pulse, having the falling edge, of the first writing pulse sequence, which writing pulse follows the guide pulse, and the guide pulse of the second writing pulse sequence, preferably temporally overlap one another.

A negative STDP pair corresponds to a negative writing pulse sequence pair for a negative temporal offset $\Delta t<0$ and writes the state pair (PHRS, NLRS). A positive STDP pair corresponds to a positive writing pulse sequence pair for a positive temporal offset $\Delta t>0$ and writes the state pair (PLRS, NHRS). In a particular embodiment, the two writing pulse sequences of a STDP pair do not overlap, with the result that no state pair is written. The physical processes that have taken place at the flexible analogue complementary potential barriers have already been explained above.

Continuously specifying the transition of the complementary resistance states of the state pairs between the maximum and minimum markedness of the complementary end states in the range $t_p \leq |\Delta t| < \infty$ defines characteristic curves in a Cartesian coordinate system. When the memristive device is operating as an artificial synapse, said characteristic curves are interpreted and referred to as learning curves of the artificial synapse.

A state change having a continuous transition from the end state PHRS in the event of a large positive temporal offset ($\Delta t \rightarrow +\infty$), to the end state PLRS in the event of a small positive temporal offset ($\Delta t \geq +t_p$), is shown as the LTP learning curve in the first quadrant and is read out as the reading current $I_{LTP}$ (for $t_p \leq |\Delta t| < \infty$) in the event of a positive reading pulse.

A state change having a continuous transition from the end state NHRS in the event of a large negative temporal offset ($\Delta t \rightarrow -\infty$), to the end state NLRS in the event of a small negative temporal offset ($\Delta t \leq -t_p$), is shown as the anti-LTP learning curve in the second quadrant and is read out as the reading current $I_{aLTP}$ (for $t_p \leq |\Delta t| < \infty$) in the event of a negative reading pulse.

A state change having a continuous transition from the end state PLRS in the event of a large negative temporal offset ($\Delta t \rightarrow -\infty$), to the end state PHRS in the event of a small negative temporal offset ($\Delta t \geq -t_p$), is shown as the LTD learning curve in the third quadrant and is read out as the reading current $I_{LTD}$ (for $t_p \leq |\Delta t| < \infty$) in the event of a negative reading pulse.

A state change having a continuous transition from the end state NLRS in the event of a large positive temporal offset ($\Delta t \rightarrow +\infty$), to the end state NHRS in the event of a small positive temporal offset ($\Delta t \rightarrow +t_p$), is shown as the anti-LTD learning curve in the fourth quadrant and is read out as the reading current $I_{aLTD}$ (for $t_p \leq |\Delta t| < \infty$) in the event of a positive reading pulse.

The LTP and anti-LTD learning curves are a pair of mutually complementary learning curves. The anti-LTP and LTD learning curves are likewise a pair of mutually complementary learning curves.

The anti-LTP and anti-LTD learning curves are interpreted as anti-STDP behaviour and correspond to the complementary reading process (see table 2). If the LTP and LTD learning curves correspond to STDP behaviour, in an analogous manner the anti-LTP and anti-LTD learning curves thus correspond to anti-STDP behaviour.

In the case of a positive applied reading pulse polarity, the reading current $I_{LTP}$ is measured for $t_p \leq |\Delta t| < \infty$ in the event of a positive temporal offset $\Delta t > 0$, and the reading current $I_{LTP}$ is measured for $t_p \leq |\Delta t| < \infty$ in the event of a negative temporal offset $\Delta t<0$. In the case of a negative applied reading pulse polarity, the reading current $I_{aLTD}$ is measured for $t_p \leq |\Delta t| < \infty$ in the event of a positive temporal offset $\Delta t > 0$, and the reading current $I_{aLTP}$ is measured for $t_p \leq |\Delta t| < \infty$ in the event of a negative temporal offset $\Delta t<0$.

The depiction of the learning curves in a Cartesian coordinate system is also referred to as an STDP graph. In this case, the x-axis represents the temporal offset $\Delta t$ between the presynaptic and postsynaptic impulse of the writing pulse sequence pair, and the y-axis represents values of the normalised reading currents. The reading currents $I_{LTP}$, $I_{aLTP}$, $I_{LTD}$ and $I_{aLTD}$ for the associated LTP, anti-LTP, LTD and anti-LTD learning curves are normalised using the following formulae:

$$\Delta I_{LTP}(\%) = \frac{I_{LTP} - I_{PHRS}}{I_{LTP}} \cdot 100\%$$

$$\Delta I_{LTD}(\%) = \frac{I_{LTD} - I_{PLRS}}{I_{PLRS}} \cdot 100\%$$

$$\Delta I_{aLTP}(\%) = \frac{I_{aLTP} - I_{NHRS}}{I_{aLTP}} \cdot 100\%$$

$$\Delta I_{aLTD}(\%) = \frac{I_{aLTD} - I_{NLRS}}{I_{NLRS}} \cdot 100\%$$

The normalised reading currents $\Delta I_{LTP}$, $\Delta I_{aLTP}$, $\Delta I_{LTD}$ and $\Delta I_{aLTD}$ behave in a manner proportional to the conductivity of the artificial synapse between a presynaptic or postsynaptic neuron.

The conductivity of the artificial synapses, thus normalised, occupys binary values of 0 or 1 or values of between 0 and 1. The normalised conductivity of the artificial synapses occupys the binary value 0 for a minimum conductivity, or the binary value 1 for a maximum conductivity between the presynaptic and postsynaptic neuron.

In an alternative embodiment, the conductivity of the artificial synapses occupys the binary value 1 for a minimum conductivity, or the binary value 0 for a maximum conductivity between the presynaptic and postsynaptic neuron.

The normalised reading currents $\Delta I_{LTP}$, $\Delta I_{aLTP}$, $\Delta I_{LTD}$ and $\Delta I_{aLTD}$ (and thus the conductivity of the artificial synapse) are scaled with synaptic weights and are interpreted as such.

In this case, a large normalised reading current corresponds to a high synaptic weight, and a small normalised reading current corresponds to a low synaptic weight. In this case, the synaptic weight occupys binary values of 0 or 1 or values of between 0 and 1.

Complementary learning is implemented by means of complementary resistance states of one of the two state pairs being written. In this case, an initialisation pulse is applied to the presynaptic neuron or the postsynaptic neuron. Preferably, an initialisation pulse is applied to the presynaptic neuron. The writing process is subsequently carried out, an STDP pair (writing pulse sequence pair) being applied to the presynaptic neuron and to the postsynaptic neuron. The writing process comprises at least one STDP pair comprising a presynaptic impulse and a postsynaptic impulse. In this case, a state pair of complementary resistance states is specified when, owing to the temporal superimposition of the writing pulse, having the falling edge, of the presynaptic impulse, and the guide pulse of the postsynaptic impulse, the absolute value of the voltage of the superimposed pulses reaches or exceeds the absolute value of a minimum writing voltage for the minimum writing period that is dependent on the minimum writing voltage, and the absolute value of the temporal offset of the superimposed pulses determining the position of the written complementary resistance states of the state pair between the relevant complementary end states, and thus the position on the learning curves. The absolute value of the temporal offset $|\Delta t|$ of the STDP pair determines the position of the written complementary resistance state of the state pair on the learning curves.

The written complementary resistance states are read out in a reading process by means of two reading pulses, which are temporally mutually offset and are of opposing polarities, being applied to the presynaptic neuron or the postsynaptic neuron. The reading pulses are preferably applied to the presynaptic neuron. In this case, the postsynaptic neuron remains at zero potential.

In the case of a positive temporal offset $\Delta t>0$, the reading pulses read out the normalised reading currents $\Delta I_{LTP}$ and $\Delta I_{aLTD}$ for the STDP pair. The state pair is read out on the LTP and anti-LTD learning curves (for $t_p \leq |\Delta t| < \infty$), which curves contain mutually complementary information. In the case of a negative temporal offset $\Delta t<0$, the reading pulses read out the normalised reading currents $\Delta I_{aLTP}$ and $\Delta I_{aLTD}$ for the STDP pair. The state pair is read out on the anti-LTP and LTD learning curves (for $t_p \leq |\Delta t| < \infty$), which curves contain mutually complementary information.

For a value of the positive temporal offset $\Delta t>0$, two current output signals s are read out, which signals are located in the first and fourth quadrant, respectively, and thus on the LTP learning curve and the anti-LTD learning curve. For a value of the negative temporal offset $\Delta t<0$, two current output signals s are read out, which signals are located in the second and third quadrant, respectively, and thus on the anti-LTP and LTD learning curve.

For each value of the temporal offset $\Delta t$, there are thus two complementary resistance states of a state pair, which states contain mutually complementary information and are read out by means of two reading pulses of opposing polarities. In this case, the learning curves in the first and fourth quadrants, and the learning curves in the second and third quadrants, are mutually complementary learning curves.

The memristive device can replicate all four learning curves, as an artificial synapse. In this case, two learning curves are mutually complementary in each case.

The method for operating a memristive device and the control unit thereof is preferably implemented by a computer program product. The computer program product is preferably installed on an EDP system.

In a preferred embodiment, the computer program product is (commercially available) software (Labview) which is programmed to control and carry out the method for operating a memristive device. In this case, the software preferably controls the control unit for the microcontroller, the amperemeter and the voltage source (see FIG. 9), as well as the microcontroller, the two amperemeters, the two voltage sources and the four logic gates (see FIG. 10) by means of which the memristive device (in FIG. 9) or the memristive devices (in FIG. 10) are in turn operated.

The computer program product is preferably stored on a data processing system or on a data carrier.

The computer program product and the memristive device can advantageously be used in data analysis and for processing complementary information from image analysis or speech recognition.

In this case, mutually complementary items of information can be stored in a pair of learning curves. The mutually complementary items of information may be constituents such as black/white or light/dark or edge/surface or loud/quiet.

Furthermore, the computer program product and the memristive device may advantageously be used as constituents of neuronal networks, in particular for controlling movement sequences in robots, in the bank industry, or in the wind or solar power sectors.

Neuronal networks comprise planes which are capable of learning and comprise nodes. A plane of this kind that is capable of learning preferably comprises approximately 8 to 9 nodes which may function as nodes of variable weight. Said logic points can be occupied with corresponding logic functions, for example Boolean functions.

This advantageously makes it possible to predict values that are based on data determined in the past.

The computer program product and the memristive device may be used for applications in control systems of various types of sensor technology, for example in movement recognition. Furthermore, the computer program product and the memristive device are used in smoke detectors for example. Moreover, the computer program product and the memristive device can be used in temperature sensors (e.g. for measuring hot/cold).

In this case, the control of control systems is preferably taken on by neuronal networks that contain the technical operation of the memristive device and contain the computer program product. Input data of varying quality and/or different input variables are logically interconnected and weighted in order to arrive at a decision. In the case of the smoke detector, for example intermediate values may enter the logical connection and weighting as a probability statement for there being a fire, meaning that it is possible to decide whether or not a system needs to be shut down or whether or not an alarm needs to be triggered. Said analogue decision-making is thus advantageously simplified and made more comprehensible for the user.

The computer program product and the memristive device may advantageously be used for implementing learning rules for a student and teacher synapse.

In this case, a one-off initialisation pulse is applied to the first or second electrode. Subsequently, a writing pulse sequence pair having a temporal offset $\Delta t$ is applied to the first and second electrode of the memristive device, the writing pulse sequence pair being dependent on the process of learning or of forgetting, and the initialisation.

In this case, logic functions, preferably Boolean functions, for example OR, AND, NOR and NAND, can be used to implement different learning rules.

After one-off initialisation of the memristive device in (PHRS, NLRS) the temporal offset $\Delta t$ along the anti-LTP and LTP learning curves is shortened during a learning process.

After one-off initialisation of the memristive device in (PLRS, NHRS) the temporal offset Δt along the LTD and anti-LTD learning curves is lengthened during a forgetting process.

In this case, the temporal offset Δt between the presynaptic impulse and postsynaptic impulse of the student synapse is always changed, while the temporal offset Δt between the presynaptic impulse and the postsynaptic impulse of the teacher synapse always remains constant.

Logic functions are used in order to implement the four learning rules for a student having a variable synapse weight $g_s$, depending on the input variables for the student and for the teacher. The synapse weight $g_T$ of the teacher does not change during learning. A logic function is assigned to each learning rule, on the basis of which the input variables at the student p and at the teacher q are connected. The logical connection results in an output signal s which can occupy the value 0 or 1. The specification of the meaning of the output signal s using a learning process or a forgetting process is dependent on the logic function. When using AND for Associative Learning, p for Supervised $\bar{p}$ Learning, q for $\bar{q}$ Unsupervised Learning, and OR for Deep Learning, the output signal 0 means forgetting and the output signal 1 means learning. When using NAND for Associative Learning, for Supervised Learning, for Unsupervised Learning, and NOR for Deep Learning, the output signal 1 means forgetting and the output signal 0 means learning. The student's synapse is connected to a voltage source and an ammeter by means of an electrode $T\mathbf{1}_s$ (presynaptic neuron) and by means of an electrode T2 (postsynaptic neuron).

The teacher's synapse is connected to a voltage source and an ammeter by means of an electrode $T\mathbf{1}_T$ (presynaptic neuron) and by means of an electrode T2 (postsynaptic neuron).

The postsynaptic neuron T2 branches so as to contact the student's synapse and the teacher's synapse in parallel. It is possible to implement all four learning rules by means of sequential logical connection of a series of input variables at the student synapse p and a series of input variables at the teacher synapse q to a series of output signals s, correlating an output signal s with a process of learning or with a process of forgetting, and sequential changing of the synapse weight of the student $g_s$.

Prior to sequentially changing the synapse weight of the student $g_s$, the synapse weight of the student gs is specified by means of an initialisation pulse ($T\mathbf{1}_s$, T2) and the synapse weight $g_T$ of the teacher is specified by means of an initialisation pulse ($T\mathbf{1}_T$, T2). The two synapses preferably comprise the same state pair (PLRS, NHRS) or (PHRS, NLRS).

Subsequently, writing pulse sequence pairs are applied to the student's synapse ($T\mathbf{1}_S$, T2). For (PHRS, NLRS), the synapse weight of the student $g_S$ is read out at $T\mathbf{1}_S$ using a positive reading pulse. For (PHRS, NLRS), the unchanged synapse weight of the teacher $g_T$ is read out at $T\mathbf{1}_T$ using a negative reading pulse.

For (PLRS, NHRS), the synapse weight of the student $g_S$ is read out at $T\mathbf{1}_S$ using a negative reading pulse. For (PLRS, NHRS), the invariable synapse weight of the teacher $g_T$ is read out at $T\mathbf{1}_T$ using a negative reading pulse.

The writing pulse sequence pairs at the student's synapse ($T\mathbf{1}_s$, T2) comprise a $\Delta t_i$ at each sequence step, which $\Delta t_i$ is dependent on $\Delta t_{i-1}$ of the preceding writing pulse sequence pair. $\Delta t_i < \Delta t_{i-1}$ for a learning process in sequence step i. $\Delta t_i > \Delta t_{i-1}$ for a forgetting process in sequence step i.

Using the memristive device as an artificial synapse, and the computer program product, advantageously makes it possible to implement configurable fuzzy logic for all 16 two-valued Boolean functions.

Learning by means of artificial synapses is based on the rules of fuzzy logic, the valid truth table being implemented for each of the 16 two-valued Boolean functions by means of the two input variables p and q being defined as an impulse sequence for the presynaptic neuron and as an impulse sequence for the postsynaptic neuron.

Configurable fuzzy logic can advantageously be applied in data analysis, for example in DNA or spectroscopy databases. In principle, the concept can be applied everywhere that learnable and intelligent correspondence or analogue assignment among values, signals, patterns or (DNA) sequences has to take place.

The memristive device can be used for carrying out the method for technically operating a memristive device, as described in the prior art.

The memristive device used in the method according to the invention unites the operating principles of a complementary and an analogue resistive switch. It is therefore a complementary analogue resistive switch. The memristive device is characterised in that the complementary resistance states implemented therein are non-volatile. In electronic data processing, non-volatility is understood to mean that stored information is retained permanently, without a power source.

The method for operating the memristive device is implemented by a device that comprises a control unit.

The invention also relates to a control unit that actuates and reads out the memristive device in the manner required by the device. In this case, the number of hardware devices could be reduced to 12 in order to operate the memristive device as an artificial synapse.

The circuit for implementing the writing pulse sequences of a writing pulse sequence pair comprises an ATmega16 AVR microcontroller, an RC filter, an inverter and a mixer. A corresponding circuit, by means of which all four learning curves can be implemented, is shown in FIG. 9. A corresponding circuit, by means of which all four learning curves for the four learning rules Associative Learning, Supervised Learning, Unsupervised Learning and Deep Learning can be implemented, is shown in FIG. 10.

The microcontroller generates a guide pulse for the inverter. The guide pulse is preferably a rectangular pulse. The reference time for the entire circuit is the start time of the guide pulse of the second writing pulse sequence. The temporal offset Δt between the start of the guide pulse of the first writing pulse sequence and the start of the guide pulse of the second writing pulse sequence is specified by the microcontroller. The inverter comprises an operational amplifier (TL084) and four resistors. The inverter reverses the polarity of the guide pulse generated. After a pulse width $t_p$, a further output of the microcontroller emits a pulse to an RC filter, at which filter the falling edge of the writing pulse is generated, which edge depends on the value of the resistor and of the capacitor in the RC filter. The falling edge of the writing pulse is preferably an exponential drop having the exponential decay time $_\tau$.

The guide pulse and the writing pulse having the falling edge are combined by the mixer.

The initialisation pulse 1 and the initialisation pulse 2 are adjusted by means of a voltage source of the artificial synapse. Said voltage source is connected in series to an amperemeter and is also used for adjusting the reading pulse. The writing process comprising the writing pulses is generated in the microcontroller.

The device makes it possible to implement all four learning curves of an artificial synapse. Furthermore, the actuation described makes it possible to implement the learning rules of Associative Learning, Supervised Learning, Unsupervised Learning and Deep Learning.

Embodiment

A memristive device having the structure $Si/SiO_2/Pt/BFTO/BFO/BFTO/Au$ comprising a memristive BFTO/BFO/BFTO three-ply layer is operated. Titanium is deposited on the foreign substrate prior to the bottom electrode being applied, and subsequently thermally diffuses through the bottom electrode and into the BFO layer. Approximately 500 nm $SiO_2$ is deposited onto a silicon substrate. 50 nm titanium is deposited onto the $SiO_2$ layer. A platinum layer approximately 100 nm thick, which is at the same time the bottom electrode, adjoins said insulating layer. The layer thickness of the BFTO layers is in each case 100 nm, and that of the BFO layer is approximately 500 nm. The BFTO layer has a titanium concentration of 0.05 at. %. A plurality of 200 nm thick, annular Au top electrodes is subsequently applied to the upper BFTO layer. The surface area of the annular Au top electrodes is $4.5\times10^{-2}$ mm in each case.

DETAILED DESCRIPTION OF THE PREFERRED EMBODIMENTS

Figure 1:
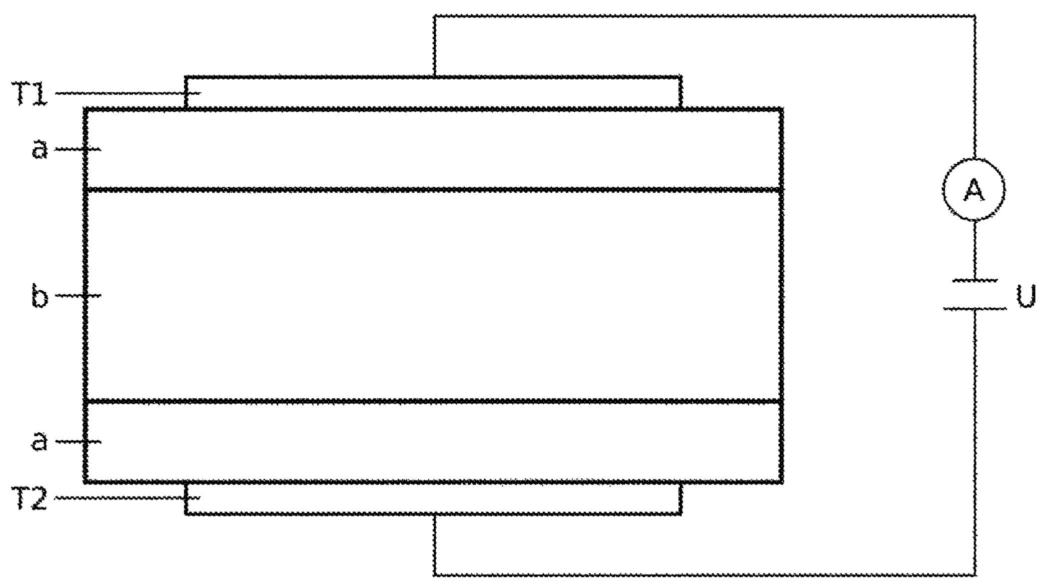
FIG. 1 is a schematic view, by way of example, of the memristive device comprising a memristive BFTO/BFO/BFTO three-ply layer that is arranged between two large-surface-area electrodes T1 and T2 and is connected to a voltage source U and an ammeter A.

FIG. 1 is a schematic view, by way of example, of the memristive device comprising a memristive BFTO/BFO/BFTO three-ply layer that is arranged between two large-surface-area electrodes T1 and T2 and is connected to a voltage source U and an ammeter A. The electrode T1 corresponds in this case to the top electrode, and the electrode T2 corresponds in this case to the bottom electrode.

Figure 2:
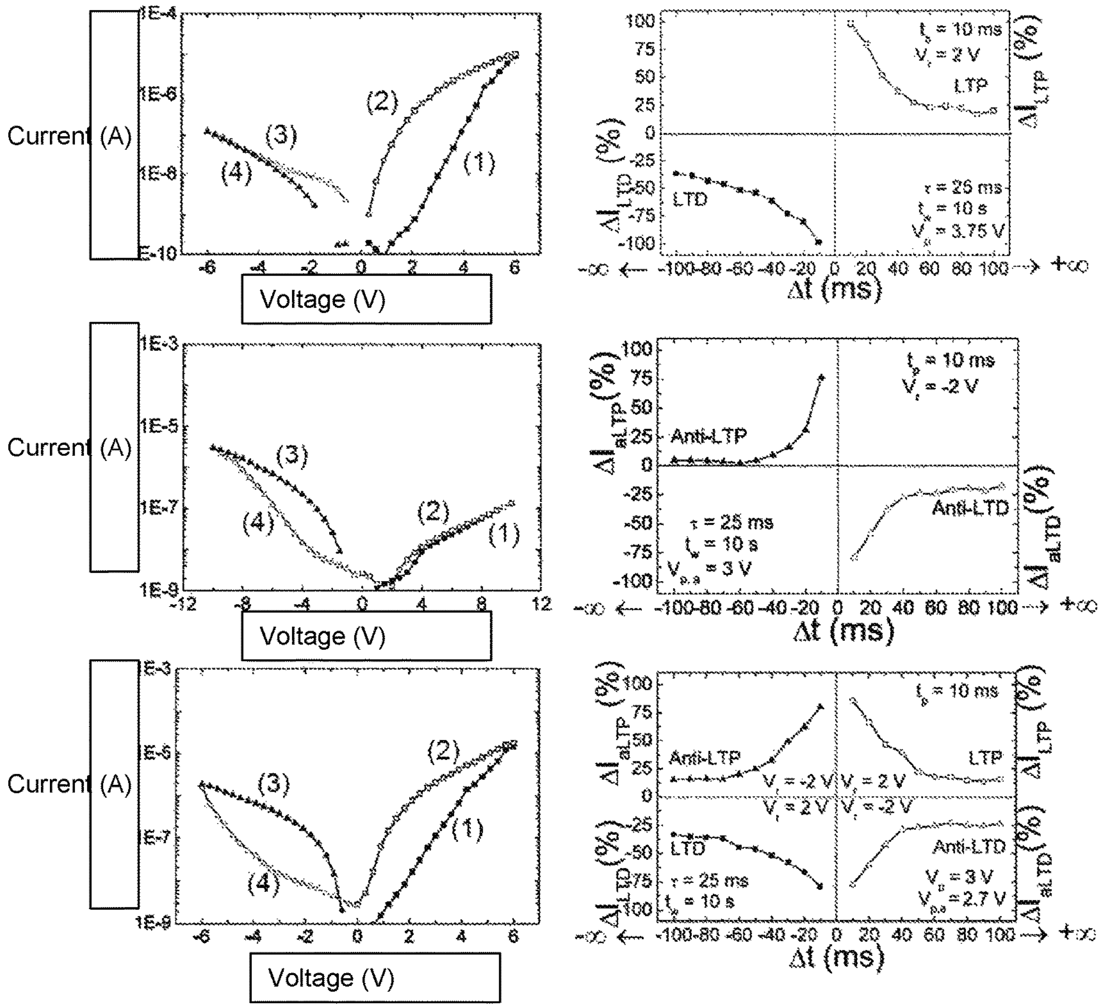
FIG. 2 shows current/voltage curves for the memristive device, which device is interpreted as an artificial synapse in this case.

The left-hand column of FIG. 2 shows current/voltage curves for the memristive device, which device is interpreted as an artificial synapse in this case. Steps (1) to (4) in each case show the measured current as the voltage, applied to the memristive device, passes through continuously. The right-hand column shows the read-out, normalised reading currents $\Delta I_{LTP}$, $\Delta I_{aLTP}$, $\Delta I_{LTD}$ and $\Delta I_{aLTD}$ after a writing process having a temporal offset $\Delta t$ has been applied once to the memristive device $Si/SiO_2/Pt/BFTO/BFO/BFTO/Au$. Normalised reading currents for $\Delta t$=−100, −90, −80, −70, −60, −50, −40, −30, −20, −10, 0, +10, +20, +30, +40, +50, +60, +70, +80, +90, +100 ms are recorded and read out by means of a positive reading voltage (LTP and LTD learning curve) and by means of a negative reading voltage (anti-LTP and anti-LTD learning curve).

The normalised reading currents are named according to the quadrants of the Cartesian coordinate system in which the corresponding learning curve is located. The following are read out and shown on the y-axis: the normalised reading currents $\Delta I_{LTP}$, for the LTP learning curve, the normalised reading currents $\Delta I_{aLTP}$, for the anti-LTP learning curve, the normalised reading currents $\Delta I_{LTD}$ for the LTD learning curve, and the normalised reading currents $\Delta I_{aLTD}$ for the anti-LTD learning curve.

The pulse width $t_p$ of the rectangular pulse is 10 ms. The exponential decay time $_T$ of the falling edge of the writing pulse spike following the rectangular pulse is 25 ms. The waiting time $t_w$ between two pulses is 10 s. The platinum bottom electrode is approximately 100 nm thick. The surface area of the 200 nm thick annular Au top electrode is $4.5\times10^{-2}$ $mm^2$ in each case.

Top Left:

Current/voltage curve for a flexibly adjustable potential barrier for the memristive double layer Pt/BFO/BFTO/Au of the memristive device comprising a 600 nm BFO thin film layer. The BFTO layer is adjusted by means of thermal diffusion of titanium ions into the BFO layer. The titanium ions originate from the platinum bottom electrode therebelow. The absolute value of the initialisation pulse $V_w$ is 6 V (+6 V for a following negative writing pulse sequence pair and −6 V for a following positive writing pulse sequence pair). The absolute value of the maximum voltage of the superimposed writing pulses $V_p$ is 7.5 V for implementing the LTP and LTD learning curves. The reading pulse $V_r$ is +2

V and is applied to one of the two electrodes. Hysteresis behaviour is manifest for positively applied voltages (step (1) and (2)).

Top Right:

For the memristive layer sequence Pt/BFO/BFTO/Au of a double layer of the memristive device, in the event of a positive reading pulse the normalised reading currents $\Delta I_{LTP}$ and $\Delta I_{LTD}$ are read out in the first and third quadrants of the STDP graph (LTP and LTD learning curve).

Middle Left:

Current/voltage curve for a flexibly adjustable potential barrier for the memristive double layer Pt/BFO/BFTO/Au of the memristive device comprising a 600 nm BFTO thin film layer. The BFTO layer is inserted during production of the layer structure. The absolute value of the initialisation pulse $V_w$ is 8 V (+8 V for a following negative writing pulse sequence pair and −8 V for a following positive writing pulse sequence pair). The absolute value of the maximum voltage of the superimposed writing pulses $V_{p,a}$ is 6 V for implementing the anti-LTP and anti-LTD learning curves. The reading pulse $V_r$ is −2 V and is applied to one of the two electrodes. Hysteresis behaviour is manifest for negatively applied voltages (step (3) and (4)).

Middle Right:

For the memristive layer sequence Pt/BFTO/BFO/Au of a double layer of the memristive device, in the event of a negative reading pulse the normalised reading currents $\Delta I_{aLTP}$ and $\Delta I_{aLTD}$ are read out in the second and fourth quadrants of the STDP graph (anti-LTP and anti-LTD learning curve).

Bottom Left:

Current/voltage curve for two flexibly analoguely complementarily adjustable potential barriers for the memristive layer sequence of a three-ply layer Pt/BFO/BFTO/Au of the memristive device comprising an overall 500 nm BFTO and 100 nm BFO thin film layer. The BFTO layer on the top electrode is achieved during production of the layer structure, and the BFTO layer on the bottom electrode is adjusted by means of thermal diffusion of titanium ions into the BFO layer, the titanium ions originating from the BFTO layer on the top electrode. The absolute value of the initialisation pulse $V_w$ is 6 V (+6 V for a following negative writing pulse sequence pair and −6 V for a following positive writing pulse sequence pair). The absolute values of the maximum voltage $V_p$ and $V_{p,a}$ of the superimposed writing pulses are 6 V for implementing the LTP and LTD learning curves and 5.4 V for implementing the anti-LTP and anti-LTD learning curves. The reading pulses $V_r$ are +2 V and −2 V and are applied in a temporally mutually offset manner to the same electrode of the two electrodes. Hysteresis behaviour is manifest for positively and negatively applied voltages (step (1), (2), (3) and (4)).

Bottom right: LTP, anti-LTP, LTD and anti-LTD learning curves in all four quadrants of an STDP graph, having the associated normalised reading currents $\Delta I_{LTP}$, $\Delta I_{aLTP}$, $\Delta I_{LTD}$ and $\Delta I_{aLTD}$, for the memristive layer sequence Pt/BFTO/BFO/BFTO/Au of a three-ply layer of the memristive device. In the case of a positive reading pulse the normalised reading current $\Delta I_{LTP}$ is read out in the first quadrant and the normalised reading current $\Delta I_{LTD}$ is read out in the third quadrant (LTP and LTD learning curve), and in the case of a negative reading pulse the normalised reading current $\Delta I_{aLTD}$ out in the second quadrant and the normalised reading current $\Delta I_{aLTD}$ out in the fourth quadrant (anti-LTP and anti-LTD learning curve). If a positive writing pulse sequence pair was applied, the reading process can read out the normalised reading current $\Delta I_{LTP}$ in the first quadrant and the normalised reading current $\Delta I_{aLTD}$ in the fourth quadrant, which reading currents are mutually complementary. The mutually complementary LTP and anti-LTD learning curves form accordingly. If a negative writing pulse sequence pair was applied, the reading process can read out the normalised reading current $\Delta I_{aLTP}$ in the second quadrant and the normalised reading current $\Delta I_{LTD}$ in the third quadrant, which reading currents are mutually complementary. The mutually complementary anti-LTP and LTD learning curves form accordingly. Implementation of fuzzy logic and complementary learning is possible only by means of the memristive three-ply layer comprising two flexibly analoguely complementarily adjustable potential barriers.

Figure 3:
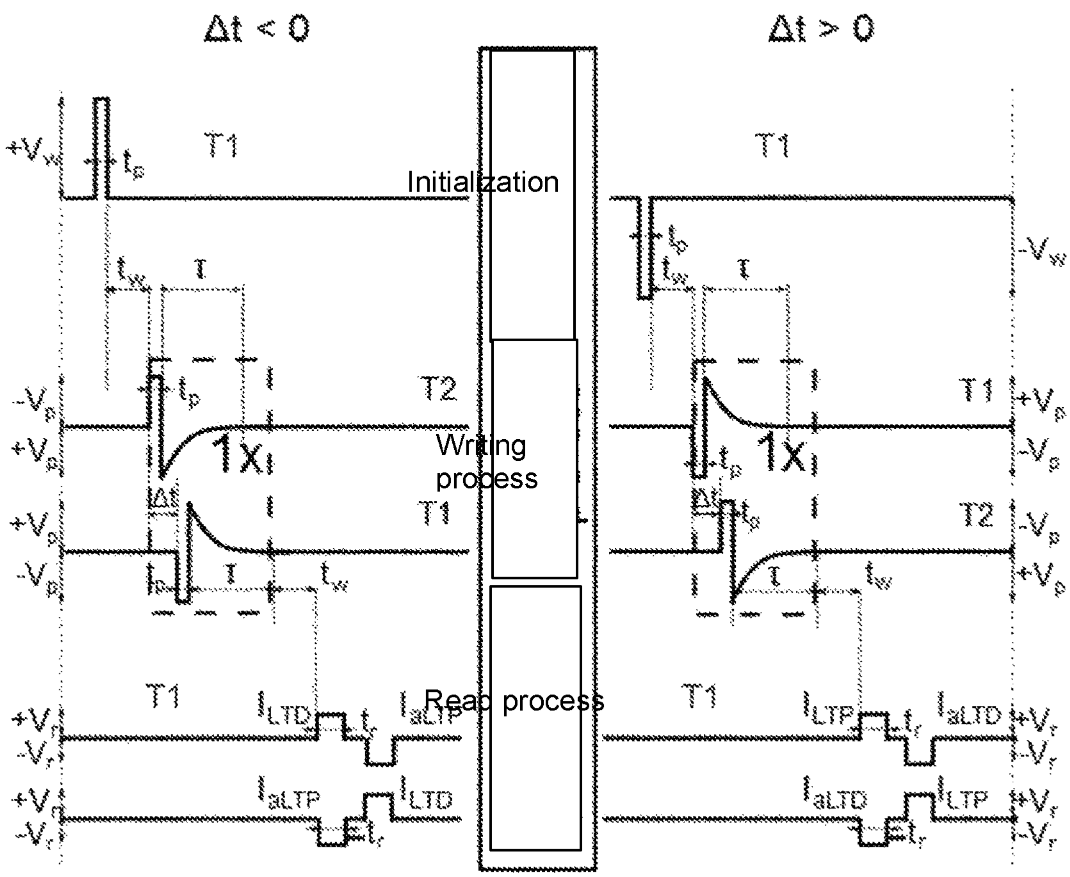
FIG. 3 shows a diagram of a pulse sequence, comprising an initialisation, a writing process and a reading process for the memristive device comprising a memristive BFTO/BFO/BFTO three-ply layer, which device is interpreted in this case as an artificial synapse.

FIG. 3 shows a diagram of a pulse sequence, comprising an initialisation, a writing process and a reading process for the memristive device comprising a memristive BFTO/BFO/BFTO three-ply layer, which device is interpreted in this case as an artificial synapse. In this case, initialisation and reading pulses are always applied to one electrode (the other electrode remains at zero potential). The writing pulse sequences of the writing pulse pair are applied in each case to T1 and T2 or T2 and T1. When the writing pulse sequences are superimposed, a voltage difference results between the electrodes T1 and T2, which difference corresponds to the difference between the two applied voltages.

The left-hand side of the diagram shows the pulse sequence diagram for a negative temporal offset (Δt<0). A positive initialisation pulse of voltage $+V_w$ at T1 is followed, after a waiting time $t_w$, by the application of a one-off negative writing pulse sequence pair. The negative writing pulse sequence pair consists of two writing pulse sequences, the first writing pulse sequence being applied to T2 and the second writing pulse sequence being applied to T1. The first writing pulse sequence consists of a negative rectangular pulse ($-V_p$) and a following positive writing pulse spike ($+V_p$) having an exponentially falling edge having the exponential decay time $_T$, and is applied to T2. The second writing pulse sequence consists of a negative rectangular pulse ($-V_p$) having a following positive writing pulse spike ($+V_p$) having an exponentially falling edge having the exponential decay time $_T$, and is applied to T1. First and second writing pulse sequences are superimposed with one another. In the range of the temporal offset Δt for which state pairs of complementary resistance states are specified, this results in superimposition of the writing pulse of the first writing pulse sequence having the exponential drop, and the rectangular pulse of the second writing pulse sequence, the absolute value of the voltage of the superimposed pulses reaching or exceeding the absolute value of a minimum writing voltage for the minimum writing period. After the state pair has been specified and after a waiting time $t_w$, two reading pulses of opposing polarities are applied to T1, either the first reading pulse being positive ($+V_r$) and the reading current $I_{LTD}$ being measured, and the second reading pulse being negative ($-V_r$) and the reading current $I_{aLTP}$ being measured, or the first reading pulse being negative ($-V_r$) and the reading current $I_{aLTP}$ being measured, and the second reading pulse being positive ($+V_r$) and the reading current $I_{LTD}$ being measured. For the negative temporal offset (Δt<0), state pairs and learning curves are specified and read out in the second and third quadrants, the anti-LTP learning curve being specified and read out in the second quadrant and the LTD learning curve being specified and read out in the third quadrant.

The right-hand side of the diagram shows the pulse sequence diagram for a positive temporal offset (Δt>0). A positive initialisation pulse of voltage $-V_w$ at T1 is followed, after a waiting time $t_w$, by the application of a one-off positive writing pulse sequence pair. The positive writing pulse pair consists of two writing pulse sequences that are in each case applied to T1 and T2. The first writing pulse sequence consists of a negative rectangular pulse ($-V_p$) and a following positive writing pulse spike ($+V_p$) having an exponentially falling edge having the exponential decay time $_T$, and is applied to T1. The second writing pulse sequence consists of a negative rectangular pulse ($-V_p$) having a following positive writing pulse spike ($+V_p$) having an exponentially falling edge having the exponential decay time $_T$, and is applied to T2. First and second writing pulse sequences are superimposed with one another. In the range of the temporal offset Δt for which state pairs of complementary resistance states are specified, the writing pulse of the first writing pulse sequence having the exponential drop, and the rectangular pulse of the second writing pulse sequence are superimposed, the absolute value of the voltage of the superimposed pulses reaching or exceeding the absolute value of a minimum writing voltage for the minimum writing period. After the state pair has been specified and after a waiting time $t_w$, two reading pulses of opposing polarities are applied to T1, either the first reading pulse being positive ($+V_r$) and the reading current $I_{LTP}$ being measured, and the second reading pulse being negative ($-V_r$) and the reading current $I_{aLTD}$ being measured, or the first reading pulse being negative ($-V_r$) and the reading current $I_{aLTD}$ being measured, and the second reading pulse being positive ($+V_r$) and the reading current $I_{LTP}$ being measured. For the positive temporal offset (Δt>0), state pairs and learning curves are specified and read out in the first and fourth quadrants, the LTP learning curve being specified and read out in the first quadrant and the anti-LTD learning curve being specified and read out in the fourth quadrant.

Figure 4:
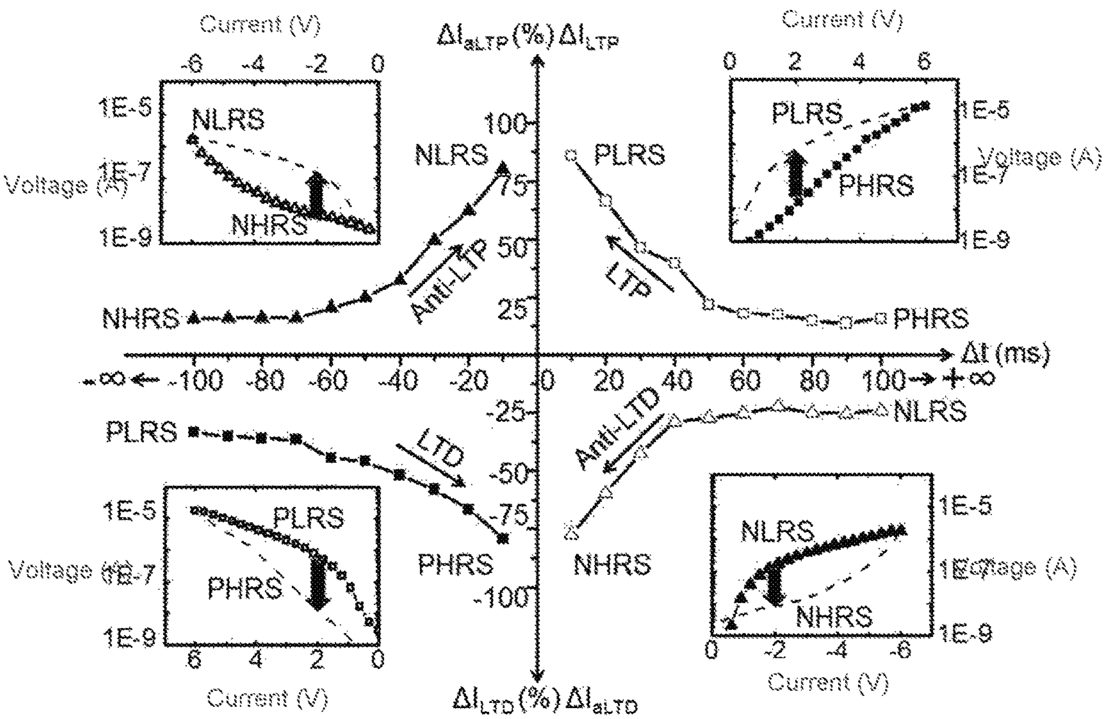
FIG. 4 shows an STDP diagram after one application of a writing process to the $Si/SiO_2/Pt/BFTO/BFO/BFTO/Au$ memristive device having an overall 500 nm BFTO and 100 nm BFO thin film layer, together with, at the bottom, the associated hysteresis curve portions from the current/voltage curves of FIG. 1.

FIG. 4 shows an STDP diagram after one application of a writing process to the $Si/SiO_2/Pt/BFTO/BFO/BFTO/Au$ memristive device having an overall 500 nm BFTO and 100 nm BFO thin film layer, together with, at the bottom, the associated hysteresis curve portions from the current/voltage curves of FIG. 1. The memristive device is interpreted as an artificial synapse in this case.

The pulse width of the rectangular pulse is 10 ms. The exponential decay time of the falling edge $_T$ of the writing pulse spike following the rectangular pulse is 25 ms. The waiting time $t_w$ between two pulses is 10 s. The surface area of the 200 nm thick Au top electrodes is $4.5\times10^{-2}$ $mm^2$ in each case.

The absolute value of the initialisation pulse $V_w$ is 7 V (+7 V for a following negative writing pulse sequence pair and −7 V for a following positive writing pulse sequence pair). The absolute values of the maximum voltage $V_p$ and $V_{p,a}$ of the superimposed writing pulses are in each case 5.4 V for implementing the STDP and anti-STDP learning curves. The reading pulses $V_r$ are +2 V and −2 V and are applied in a temporally mutually offset manner to the same electrode of the two electrodes.

The STDP graph shows LTP, anti-LTP, LTD and anti-LTD learning curves in all four quadrants, together with the associated normalised reading currents $\Delta I_{LTP}$, $\Delta I_{aLTP}$, $\Delta I_{LTD}$ and $\Delta I_{aLTD}$. In the case of a positive reading pulse the normalised reading current $\Delta I_{LTP}$ is read out in the first quadrant and the normalised reading current $\Delta I_{LTD}$ is read out in the third quadrant (LTP and LTD learning curve), and in the case of a negative reading pulse the normalised reading current $\Delta I_{aLTP}$ is read out in the second quadrant and the normalised reading current $\Delta I_{aLTD}$ is read out in the fourth quadrant (anti-LTP and anti-LTD learning curve). If a positive writing pulse sequence pair was applied, the reading process can read out the normalised reading current $\Delta I_{LTP}$ in the first quadrant and the normalised reading current $\Delta I_{aLTD}$ in the fourth quadrant, which reading currents are mutually complementary. The mutually complementary LTP and anti-LTD learning curves form accordingly. If a negative writing pulse sequence pair was applied, the reading process can read out the normalised reading current $\Delta I_{aLTP}$ in the second quadrant and the normalised reading current $\Delta I_{LTD}$ in the third quadrant, which reading currents are mutually complementary. The mutually complementary anti-LTP and LTD learning curves form accordingly.

Furthermore, the mutually complementary resistance states of minimum and maximum markedness are shown in the STDP diagram, which resistance states correspond to the complementary end states. Minimum markedness corresponds to the complementary end states following initialisation or following a writing process having a temporal offset Δt without superimposition of the rectangular pulse. Maximum markedness is achieved when the writing pulse spike, having the exponential drop, of the first writing pulse sequence, and the rectangular pulse of the second writing pulse sequence begin simultaneously.

The complementary resistance states of minimum markedness for a negative writing pulse sequence pair are specified in the state pair (NHRS, PLRS). The complementary resistance states of minimum markedness for a positive writing pulse sequence pair are specified in the state pair (PHRS, NLRS). The complementary resistance states of maximum markedness for a negative writing pulse sequence pair are specified in the state pair (NLRS, PHRS). The complementary resistance states of maximum markedness for a positive writing pulse sequence pair are specified in the state pair (PLRS, NHRS). The arrows indicate the directions of the state changes, in the range $t_p \leq |\Delta t| < \infty$, along the learning curves.

The complementary resistance states of the memristive device change continuously according to the time lag between the two writing pulse sequences. For the LTP learning curve, the complementary resistance state changes from PHRS to PLRS, for the anti-LTP learning curve the complementary resistance state changes from NHRS to NLRS, for the LTD learning curve the complementary resistance state changes from PLRS to PHRS, for the anti-LTD learning curve the complementary resistance state changes from NLRS to NHRS. This is also shown by the arrows in the hysteresis curve portions.

Figure 5:
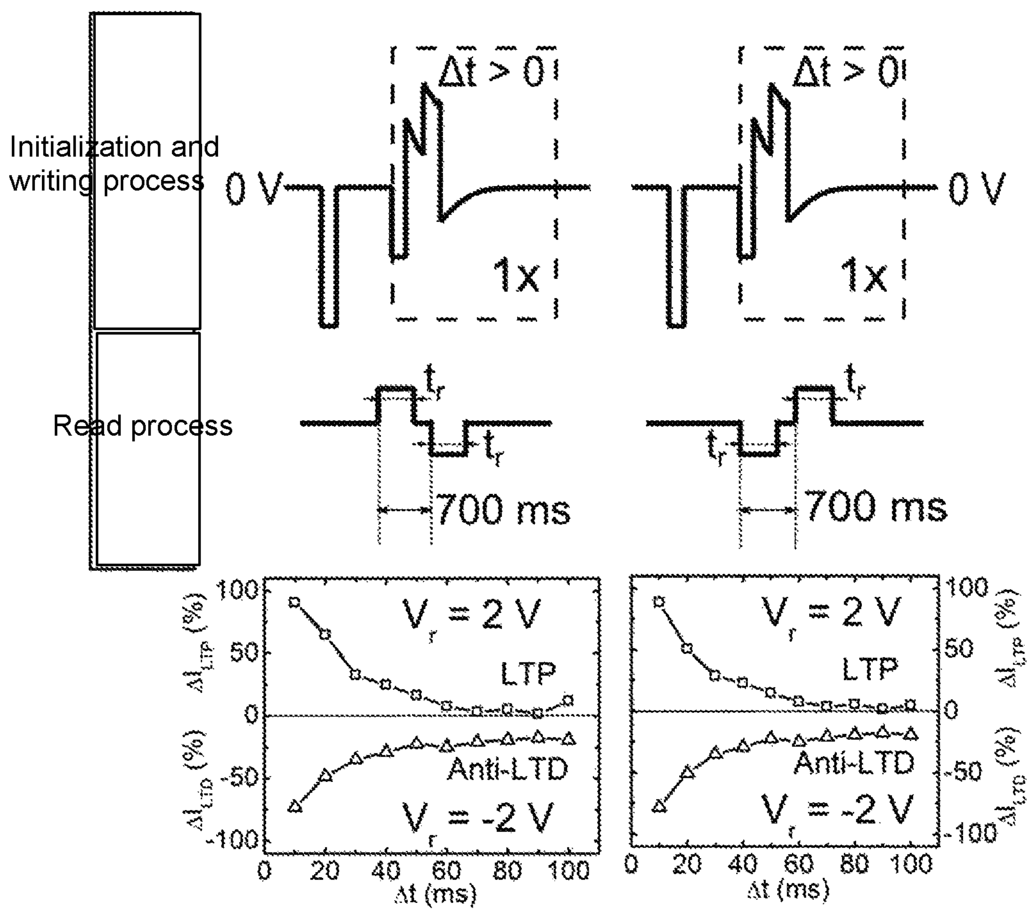
FIG. 5 shows, by way of example, a pulse sequence diagram for a memristive device, interpreted as an artificial synapse in this case, comprising a memristive BFTO/BFO/BFTO three-ply layer for a negative initialisation pulse in each case at T1 and a following writing process that is applied once and in each case comprises a positive writing pulse sequence pair at a positive temporal offset $\Delta t>0$ (the superimposition of the two writing pulse sequences is shown above). $V_w=|6\ V|$, $V_p=6$ V, $V_{p,a}=5.4$ V, $t_p=10$ ms, $_T=10$ ms, $t_w=2$ s.

FIG. 5 shows, by way of example, a pulse sequence diagram for a memristive device, interpreted as an artificial synapse in this case, comprising a memristive BFTO/BFO/BFTO three-ply layer for a negative initialisation pulse in each case at T1 and a following writing process that is applied once and in each case comprises a positive writing pulse sequence pair at a positive temporal offset Δt>0 (the superimposition of the two writing pulse sequences is shown above). $V_w=|6\ V|$, $V_p=6$ V, $V_{p,a}=5.4$ V, $t_p=10$ ms, $_T=10$ ms, $t_w=2$ s.

The order of the applied reading pulse polarities in the reading process is different. Thus, during the reading process in the left-hand column, a positive reading pulse ($V_r=+2$ V) having a pulse width $t_r$ of 10 ms is applied to T1 and subsequently a negative reading process ($V_r=-2$ V) having a pulse width $t_r$ of 10 ms is applied to T1. During the reading process in the right-hand column, a negative reading pulse ($V_r=-2$ V) having a pulse width $t_r$ of 10 ms is applied to T1 and subsequently a positive reading process ($V_r=+2$ V) having a pulse width $t_r$ of 10 ms is applied to T1. In both cases, the same state pairs are read out on the complementary learning curves, which state pairs are almost identical. The LTP and anti-LTD learning curves in the first and fourth quadrants of the STDP graph are shown (since there is a positive temporal offset $\Delta t>0$ during the writing process).

Reading out the state pairs thus occurs independently of the order of the applied reading pulse polarities (see details of the first and fourth quadrants of the STDP graph having the normalised reading currents $\Delta I_{LTD}$ and $\Delta I_{LTD}$, below). It can be seen from the characteristic curves that it does not matter whether first a positive and then a negative, or first a negative and then a positive reading pulse is applied to T1.

Figure 6:
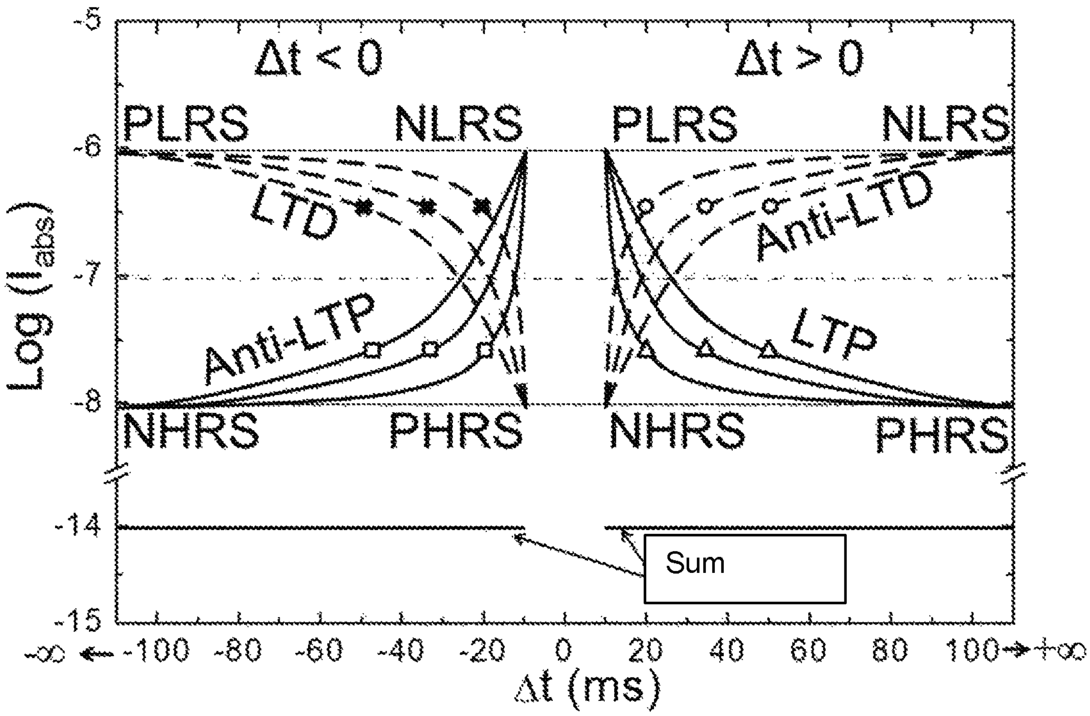
FIG. 6 shows the logarithmic absolute values of the unnormalised reading currents $I_{LTP}$, $I_{aLTP}$, $I_{LTD}$ and $I_{aLTD}$, which are plotted against the temporal offset $\Delta t$ of the memristive BFTO/BFO/BFTO three-ply layer, interpreted in this case as an artificial synapse.

FIG. 6 shows the logarithmic absolute values of the unnormalised reading currents $I_{LTP}$, $I_{aLTP}$, $I_{LTD}$ and $I_{aLTD}$, which are plotted against the temporal offset $\Delta t$ of the memristive BFTO/BFO/BFTO three-ply layer, interpreted in this case as an artificial synapse. The states of the LTP and LTD learning curves are read out at $V_r$=+2 V in each case. In this case, in the event of a negative temporal offset $\Delta t<0$, the state is specified on the LTD curve from PLRS to PHRS, and in the event of a positive temporal offset $\Delta t>0$, the state is specified on the LTP learning curve from PHRS to PLRS. The states of the anti-LTP and anti-LTD learning curves are read out at $V_r$=−2 V in each case. In this case, in the event of a negative temporal offset $\Delta t<0$, the state is specified on the anti-LTP curve from NHRS to NLRS, and in the event of a positive temporal offset $\Delta t>0$, the state is specified on the anti-LTD learning curve from NLRS to NHRS. The order of the applied reading pulses of different polarities does not have any influence on the resulting learning curves (cf. FIG. 5). This is apparent because the sum of the absolute current values at the relevant sign of the temporal offset $\Delta t$ are the same. For a negative temporal offset $\Delta t<0$, addition of the absolute logarithmic current output signals on the mutually complementary LTD and anti-LTP learning curves results in the same constant value in each case. For a positive temporal offset $\Delta t>0$, addition of the absolute logarithmic current output signals on the mutually complementary LTP and anti-LTD learning curves results in the same constant value in each case.

Figure 7:
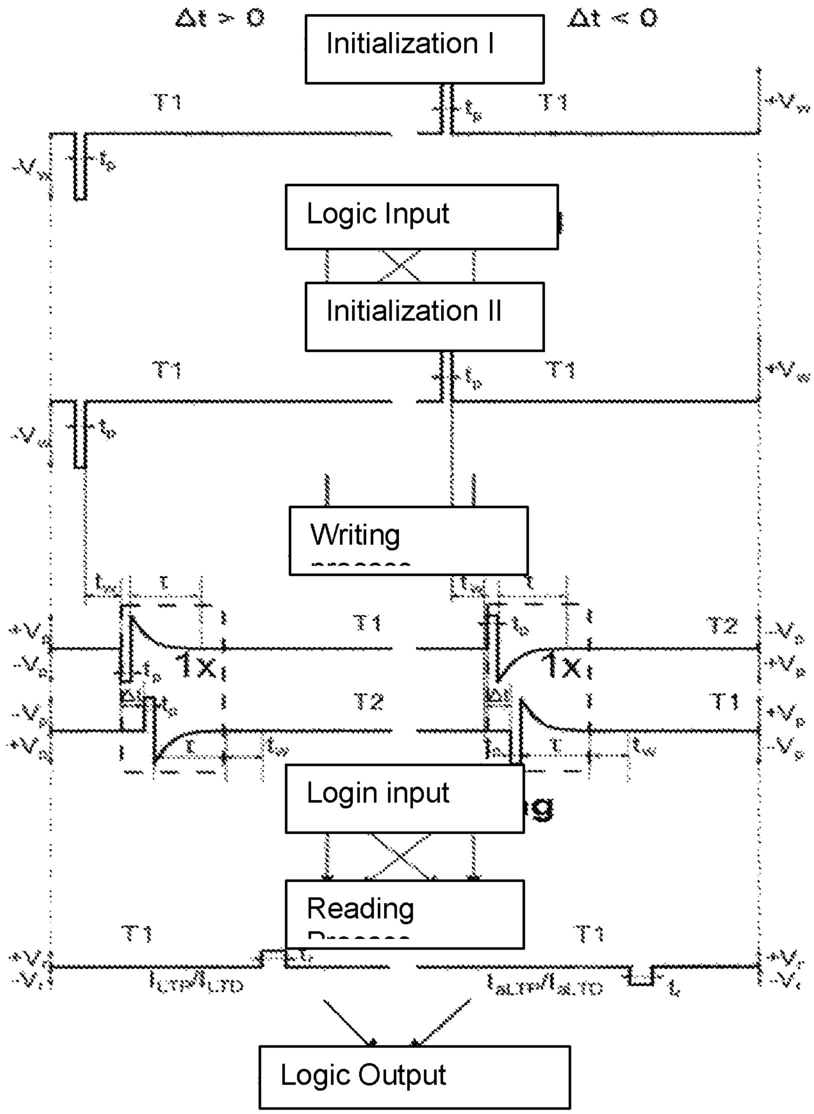
FIG. 7 shows a pulse sequence diagram for switching the memristive device in order to implement fuzzy logic, comprising two initialisations (initialisation I and initialisation II), a writing process and a reading process for the memristive device comprising a memristive BFTO/BFO/BFTO three-ply layer.

FIG. 7 shows a pulse sequence diagram for switching the memristive device in order to implement fuzzy logic, comprising two initialisations (initialisation I and initialisation II), a writing process and a reading process for the memristive device comprising a memristive BFTO/BFO/BFTO three-ply layer. In this case, initialisation and reading pulses are always applied to one electrode (the other electrode remains at zero potential). The writing pulse sequences of the writing pulse pair are applied in each case to T1 and T2 or T2 and T1.

The two logical input variables p and q are referred to as logic inputs. In this case, both the second initialisation (initialisation II) and the reading process are dependent on the logical input variables p and/or q.

The left-hand side of the diagram shows the pulse sequence diagram for a positive temporal offset $\Delta t>0$. A negative initialisation pulse of voltage $-V_w$ at T1 is followed, after a waiting time $t_w$, by the application of a one-off positive writing pulse sequence pair. The right-hand side of the diagram shows the pulse sequence diagram for a negative temporal offset $\Delta t<0$.

A positive initialisation pulse of voltage $+V_w$ at T1 is followed, after a waiting time $t_w$, by the application of a one-off negative writing pulse sequence pair.

The writing process is executed analogously to the execution already mentioned in FIG. 3.

After the state pair has been specified and following a waiting time $t_w$, a reading pulse of opposing polarity is applied to T1. The current output signal s is referred to as the logic output. This corresponds to the valid truth table of the 16 two-valued Boolean functions.

For a positive temporal offset $\Delta t>0$, the reading pulse is positive ($+V_r$) and the reading current $I_{LTP}$ or $I_{LTD}$ is measured. For a negative temporal offset $\Delta t<0$, the reading pulse is negative ($-V_r$) and the reading current $I_{aLTP}$ or $I_{aLTD}$ is measured.

Figure 8:
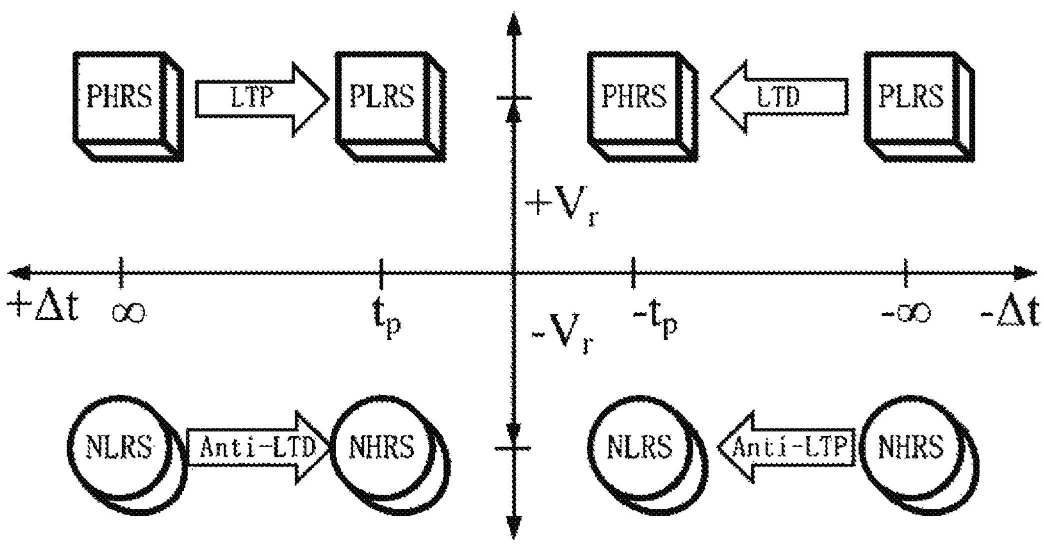
FIG. 8 shows the change (in the range $t_p\leq|\Delta t|<\infty$) of the complementary resistance states of the memristive device, which device consists of a memristive BFTO/BFO/BFTO three-ply layer and is interpreted in this case as an artificial synapse.

FIG. 8 shows the change (in the range $t_p \le |\Delta t| < \infty$) of the complementary resistance states of the memristive device, which device consists of a memristive BFTO/BFO/BFTO three-ply layer and is interpreted in this case as an artificial synapse. Depending on the temporal offset $\Delta t$, in the event of a positive temporal offset $\Delta t>0$, the complementary resistance state of the memristive device changes from PHRS ($\Delta t \rightarrow +\infty$) to PLRS ($\Delta t \ge +t_p$) for the LTP learning curve, and changes from NLRS ($\Delta t \rightarrow +\infty$) to NHRS ($\Delta t \ge +t_p$) for the anti-LTD learning curve. In the event of a negative temporal offset $\Delta t<0$, the complementary resistance state of the memristive device changes from PLRS ($\Delta t \rightarrow -\cong$) to PHRS ($\Delta t \le -t_p$) for the LTD learning curve, and changes from NHRS ($\Delta t \rightarrow -\infty$) to NLRS ($\Delta t \le -t_p$) for the anti-LIP learning curve. For the same time lag, two mutually complementary states can be read out in each case, using temporally offset reading voltages of opposing polarities.

Figure 9:
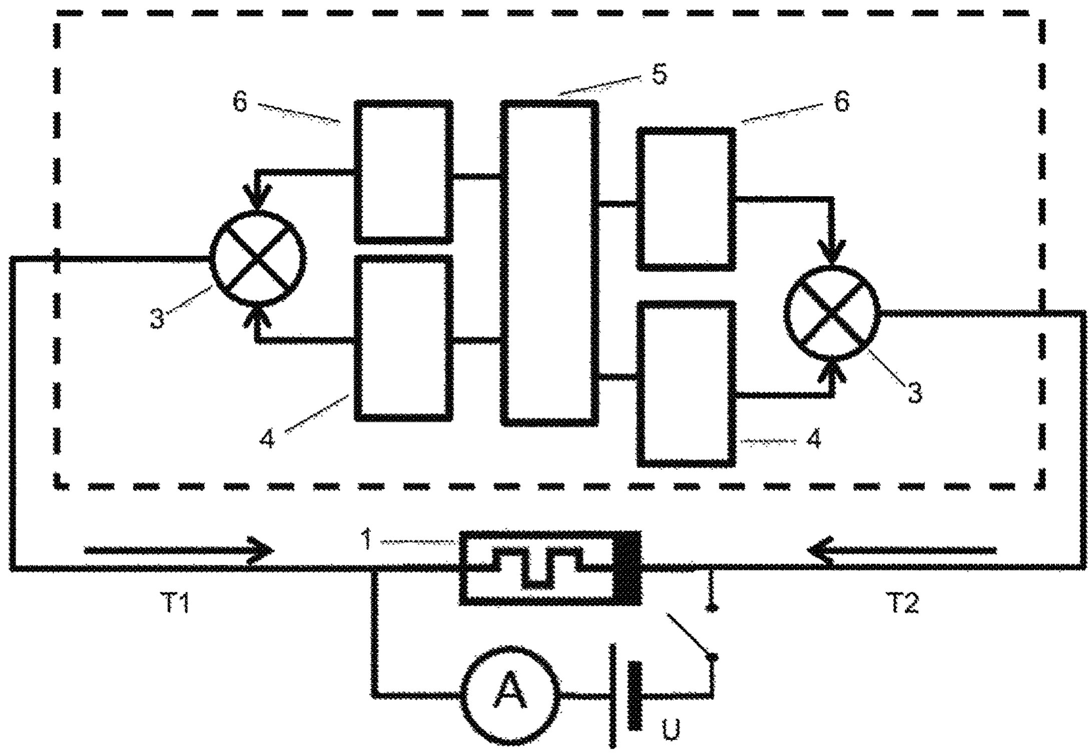
FIG. 9 shows a control unit for a memristive device, consisting of a circuit that comprises an AVR microcontroller, an RC filter, an inverter and a mixer.

FIG. 9 shows a control unit for a memristive device, consisting of a circuit that comprises an AVR microcontroller, an RC filter, an inverter and a mixer. The memristive device is interpreted in the following as an artificial synapse, specifically as a student synapse. The student synapse is connected to the control unit. The control unit generates write voltage pulse pairs having a pulse width of the rectangular pulse of $t_p$=100 ms and an exponential decay time of $_T$=1000 ms. The writing pulse sequences of the writing pulse sequence pair (STDP pair, comprising a presynaptic pulse and a postsynaptic pulse) of the student synapse are temporally superimposed with one another, the temporal offset $\Delta t$ between the start of the rectangular pulse of the first writing pulse sequence (presynaptic pulse) and the start of the rectangular pulse of the second writing pulse sequence (postsynaptic pulse) being determined by the microcontroller and being in the range, in terms of absolute value, of from 0 to 800 ms. In this case, the presynaptic pulse is applied to the presynaptic neuron T1, and the postsynaptic pulse is applied to the postsynaptic neuron T2. The rectangular pulse and the following writing pulse having the exponential drop are combined by the mixer. The absolute value of the maximum voltage of the superimposed writing pulses $V_p$ is 7 V. The initialisation pulses and the reading pulses are generated by means of a separate voltage source. The reading currents $I_{LTP}$ and $I_{LTD}$ are read out using the amperemeter. The absolute value of the initialisation pulse is 8 V (+8 V for a following negative writing pulse sequence pair and −8 V for a following positive writing pulse sequence pair), and the normalised reading currents $\Delta I_{LTP}$ and $\Delta I_{LTD}$ are read out at a reading voltage of +2 V.

All four learning curves can be implemented using a device of this kind.

Figure 10:
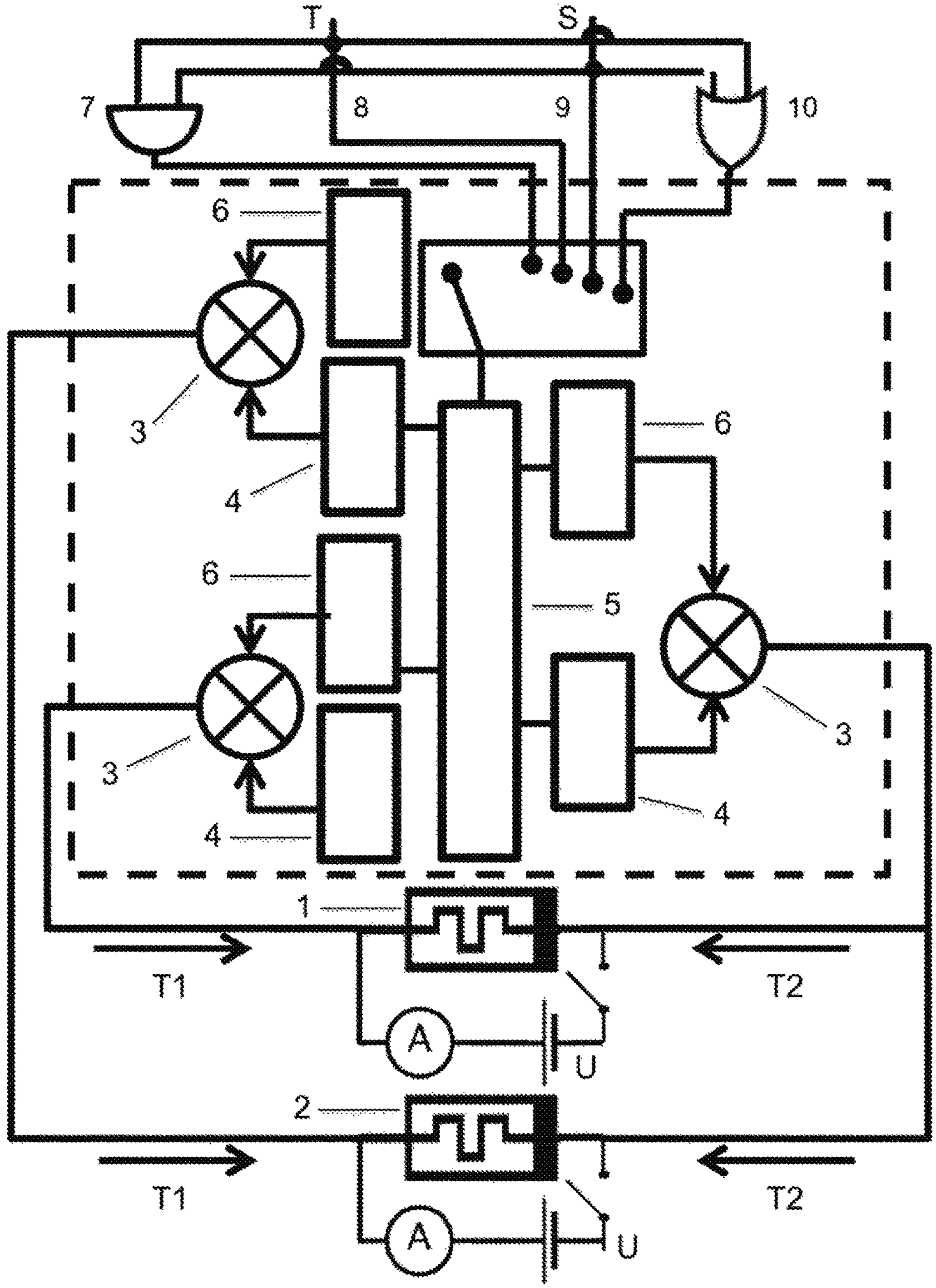
FIG. 10 shows a control unit for two memristive devices, consisting of a circuit that comprises an AVR microcontroller, an RC filter, an inverter, a mixer and four logic gates.

FIG. 10 shows a control unit for two memristive devices, consisting of a circuit that comprises an AVR microcontroller, an RC filter, an inverter, a mixer and four logic gates. The memristive devices are interpreted in the following as artificial synapses, specifically as a student synapse and a teacher synapse. The student synapse and the teacher synapse are connected to the control unit. The control unit generates write voltage pulse pairs having a pulse width of the rectangular pulse of $t_p$=100 ms and an exponential decay time of $_T$=1000 ms. The writing pulse sequences (presynaptic and postsynaptic pulse) of the writing pulse sequence pair (STDP pair, comprising a presynaptic pulse and a postsynaptic pulse) of the student synapse and of the teacher synapse are temporally superimposed with one another. In this case, the temporal offset Δt between the start of the rectangular pulse of the first writing pulse sequence (presynaptic pulse) and the start of the rectangular pulse of the second writing pulse sequence (postsynaptic pulse) of the student synapse is determined by the microcontroller and is in the range, in terms of absolute value, of from 0 to 800 ms. In this case, the presynaptic pulse is applied to the presynaptic neuron T1, and the postsynaptic pulse is applied to the postsynaptic neuron T2. The rectangular pulse and the following writing pulse having the exponential drop are in each case combined by the mixer. The temporal offset Δt of the student synapse is dependent on the combination of the input signal T at the teacher synapse and the input signal S at the student synapse. The temporal offset Δt of the teacher synapse remains unchanged. The absolute value of the maximum voltage of the superimposed writing pulses $V_p$ is 7 V. The initialisation pulses and the reading pulses are generated by means of a separate voltage source, at the student synapse and at the teacher synapse. The reading currents $I_{LTP}$ and $I_{LTD}$ are read out, by means of one amperemeter in each case, at the student synapse and at the teacher synapse, The absolute value of the initialisation pulse is 8 V (+8 V for a following negative writing pulse sequence pair and −8 V for a following positive writing pulse sequence pair), and the normalised reading currents $\Delta I_{LTP}$ and $\Delta I_{LTD}$ are read out at a reading voltage of +2 V.

All four learning rules can be implemented on all four learning curves using a device of this kind. The four implemented learning rules are Associative Learning, Supervised Learning, Unsupervised Learning and Deep Learning.

NON-PATENT LITERATURE CITED

You, T., Shuai, Y., Luo, W., Du, N., Bürger, D., Skorupa, I., Hübner, R., Henker, S., Mayr, C., Schüffny, R., Mikolajick T., Schmidt O. G., Schmidt H., Exploiting Memristive $BiFeO_3$ Bilayer Structures for Compact Sequential Logics, Adv. Funct. Mater., 24, 2014, 3357-3365

Du, N., Kiani, M., Mayr, C. G., You, T., Bürger, D., Skorupa, I., Schmidt, O. G., Schmidt, H., Single pairing spike-timing dependent plasticity in $BiFeO_3$ memristors with a time window of 25 ms to 125 μs, Front. Neurosc., 9, 2015, 227, doi:10.3389/fnins.2015.00227

Schmidt, H., Mikolajick, T., Waser, R., Linn, E., Big Data ohne Energiekollaps. Physik in unserer Zeit [*Big data without energy collapse. Physics in our time*], vol. 46, no. 2, 2015, pages 84-89

LIST OF REFERENCE NUMERALS a . . . BFTO thin film layer
b . . . BFO thin film layer
A . . . ammeter
Anti-LTD . . . Anti-Long-term Depression
Anti-LTP . . . Anti-Long-term Potentiation
Anti-STDP . . . Anti-Spike Time Dependent Plasticity
BFTO/BFO/BFTO . . . memristive three-ply layer of the memristive device, the BFTO thin film layer being the outer layer of the memristive device in each case
BFTO/BFO . . . memristive double layer of the memristive device
HRS, LRS . . . high resistance state, low resistance state
$I_{PLRS}$, $I_{NHRS}$, $I_{PHRS}$, $I_{NLRS}$ . . . reading currents that are measured when the complementary resistance states PLRS, NHRS, PHRS, NLRS are read out
$I_{LTP}$, $I_{aLTP}$, $I_{LTD}$, $I_{aLTD}$ . . . reading currents that are measured when the complementary LTP, anti-LTP, LTD, anti-LTD learning curves are read out
$\Delta I_{LTP}$, $\Delta I_{aLTP}$, $\Delta I_{LTD}$, $\Delta I_{aLTD}$ . . . normalised reading currents in the STDP graph on the LTP, anti-LTP, LTD and anti-LTD learning curve
LTD . . . Long term Depression
LTP . . . Long term Potentiation
p, q . . . logical input variables
$\overline{p}$, $\overline{q}$ . . . complementary logical input variables
PHRS, PLRS, NHRS, NLRS . . . complementary resistance state, (PHRS, NLRS) and (PLRS, NHRS) being state pairs
r(p), r($\overline{p}$), r(q), r($\overline{q}$), r(1), r(0) . . . polarity of the reading voltage during the reading process, dependent in part on the input variables p and q and on the complementary input variables $\overline{p}$ and $\overline{q}$
s . . . current output signal
S . . . input signal at the student synapse
STDP . . . Spike-Timing Dependent Plasticity (plastic change in the conductivity of chemical synapses)
T . . . input signal at the teacher synapse
T1 . . . electrically conductive electrode (terminal T1)
T2 . . . electrically conductive electrode (terminal T2)
$t_p$ . . . pulse width of the initialisation pulse or of the guide pulse of the writing pulse sequence
$t_r$ . . . pulse width of the reading pulse
$t_w$ . . . waiting time between voltage pulses (of initialisation and writing process and of writing process and reading process)
Δt . . . temporal offset between the start of the guide pulse of the first writing pulse sequence and the start of the guide pulse of the second writing pulse of a writing pulse sequence pair
$_T$ . . . exponential decay time of the writing pulse spike of a writing pulse sequence, which spike follows the guide pulse
U . . . voltage source
$V_p$ . . . absolute value of the maximum voltage of the superimposed writing pulses (for specifying LTP and LTD learning curves)
$V_{p,a}$ . . . absolute value of the maximum voltage of the superimposed writing pulses (for specifying anti-LTP and anti-LTD learning curves)
$V_r$ . . . voltage of the reading pulse
$V_w$ . . . voltage of the initialisation pulse Vo, $Vo^+$, $Vo^{++}$ . . . mobile oxygen vacancies
1 . . . student synapse
2 . . . teacher synapse
3 . . . mixer
4 . . . RC filter
5 . . . microcontroller
6 . . . inverter
7 . . . Associative Learning
8 . . . Supervised Learning
9 . . . Unsupervised Learning
10 . . . Deep Learning

The invention claimed is:

1. Method for operating an electronic memristive device comprising a complementary analogue reconfigurable memristive bidirectional resistive switch, the memristive device comprising a memristive layer sequence, and the memristive layer sequence separating a first electrode and a second electrode from one another, and the first and the second electrode contacting the memristive layer sequence in an electrically conductive manner, and the first and the second electrode being electrically conductively connected to a device for generating voltage pulses and for measuring currents, and the voltage pulses having different pulse shapes, at least one pulse shape, referred to as the writing pulse, decaying over time, and the memristive device being able to occupy two mutually different state pairs of complementary resistance states, each state pair implementing a high resistance state (HRS) in one current direction and a low resistance state (LRS) complementary to said state in the opposite current direction, characterised in that a) a writing process for reconfiguring the memristive device is carried out by means of at least one writing pulse sequence pair, a writing pulse sequence comprising at least a guide pulse having a voltage, and a subsequent writing pulse having a falling edge and being of an opposite polarity to the guide pulse, and a plurality of guide pulses being of the same polarity and a following plurality of writing pulses having the falling edges also being of mutually the same polarity, but which polarity is opposite to that of the plurality of guide pulses, by superimposing the pair of writing pulse sequences with one another, a first writing pulse sequence being applied to the first electrode, and a second writing pulse sequence being applied to the second electrode, and the determination of the state pair of complementary resistance states takes place when, due to the temporal superimposition of the writing pulse, having a falling edge, of the first writing pulse sequence, and the guide pulse of the second writing pulse sequence, the absolute value of the voltage of the superimposed pulses reaches or exceeds the absolute value of a minimum writing voltage for a minimum writing period that is dependent on the minimum writing voltage, and a negative writing pulse sequence pair for a negative temporal offset being present if a positive writing pulse, having the falling edge, of the first writing pulse sequence temporally precedes a negative guide pulse of the second writing pulse sequence and the superimposed writing pulse sequence pair writes the complementary states PHRS and NLRS as a state pair (PHRS, NLRS), or a positive writing pulse sequence pair for a positive temporal offset being present if a positive writing pulse, having the falling edge, of the first writing pulse sequence temporally precedes a negative guide pulse of the second writing pulse sequence and the superimposed writing pulse sequence pair writes the complementary states PLRS and NHRS as a state pair (PLRS, NHRS), b) the reading process for reading out a state of the complementary resistance states of a state pair is carried out by means of at least one voltage pulse being applied to the first or the second electrode as a reading pulse with a reading voltage, the absolute value of which is smaller than the absolute value of the minimum writing voltage, and a current output signal s being detected, in the case of a preceding negative writing pulse sequence pair:

a PHRS state being read out for a positive reading pulse, an NLRS state being read out for a negative reading pulse, or, in the case of a preceding positive writing pulse sequence pair:

a PLRS state being read out for a positive reading pulse, an NHRS state being read out for a negative reading pulse.

2. Method according to claim 1, wherein the method steps a) and/or b) are repeated as often as desired.

3. Method according to claim 1, wherein, prior to the writing process, as defined in claim 1 a), at least one initialisation pulse, the absolute value of which reaches or exceeds the absolute value of the minimum writing voltage for the minimum writing period that is dependent on the minimum writing voltage, is applied to the first or second electrode of the memristive device, wherein an initialisation pulse having a positive voltage brings the memristive device into a low resistance state (LRS) in a first current direction, and writes the state pair (PLRS, NHRS), or an initialisation pulse having a negative voltage brings the memristive device into a high resistance state (HRS) in a first current direction, and writes the state pair (PHRS, NLRS), and wherein the written state pairs (PLRS, NHRS) or (PHRS, NLRS) each correspond to complementary end states and the initialisation pulse having a positive voltage precedes a writing pulse sequence pair having a negative temporal offset, or the initialisation pulse having a negative voltage precedes a writing pulse sequence pair having a positive temporal offset.

4. Method according to claim 3, characterised in that binary Boolean states are assigned to the state pairs (PLRS, NHRS) or (PHRS, NLRS), the state pairs being complementary end states following a writing process, as defined in claim 1 a), in which the state pair of complementary resistance states is specified depending on the temporal offset of the writing pulse sequences of the writing pulse sequence pair, and the HRS states and LRS states becoming more distinctive as the absolute value of the temporal offset decreases, or being complementary end states following the initialisation, as defined in claim 3 or following a writing process as defined in claim 1 a), having a temporal offset, in which the superimposition of the writing pulse, having the falling edge, of the first writing pulse sequence, and the guide pulse of the second writing pulse sequence does not reach or exceed the minimum writing voltage for the minimum writing period that is dependent on the minimum writing voltage, and the HRS states and the LRS states becoming less distinctive as the absolute value of the temporal offset increases, by means of the current output signals s of the HRS states being assigned the binary value 0, and the current output signals s of the LRS states being assigned the binary value 1, or the current output signals s of the HRS states being assigned the binary value 1, and the current output signals s of the LRS states being assigned the binary value 0, and the binary values of the current output signals s of the complementary end states following the initialisation process correspond to the logical negation of the current output signals s of the binary values of the complementary end states following a writing process as defined in claim 1 a).

5. Method according to claim 4, characterised in that, in a writing process as defined in claim 1 a), the complementary resistance states of the state pairs are continuously specified to values between a minimum markedness, which corresponds to the complementary end states following the initialisation or following a writing process as defined in claim 1 a), having a temporal offset, in which the superimposition of the writing pulse, having the falling edge, of the first writing pulse sequence, and the guide pulse of the second writing pulse sequence no longer reaches or exceeds the minimum writing voltage for the minimum writing period that is dependent on the minimum writing voltage, and a maximum markedness, which corresponds to the complementary end states that are achieved when the writing pulse, having the falling edge, of the first writing pulse sequence, and the guide pulse of the second writing pulse sequence begin simultaneously, and in that, in the event of a positive temporal offset, the state pair (PHRS, NLRS) transitions continuously and increasingly into the state pair (PLRS, NHRS) as the absolute value of the temporal offset decreases, or, in the event of a negative temporal offset, the state pair (PLRS, NHRS) transitions continuously and increasingly into the state pair (PHRS, NLRS) as the absolute value of the temporal offset decreases.

6. Method according to claim 5 for implementing the 16 two-valued Boolean functions in fuzzy logic having two logical input variables p and q, comprising at least the following pulses:

a first positive or negative initialisation pulse which is independent of the input variables p and q and which is applied to the first electrode, wherein the second electrode remains at zero potential in each case, and subsequently a second initialisation pulse, which pulse is dependent on the input variables p and/or q and which is applied to the first electrode, wherein the second electrode remains at zero potential in each case, wherein the input variables p and q can be logically interconnected by the 16 two-valued Boolean functions by the second initialisation pulse and can be reproduced by the logical output signal s, a) a writing process, as defined in claim 1 a), is subsequently carried out, wherein to the memristive layer sequence either a positive writing pulse sequence pair having a positive temporal offset $\Delta t>0$ is applied, wherein the first writing pulse sequence is applied to the first electrode and the second writing pulse sequence is applied to the second electrode, or a negative writing pulse sequence pair having a negative temporal offset $\Delta t<0$ is applied, wherein the first writing pulse sequence is applied to the second electrode and the second writing pulse sequence is applied to the first electrode, b) a reading process comprising exactly one reading pulse is subsequently carried out, which reading pulse is dependent on the input variables p and/or q, wherein the reading pulse is applied to the first electrode, wherein the second electrode remains at zero potential in each case, wherein the logical output signal s, which corresponds to the current output signal s, is obtained as the result, wherein there are in each case two current output signals s, wherein a state value between the complementary end states PHRS and PLRS being read out, by a positive reading pulse, for a preceding positive writing pulse sequence pair, or a state value between the complementary end states NLRS and NHRS being read out, by a negative reading pulse, for a preceding positive writing pulse sequence pair, or a state value between the complementary end states PLRS and PHRS being read out, by a positive reading pulse, for a preceding negative writing pulse sequence pair, or a state value between the complementary end states NHRS and NLRS being read out, by a negative reading pulse, for a preceding negative writing pulse sequence pair, wherein the complementary resistance states read out for a temporal offset $|\Delta t|\geq t$ that is small in terms of absolute value correspond to the current output signals s of the complementary end states following the writing process, wherein the complementary resistance states are read out for a temporal offset $|\Delta t|\rightarrow\infty$ that is large in terms of absolute value correspond to the current output signals s of the complementary end states following the initialisation process, wherein the complementary resistance states are logical negations of the current output signals s of the complementary end states following the writing process.

7. Method according to claim 3, characterised in that the complementary resistance states of a state pair, which states are located between the complementary end states, are written by means of at least the following pulses being applied to the memristive device:

an initialisation pulse, as defined in claim 3, being applied to the first or second electrode, and subsequently a) a writing process, as defined in claim 1 a), being carried out.

8. Method according to claim 7, characterised in that the complementary resistance states of a state pair, which states are located between the complementary end states, are read out by means of at least:

b) one reading process comprising two reading pulses that are temporally mutually offset, and are of opposing polarities, and are applied in succession to the same electrode as the initialisation pulse according to claim 7, the state pair between the complementary end states of the state pair (PHRS, NLRS) or (PLRS, NHRS) being read out, by the reading pulses, for a preceding positive writing pulse sequence pair, or the state pair between the complementary end states of the state pair (PLRS, NHRS) or (PHRS, NLRS) being read out, by the reading pulses, for a preceding negative writing pulse sequence pair.

9. Method for operating a memristive complementary analogue reconfigurable device according to claim 1, as an artificial synapse, characterised in that the first and second electrode correspond to artificial neurons, and in this case the first electrode is used as an artificial presynaptic neuron and the second electrode is used as an artificial postsynaptic neuron, a writing pulse sequence applied to the presynaptic neuron corresponds to a presynaptic pulse, and a writing pulse sequence applied to the postsynaptic neuron corresponds to a postsynaptic pulse, and a writing pulse sequence pair that is applied between the presynaptic and postsynaptic neuron corresponds to a spike-timing dependent plasticity pair (referred to in the following as STDP pair), a negative STDP pair corresponds to a negative writing pulse sequence pair, and a positive STDP pair corresponds to a positive writing pulse sequence pair, learning curves of the synapses are defined in that the complementary resistance states of the continuous transition between the complementary end states PHRS and PLRS correspond to an LTP learning curve, the complementary resistance states of the continuous transition between the complementary end states NHRS and NLRS correspond to an anti-LTP learning curve, the complementary resistance states of the continuous transition between the complementary end states PLRS and PHRS correspond to an LTD learning curve, the complementary resistance states of the continuous transition between the complementary end states NLRS and NHRS correspond to an anti-LTD learning curve, the LTP and anti-LTD learning curves are a pair of mutually complementary learning curves and the anti-LTP and LTD learning curves are a pair of mutually complementary learning curves, the current output signal s of the reading pulses correspond to the conductivities of the artificial synapses, and complementary learning is implemented by means of complementary resistance states of one of the two state pairs being written, by means of an initialisation pulse, as defined in claim 3, being applied to the presynaptic neuron or postsynaptic neuron, and a) subsequently, a writing process, as defined in claim 1 a), being carried out by means of the pair of the presynaptic and postsynaptic pulse being superimposed with one another, a presynaptic pulse being applied to the presynaptic neuron and the postsynaptic pulse being applied to the postsynaptic neuron, and the determination of the state pair of complementary resistance states takes place when, due to the temporal superimposition of the writing pulse, having the falling edge, of the presynaptic pulse, and the guide pulse of the postsynaptic pulse, the absolute value of the voltage of the superimposed pulses reaches or exceeds the absolute value of a minimum writing voltage for the minimum writing period that is dependent on the minimum writing voltage, and the absolute value of the temporal offset of the superimposed pulses determining the position of the written complementary resistance states of the state pair between the respective complementary end states, and thus the position thereof on the learning curves, b) the written complementary resistance states subsequently being read out in a reading process, by means of two reading pulses, which are temporally mutually offset and are of opposing polarities, being applied to the presynaptic neuron or the postsynaptic neuron, the reading pulses reading out the state pair on the LTP and anti-LTD learning curves for a preceding positive STDP pair, or the reading pulses reading out the state pair on the anti-LTP and LTD learning curves for a preceding negative STDP pair.

10. Computer program product that carries out the method according to claim 1.

11. Data processing system or data carrier on which the computer program product according to claim 10 is stored.

12. Device comprising a memristive device and a control unit, wherein the control unit is designed to implement the method according to claim 1.

* * * * *